(12) United States Patent
Park et al.

(10) Patent No.: US 12,477,882 B2
(45) Date of Patent: Nov. 18, 2025

(54) DISPLAY DEVICE AND METHOD FOR MANUFACTURING THE SAME

(71) Applicant: Samsung Display Co., LTD., Yongin-si (KR)

(72) Inventors: Ki Hoon Park, Yongin-si (KR); Cheol Ku Kang, Uiwang-si (KR); Jung Hyun Ahn, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 832 days.

(21) Appl. No.: 17/568,299

(22) Filed: Jan. 4, 2022

(65) Prior Publication Data

US 2022/0352242 A1 Nov. 3, 2022

(30) Foreign Application Priority Data

Apr. 28, 2021 (KR) .................. 10-2021-0054770

(51) Int. Cl.
*H10H 29/14* (2025.01)
*H10H 20/01* (2025.01)
(Continued)

(52) U.S. Cl.
CPC .......... *H10H 29/142* (2025.01); *H10H 20/01* (2025.01); *H10H 20/821* (2025.01);
(Continued)

(58) Field of Classification Search
CPC ..... H01L 27/156; H01L 33/005; H01L 33/38; H01L 33/24; H01L 33/44; H01L 2933/0016
See application file for complete search history.

(56) References Cited

U.S. PATENT DOCUMENTS

2013/0027623 A1 1/2013 Negishi et al.
2019/0326348 A1* 10/2019 Im .................. H01L 27/156
(Continued)

FOREIGN PATENT DOCUMENTS

JP 2012-4535 1/2012
KR 10-2008-0059801 7/2008
(Continued)

OTHER PUBLICATIONS

International Search Report corresponding to International Application No. PCT/KR2022/002980 dated Jun. 9, 2022.
(Continued)

*Primary Examiner* — Mark W Tornow
(74) *Attorney, Agent, or Firm* — Womble Bond Dickinson (US) LLP

(57) ABSTRACT

A display device includes a first electrode and a second electrode spaced apart from and parallel to each other and disposed on a substrate, each of the first electrode and the second electrode extends in a direction, a first insulating layer disposed on the first electrode and the second electrode, a light-emitting element disposed on the first insulating layer and having opposing ends respectively disposed on the first electrode and the second electrode, a first connection electrode electrically contacting an end of the light-emitting element, a second connection electrode electrically contacting an opposite end of the light-emitting element, and insulating patterns respectively disposed on and contacting the first connection electrode and the second connection electrode, the insulating patterns are spaced apart from the light-emitting element and the first insulating layer.

13 Claims, 33 Drawing Sheets

(51) Int. Cl.
  *H10H 20/821* (2025.01)
  *H10H 20/831* (2025.01)
  *H10H 20/84* (2025.01)

(52) U.S. Cl.
  CPC .......... *H10H 20/831* (2025.01); *H10H 20/84* (2025.01); *H10H 20/032* (2025.01)

(56) References Cited

U.S. PATENT DOCUMENTS

| | | | |
|---|---|---|---|
| 2021/0242380 A1* | 8/2021 | Kim | H01L 33/0095 |
| 2021/0265324 A1* | 8/2021 | Kong | H10K 59/131 |
| 2021/0288217 A1* | 9/2021 | Li | H01L 33/62 |
| 2021/0351171 A1 | 11/2021 | Yoo et al. | |
| 2022/0077228 A1 | 3/2022 | Do et al. | |
| 2022/0165787 A1* | 5/2022 | Lee | H01L 33/60 |
| 2022/0173160 A1* | 6/2022 | Pak | H01L 29/78633 |

FOREIGN PATENT DOCUMENTS

| | | |
|---|---|---|
| KR | 10-2018-0007376 | 1/2018 |
| KR | 10-2019-0112226 | 10/2019 |
| KR | 10-2020-0005711 | 1/2020 |
| KR | 10-2020-0010704 | 1/2020 |
| KR | 10-2020-0034904 | 4/2020 |
| KR | 10-2020-0088962 | 7/2020 |

OTHER PUBLICATIONS

Written Opinion corresponding to International Application No. PCT/KR2022/002980, dated Jun. 9, 2022.

\* cited by examiner

DISPLAY DEVICE AND METHOD FOR MANUFACTURING THE SAME

CROSS-REFERENCE TO RELATED APPLICATION(S)

This application claims priority to and benefits of Korean Patent Application No. 10-2021-0054770 under 35 U.S.C. § 119 filed on Apr. 28, 2021, in the Korean Intellectual Property Office, the entire contents of which are incorporated herein by reference.

BACKGROUND

1. Technical Field

The disclosure relates to a display device and a method for manufacturing the same.

2. Description of the Related Art

Multimedia has contributed to the importance of display devices. In response to this trend, various types of the display devices such as an organic light-emitting display device (OLED), a liquid crystal display device (LCD), etc. have been used.

A display device that displays an image may include a display panel such as a light-emitting display panel or a liquid crystal display panel. The light-emitting display panel may include a light-emitting element such as a light-emitting diode (LED). The light-emitting diode may include an organic light-emitting diode OLED using an organic material as a light-emissive material and an inorganic light-emitting diode using an inorganic material as the light-emissive material.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

The disclosure provides a display device and a manufacturing method thereof that may prevent a contact failure between a light-emitting element and an electrode and facilitate the process.

The disclosure, however, is not limited to the above-mentioned. Other advantages according to the disclosure that are not mentioned may be understood based on the following descriptions, and may be more clearly understood based on embodiments according to the disclosure. Further, it will be readily understood that the purposes and advantages according to the disclosure may be realized in the claims and combinations thereof.

According to an embodiment of the disclosure, the display device may include a first electrode and a second electrode spaced apart from and parallel to each other disposed on a substrate, wherein each of the first electrode and the second electrode extends in a direction; a first insulating layer disposed on the first electrode and the second electrode; a light-emitting element disposed on the first insulating layer, the light-emitting element having opposing ends respectively disposed on the first electrode and the second electrode; a first connection electrode electrically contacting an end of the light-emitting element; a second connection electrode electrically contacting an opposite side end of the light-emitting element, and insulating patterns respectively disposed on and contacting the first connection electrode and the second connection electrode, wherein the insulating patterns are spaced apart from the light-emitting element and the first insulating layer.

In an embodiment, the insulating patterns may include a first insulating pattern disposed on and contacting the first connection electrode; and a second insulating pattern disposed on and contacting the second connection electrode.

In an embodiment, at least a side of the first insulating pattern protrudes outwardly beyond at least a side of the first connection electrode, and at least a side of the second insulating pattern protrudes outwardly beyond at least a side of the second connection electrode.

In an embodiment, a planar area of the first insulating pattern may be larger than a planar area of the first connection electrode, and a planar area of the second insulating pattern may be larger than a planar area of the second connection electrode.

In an embodiment, the first insulating pattern and the second insulating pattern may be spaced apart from each other, and each of the first insulating pattern and the second insulating pattern may have an island shape.

In an embodiment, a distance between the first insulating pattern and the second insulating pattern may be less than a distance between the first connection electrode and the second connection electrode.

In an embodiment, the device may further include a first bank pattern disposed between the substrate and the first electrode, and a second bank pattern disposed between the substrate and the second electrode, the first insulating pattern may overlap the first bank pattern and the first electrode, and the second insulating pattern may overlap the second bank pattern and the second electrode.

In an embodiment, each of the first insulating pattern and the second insulating pattern may include at least one of silicon nitride, aluminum nitride, zirconium nitride, titanium nitride, hafnium nitride, tantalum nitride, silicon oxide, aluminum oxide, titanium oxide, tin oxide, and silicon oxynitride.

According to an embodiment, the method for manufacturing a display device may include forming a first electrode and a second electrode spaced apart from and parallel to each other on a substrate, wherein each of the first electrode and the second electrode extends in a direction; forming a first insulating layer on the first electrode and the second electrode; disposing a light-emitting element on the first insulating layer, and aligning the light-emitting element on the first electrode and the second electrode; forming a transparent conductive material layer on the light-emitting element and the first insulating layer; forming a first insulating material layer on the transparent conductive material layer, patterning the first insulating material layer such that a first insulating material pattern and a second insulating material pattern are formed and spaced apart from each other; forming a second insulating material layer on the first insulating material pattern and the second insulating material pattern; etching the second insulating material layer such that a third insulating material pattern contacts the first insulating material pattern, and a fourth insulating material pattern contacts the second insulating material pattern; and forming a first connection electrode and a second connection electrode by etching the transparent conductive material layer using a combination of the first insulating material pattern and the third insulating material pattern, and a combination of the second insulating material pattern and the fourth insulating material pattern as a mask.

In an embodiment, the first insulating material layer and the second insulating material layer may include a same material.

In an embodiment, the first insulating material pattern and the third insulating material pattern may be integral with each other, and the second insulating material pattern and the fourth insulating material pattern may be integral with each other.

In an embodiment, the first connection electrode and the second connection electrode may be formed by a wet etching.

In an embodiment, each of the first insulating material pattern, the second insulating material pattern, the third insulating material pattern, and the fourth insulating material pattern may be formed by dry etching.

In an embodiment, the first insulating material layer and the second insulating material layer may include different materials.

In an embodiment, the first insulating material pattern may be formed as a first insulating pattern, the second insulating material pattern may be formed as a second insulating pattern, the third insulating material pattern may be formed as a third insulating pattern, and the fourth insulating material pattern may be formed as a fourth insulating pattern, the first insulating pattern and the third insulating pattern may contact each other, and the second insulating pattern and the fourth insulating pattern may contact each other.

According to an embodiment, the display device may include a first electrode and a second electrode spaced apart from and parallel to each other and disposed on a substrate, wherein each of the first electrode and the second electrode may extend in a direction; a first insulating layer disposed on the first electrode and the second electrode; a light-emitting element disposed on the first insulating layer, the light-emitting element having opposing ends respectively disposed on the first electrode and the second electrode; a first connection electrode electrically contacting an end of the light-emitting element; a second connection electrode electrically contacting an opposite end of the light-emitting element; and insulating patterns respectively disposed on and contacting the first connection electrode and the second connection electrode, wherein the insulating patterns are spaced apart from the light-emitting element and the first insulating layer, wherein the insulating patterns may include a first insulating pattern overlapping the first connection electrode; a second insulating pattern overlapping the second connection electrode; a third insulating pattern having a side contacting the first insulating pattern; and a fourth insulating pattern having a side contacting the second insulating pattern.

In an embodiment, the first insulating pattern may overlap the first electrode and the third insulating pattern may not overlap the first electrode, the second insulating pattern may overlap the second electrode and the fourth insulating pattern may not overlap the second electrode.

In an embodiment, a length of the first insulating pattern and a length of the third insulating pattern extending in the direction may be equal to each other, wherein a length of the second insulating pattern and a length of the fourth insulating pattern extending in the direction may be equal to each other.

In an embodiment, at least a portion of the third insulating pattern may not overlap the first connection electrode, and at least a portion of the fourth insulating pattern may not overlap the second connection electrode.

In an embodiment, a distance between the third insulating pattern and the fourth insulating pattern may be less than a distance between the first connection electrode and the second connection electrode.

In the display device according to embodiments, the connection electrodes may be simultaneously patterned using the insulating pattern, thereby reducing a distance between the connection electrodes and simplifying a process. Accordingly, a contact failure between the connection electrodes and the light-emitting elements due to misalignment in a patterning process may be suppressed. Further, a margin for a patterning process of the connection electrodes may be secured and the process may be simplified.

Effects of the disclosure are not limited to the above-mentioned effects, and other effects as not mentioned will be clearly understood by those skilled in the art from following descriptions.

BRIEF DESCRIPTION OF DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
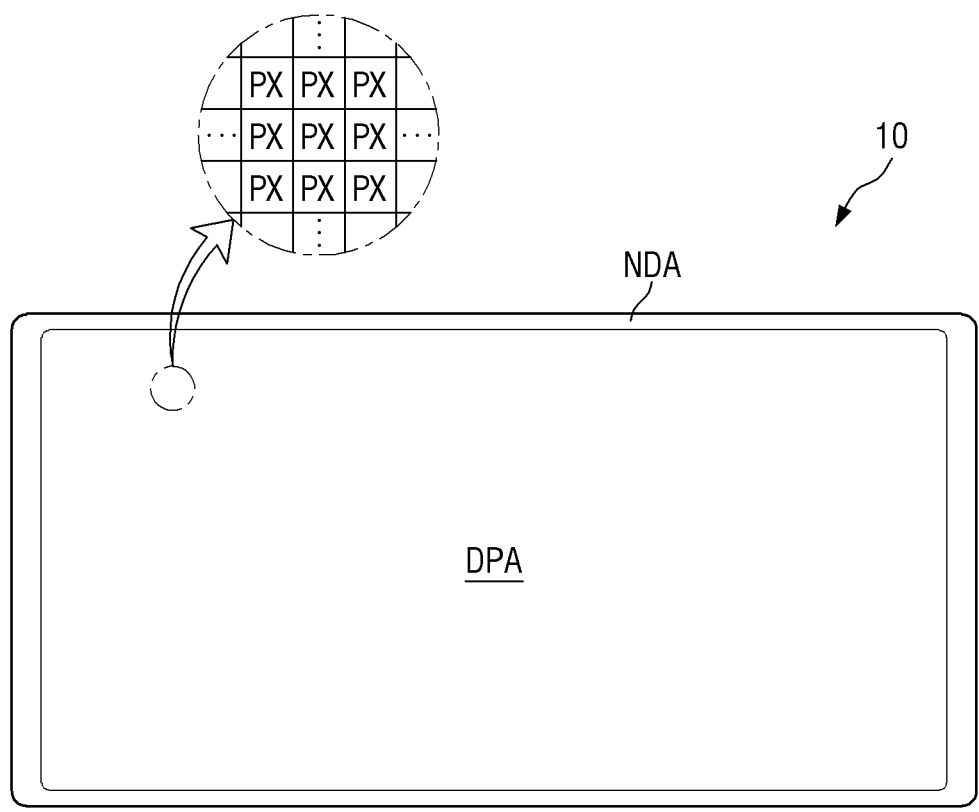
FIG. 1 is a schematic plan view of a display device according to one embodiment.
Figure 1:
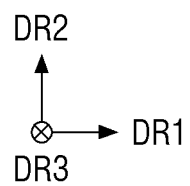

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that when an element (or a region, a layer, a portion, or the like) is referred to as "being on", "connected to" or "coupled to" another element in the specification, it can be directly disposed on, connected or coupled to another element mentioned above, or intervening elements may be disposed therebetween.

It will be understood that the terms "connected to" or "coupled to" may include a physical or electrical connection or coupling.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

The phrase "in a plan view" means viewing the object from the top, and the phrase "in a schematic cross-sectional view" means viewing a cross-section of which the object is vertically cut from the side.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Each of the features of the various embodiments of the disclosure may be combined or combined with each other, in part or in whole, and variations thereof are possible. Each embodiment may be implemented independently of each other or may be implemented together in an association.

Hereinafter, embodiments will be described with reference to the accompanying drawings.

Referring to FIG. 1, a display device 10 displays a video or a still image. The display device 10 may refer to any electronic device that provides a display screen. For example, the display device 10 may include a televisions, a laptop, a monitors, a billboard, an Internet of Thing, a mobile phone, a smart phone, a tablet PC (personal computer), an electronic watch, a smart watch, a watch phone, a head mounted display (HMD), a mobile communication terminal, an electronic notebook, an e-book, a PMP (Portable Multimedia Player), a navigation device, a game device, a digital camera, a camcorder, etc. which may provide a display screen.

The display device 10 may include a display panel that provides a display screen. Examples of the display panel may include an inorganic light-emitting diode display panel, an organic light-emitting display panel, a quantum dot light-emitting display panel, a plasma display panel, and a field emission display panel. Hereinafter, an example in which the inorganic light-emitting diode display panel is embodied as the display panel will be described. However, the disclosure is not limited thereto. In case that the same technical idea is applicable to other display panels, the disclosure may also be applied to the other display panels.

In the drawings for illustrating the display device 10, a first direction DR1, a second direction DR2, and a third direction DR3 are defined. The first direction DR1 and the second direction DR2 may be perpendicular to each other and form one plane. The third direction DR3 may be normal to the plane which the first direction DR1 and the second direction DR2 form. The third direction DR3 is perpendicular to each of the first direction DR1 and the second direction DR2. In an embodiment describing the display device 10, the third direction DR3 indicates a thickness direction of the display device 10.

A shape of the display device 10 may be variously modified. For example, the display device 10 may have a rectangular shape including a long-side extending in the first direction DR1 and a short-side extending in the second direction DR2 in a plan view. In another example, the display device 10 may have a rectangular shape including a long-side extending in the second direction DR2 and a short-side extending in the first direction DR1 in a plan view. However, the disclosure is not limited thereto. The display device 10 may have a shape such as a square, a rectangle with rounded corners, other polygons, or a circle. Further, a shape of a display area DPA of the display device 10 may be similar to an overall shape of the display device 10. In FIG. 1, an example in which each of the display device 10 and the display area DPA has a rectangular shape having a long-side extending in the first direction DR1 and a short-side extending in the second direction DR2 is illustrated. It is to be understood that the shapes disclosed herein may also include shapes that are substantial shapes in addition to the disclosed shapes.

The display device 10 may include a display area DPA and a non-display area NDA. The display area DPA refers to an area where a screen may be displayed, while the non-display area NDA refers to an area where the screen is not displayed. The display area DPA may be referred to as an active area, and the non-display area NDA may be referred to as a non-active area. The display area DPA may occupy generally an inner region of the display device 10.

The display area DPA may include pixels PX. The pixels PX may be arranged or disposed in a matrix form. A shape of each pixel PX may be rectangular or square in a plan view. However, the disclosure is not limited thereto. The shape thereof may be a rhombus shape in which each side is inclined relative to one direction or a direction. The pixels PX may be alternately arranged or disposed in a stripe type or a PENTILE™ type. Further, each of the pixel PXs may include one or more light-emitting elements emitting light of a specific or given wavelength band to display a specific or given color.

The non-display area NDA may be disposed around the display area DPA. The non-display area NDA may completely or partially surround or may be adjacent to the display area DPA. The display area DPA may have a rectangular shape, while each non-display area NDA may be disposed adjacent to each of four sides of the display area DPA. The non-display area NDA may form a bezel of the display device 10. Lines or circuit drivers included in the display device 10 may be disposed in each non-display area NDA. External devices may be mounted in the non-display area NDA.

Figure 2:
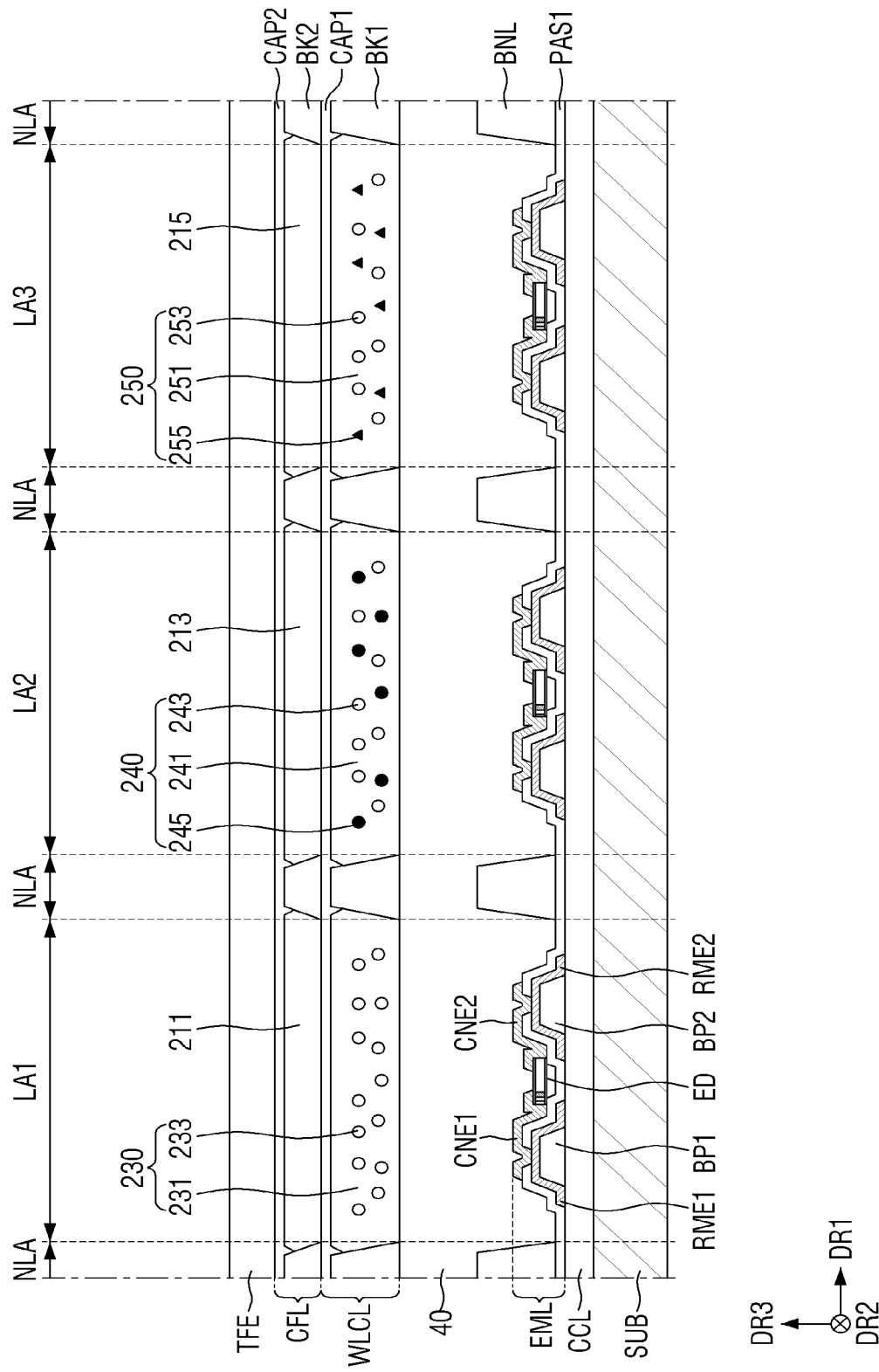
FIG. 2 is a schematic cross-sectional view schematically showing a pixel of a display device according to one embodiment.

FIG. 2 is a schematic cross-sectional view schematically showing a pixel of a display device according to one embodiment.

Referring to FIG. 2, the display device 10 may include a substrate SUB, a circuit element layer CCL, a light-emitting element layer EML, a color conversion layer WLCL, a color filter layer CFL, and an encapsulation layer TFE. The circuit element layer CCL and the light-emitting element layer EML will be described in detail with reference to the drawings after FIG. 2. For example, the description thereof will be simplified with reference to FIG. 2.

The substrate SUB may be made of an insulating material such as glass, quartz, or polymer resin. The substrate SUB may be embodied as a rigid substrate, or may be embodied as a flexible substrate which is bendable, foldable, rollable, etc. within the spirit and the scope of the disclosure.

Light-emitting areas LA1, LA2, and LA3 and a non-light emitting area NLA may be defined across the substrate SUB.

The circuit element layer CCL may be disposed on one face of the substrate SUB. The circuit element layer CCL may include at least one transistor to drive a light-emitting element ED of the light-emitting element layer EML.

The light-emitting element layer EML may be disposed on one face of the circuit element layer CCL. The light-emitting element layer EML may include bank patterns BP1 and BP2, a bank BNL, an electrode layer RME, a connection electrode CNE, the light-emitting element ED, and a first insulating layer PAS1.

Bank patterns BP1 and BP2 may be disposed on the circuit element layer CCL. The bank patterns BP1 and BP2 may include a first bank pattern BP1 and a second bank pattern BP2 arranged or disposed to be spaced apart from each other. The first bank pattern BP1 and the second bank pattern BP2 may be disposed in each of the light-emitting areas LA1, LA2, and LA3.

Electrodes RME1 and RME2 may be respectively disposed on the bank patterns BP1 and BP2. Each of the electrodes RME1 and RME2 may extend in the second direction DR2. The electrodes RME1 and RME2 may be disposed in each of the light-emitting areas LA1, LA2, and LA3, and may be spaced apart from each other in the first direction DR1. The electrodes RME1 and RME2 may include a first electrode RME1 and a second electrode RME2. The first electrode RME1 may be disposed on the first bank pattern BP1, while the second electrode RME2 may be disposed on the second bank pattern BP2.

The first insulating layer PAS1 may be disposed on the electrodes RME1 and RME2. The first insulating layer PAS1 may expose at least a portion of each of the first electrode RME1 and the second electrode RME2 while being disposed on the electrodes RME1 and RME2.

The bank BNL may be disposed on the first insulating layer PAS1. The bank BNL may include a portion extending in the first direction DR1 and a portion extending in the second direction DR2, and may surround each of the light-emitting areas LA1, LA2, and LA3.

Light-emitting elements ED may be disposed on the first insulating layer PAS1. The light-emitting elements ED may be disposed on the first insulating layer PAS1 and may be arranged or disposed between the first bank pattern BP1 and the second bank pattern BP2. Each light-emitting element ED may be positioned such that both opposing ends thereof lie on the first electrode RME1 and the second electrode RME2, respectively. The light-emitting elements ED may be disposed in each of the light-emitting areas LA1, LA2, and LA3.

Connection electrodes CNE1 and CNE2 may be disposed on and contact the electrodes RME1 and RME2, respectively. Each of the connection electrodes CNE1 and CNE2 may be disposed on and contact the light-emitting elements ED. Each of the connection electrodes CNE1 and CNE2 may contact each of both opposing ends of the light-emitting element ED and may contact each of the electrodes RME1 and RME2. The connection electrodes CNE1 and CNE2 may include a first connection electrode CNE1 and a second connection electrode CNE2. The first connection electrode CNE1 may be disposed on the first electrode RME1, while the second connection electrode CNE2 may be disposed on the second electrode RME2.

In one example, a planarization layer 40 may be disposed on the light-emitting element layer EML, so that a top face of the light-emitting element layer EML may be planarized. However, the planarization layer 40 may be omitted.

The color conversion layer WLCL may be disposed on the planarization layer 40. The color conversion layer WLCL may include a light-transmissive pattern 230, a first wavelength conversion pattern 240, a second wavelength conversion pattern 250, a first capping layer CAP1, and a first light-blocking member BK1.

The light-transmissive pattern 230 may be disposed on the planarization layer 40. The light-transmissive pattern 230 may overlap the first light-emitting area LA1. The light-transmissive pattern 230 may transmit incident light therethrough. Source light emitting from the light-emitting element ED disposed in the first light-emitting area LA1 may be blue light. The source light as the blue light may pass through the light-transmissive pattern 230.

In one embodiment, the light-transmissive pattern 230 may include a first base resin 231, and may further include first scattering materials 233 dispersed in the first base resin 231.

The first base resin 231 may include a material with high transmittance. In one embodiment, the first base resin 231 may include an organic material. For example, the first base resin 231 may include an organic material such as epoxy resin, acrylic resin, cardo resin or imide resin.

The first scattering material 233 may have a refractive index different from that of the first base resin 231. An optical interface may be formed between the first scattering material 233 and the first base resin 231. For example, the first scattering material 233 may be embodied as a light-scattering particle. The first scattering material 233 is not particularly limited as long as the first scattering material 233 is capable of scattering at least a portion of transmitting light. The first scattering material 233 may be, for example, a metal oxide particle or an organic particle. Examples of the metal oxide may include titanium oxide ($TiO_2$), zirconium oxide ($ZrO_2$), aluminum oxide ($Al_2O_3$), indium oxide ($In_2O_3$), zinc ZnO oxide, or tin oxide ($SnO_2$). The material of the organic particle may include acrylic resin or urethane resin. The first scattering materials 233 may scatter light in random directions regardless of an incidence direction of the incident light while the first scattering materials 233 may not substantially convert a wavelength of the light passing through the light-transmissive pattern 230.

The first wavelength conversion pattern 240 may be disposed on the planarization layer 40 and may overlap the second light-emitting area LA2. The first wavelength conversion pattern 240 may convert or shift a peak wavelength of the incident light to a different specific or given peak wavelength and may output light having the different specific or given peak wavelength. In one embodiment, the first wavelength conversion pattern 240 may convert the source light provided from the light-emitting element ED in the second light-emitting area LA2 into red light having a peak wavelength in a range of about 610 nm to about 650 nm.

The first wavelength conversion pattern 240 may include a second base resin 241 and a first wavelength shifter 245 dispersed in the second base resin 241, and may further include second scattering materials 243 dispersed in the second base resin 241.

The second base resin 241 may include a material having high transmittance. In one embodiment, the second base resin 241 may include an organic material. The second base resin 241 may include the same material or similar material as that of the first base resin 231, or may include at least one of the materials as the examples described above as the constituent material of the first base resin 231.

The first wavelength shifter 245 may convert or shift a peak wavelength of incident light thereto to a different specific or given peak wavelength. In one embodiment, the first wavelength shifter 245 may convert the light of the first color as the blue light provided from the light-emitting element ED into red light having a single peak wavelength in a range of about 610 nm to about 650 nm and emit the red light.

Examples of the first wavelength shifter 245 may include a quantum dot, a quantum rod, or a phosphor. For example, the quantum dot may be a particulate material that emits a specific or given color as electrons transition from a conduction band to a valence band.

The quantum dot may be made of a semiconductor nanocrystal material. The quantum dot may have a specific or given bandgap based on a composition and a size thereof to absorb light and emit light having a unique wavelength. Examples of the semiconductor nanocrystal material of the quantum dot may include group IV nanocrystal, group II-VI compound nanocrystal, group III-V compound nanocrystal, group IV-VI nanocrystal, or combinations thereof.

A group II-VI compound may be selected from a group consisting of a binary compound selected from a group consisting of CdSe, CdTe, ZnS, ZnSe, ZnTe, ZnO, HgS, HgSe, HgTe, MgSe, MgS, and mixtures thereof, a ternary compound selected from a group consisting of InZnP, AgInS, CuInS, CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and mixtures of thereof, and a quaternary compound selected from a group consisting of HgZnTeS, CdZnSeS, CdZnSeTe, CdZnSTe, CdHgSeS, CdHgSeTe, CdHgSTe, HgZnSeS, HgZnSeTe, HgZnSTe, and mixtures of thereof.

The group III-V compound may be selected from a group consisting of a binary compound selected from a group consisting of GaN, GaP, GaAs, GaSb, AlN, AlP, AlAs, AlSb, InN, InP, InAs, InSb, and mixtures thereof, a ternary compound selected from a group consisting of GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, GaAlNP, and mixtures thereof, and a quaternary compound selected from a group consisting of GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, and mixtures thereof.

The group IV-VI compound may be selected from a group consisting of a binary compound selected from a group consisting of SnS, SnSe, SnTe, PbS, PbSe, PbTe, and mixtures thereof, a ternary compound selected from a group consisting of SnSeS, SnSeTe, SnالسTe, PbSeS, PbSeTe, PbSTe, SnPbS, SnPbSe, SnPbTe, and mixtures thereof, and a quaternary compound selected from a group consisting of SnPbSSe, SnPbSeTe, SnPbSTe, and mixtures thereof. The IV group element may be selected from a group consisting of Si, Ge, and mixtures thereof. The IV group compound may be a binary compound selected from a group consisting of SiC, SiGe, and mixtures thereof.

In this connection, the binary compound, the ternary compound, or the quaternary compound may be contained at a uniform concentration and in the particle. By way of example, the binary compound, the ternary compound, and the quaternary compound may be contained at the same concentration and in the particle. By way of example, the binary compound, the ternary compound, or the quaternary compound may be contained at a concentration gradient manner and in the particle. By way of example, the binary compound, the ternary compound, and the quaternary compound may be contained at the same concentration and in the same particle.

Further, the first wavelength shifter 245 may have a core/shell structure in which one quantum dot surrounds another quantum dot. An interface between the core and the shell may have a concentration gradient in which a concentration of an element present in the shell decreases as it goes toward a center.

In one embodiment, the quantum dot may have a core-shell structure including a core including the aforementioned nanocrystal and a shell surrounding the core. The shell of the quantum dot may serve as a protective layer to prevent chemical denaturation of the core to maintain semiconductor characteristics thereof and/or as a charging layer to impart electrophoresis ability to the quantum dot. The shell may be composed of a single layer or multiple layers. Examples of the shell of the quantum dot may include an oxide of a metal or a non-metal, a semiconductor compound, or a combination thereof.

For example, the oxide of the metal or the non-metal may include a binary compound such as $SiO_2$, $Al_2O_3$, $TiO_2$, $ZnO$, $MnO$, $Mn_2O_3$, $Mn_3O_4$, $CuO$, $FeO$, $Fe_2O_3$, $Fe_3O_4$, $CoO$, $Co_3O_4$, and $NiO$, or a ternary compound such as $MgAl_2O_4$, $CoFe_2O_4$, $NiFe_2O_4$, and $CoMn_2O_4$. The disclosure is not limited thereto.

Further, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, etc. within the spirit and the scope of the disclosure. The disclosure is not limited thereto.

The light emitting from the first wavelength shifter 245 may have a FWHM (full width at half maximum) of a wavelength spectrum equal to or smaller than about 45 nm, or about 40 nm, or about 30 nm and thus, gamut and reproducibility of a color displayed from the display device 10 may be further improved. Further, the light emitting from the first wavelength shifter 245 may emit in several directions regardless of an incidence direction of the incident light. Accordingly, side-visibility of the second color displayed from the second light-emitting area LA2 may be improved.

A portion of the source light provided from the light-emitting element ED may not be converted to the red light via the first wavelength shifter 245. However, the portion of the source light that is not converted to the red light may be blocked with the color filter disposed thereon. To the contrary, the red light to which the first wavelength conversion pattern 240 converts a portion of the source light may pass through the color filter and emit to the outside.

The second scattering material 243 may have a refractive index different from that of the second base resin 241. An optical interface may be formed between the second scattering material 243 the second base resin 241. For example, the second scattering material 243 may be embodied as a light-scattering particle. Other descriptions of the second scattering materials 243 may be substantially the same as or similar to those of the first scattering materials 233, and thus may be omitted.

The second wavelength conversion pattern 250 may be disposed on the planarization layer 40 and may overlap the third light-emitting area LA3. The second wavelength conversion pattern 250 may convert or shifting a peak wavelength of incident light thereto to a different specific or given peak wavelength and may output light having the different specific or given peak wavelength. In one embodiment, the second wavelength conversion pattern 250 may convert the source light provided from the light-emitting element ED in the third light-emitting area LA3 into green light of a peak wavelength in a range of about 510 nm to about 550 nm.

The second wavelength conversion pattern 250 may include a third base resin 251, and a second wavelength shifter 255 dispersed in the third base resin 251, and may further include third scattering materials 253 dispersed in the third base resin 251. The third base resin 251 may include a material having high transmittance. In one embodiment, the third base resin 251 may include an organic material. The third base resin 251 may include the same material as that of the first base resin 231, or may include at least one of the materials as examples described above as the constituent material of the first base resin 231.

The second wavelength shifter 255 may convert or shift a peak wavelength of incident light thereto to a different specific or given peak wavelength and output light having the different specific or given peak wavelength. In one embodiment, the second wavelength shifter 255 may convert blue light having a peak wavelength in a range of about 440 nm to about 480 nm into green light having a peak wavelength in a range of about 510 nm to about 550 nm.

Examples of the second wavelength shifter 255 may include a quantum dot, a quantum rod, or a phosphor. Another description of the second wavelength shifter 255 may be substantially the same as or similar to the above description of the first wavelength shifter 245, and thus may be omitted. In one embodiment, each of the first wavelength shifter 245 and the second wavelength shifter 255 may be composed of the quantum dot. A particle size of the quantum dot constituting the first wavelength shifter 245 may be greater than a particle size of the quantum dot constituting the second wavelength shifter 255.

The third scattering material 253 may have a refractive index different from that of the third base resin 251 such that an optical interface may be formed between the third scattering material 253 and the third base resin 251. For example, the third scattering material 253 may be embodied as a light-scattering particle. Other descriptions of the third scattering material 253 may be substantially the same as or similar to the descriptions of the second scattering material 243, and thus may be omitted.

The second wavelength conversion pattern 250 may receive the source light emitting from the light-emitting element ED. The second wavelength shifter 255 may convert the source light provided from the light-emitting element ED to the green light having a peak wavelength in a range of about 510 nm to about 550 nm and may output the green light.

A portion of the source light as the blue light may not be converted to the green light via the second wavelength shifter 255. However, the portion of the source light that is not converted to the green light may be blocked with the color filter disposed thereon. To the contrary, the green light to which the first wavelength conversion pattern 240 converts a portion of the source light may pass through the color filter and emit to the outside.

The first light-blocking member BK1 may be disposed on the planarization layer 40, and may overlap the non-light emitting area NLA. The first light-blocking member BK1 may overlap the bank BNL in the third direction DR3 as the thickness direction of the display device 10. The first light-blocking member BK1 may prevent transmission of light therethrough. The first light-blocking member BK1 may prevent light beams from the first to third light-emitting areas LA1, LA2, and LA3 from being mixed with each other, thereby improving color gamut. The first light-blocking member BK1 may be formed in a grid shape surrounding each of the first to third light-emitting areas LA1, LA2, and L3 in a plan view.

The first light-blocking member BK1 may include an organic light-blocking material and a liquid repellent component. In this connection, the liquid repellent component may include a fluorine-containing monomer or a fluorine-containing polymer, and as an example may include a fluorine-containing aliphatic polycarbonate. For example, the first light-blocking member BK1 may be made of a black organic material containing the liquid repellent component. The disclosure is not limited thereto.

The first capping layer CAP1 may be disposed on and cover or overlap the first light-blocking member BK1, the light-transmissive pattern 230, the first wavelength conversion pattern 240 and the second wavelength conversion pattern 250. Accordingly, the first capping layer CAP1 may prevent impurities such as moisture or air from an outside from invading into and thus damaging or contaminating the first light-blocking member BK1, the light-transmissive pattern 230, the first wavelength conversion pattern 240, and the second wavelength conversion pattern 250.

The capping layer CAP1 may be made of an inorganic material. For example, the capping layer CAP1 may include at least one of silicon nitride, aluminum nitride, zirconium nitride, titanium nitride, hafnium nitride, tantalum nitride, silicon oxide, aluminum oxide, titanium oxide, tin oxide, and silicon oxynitride.

The color filter layer CFL may be disposed on the first capping layer CAP1. The color filter layer CFL may include a first color filter 211, a second color filter 213, and a third color filter 215.

The first color filter 211 may be disposed on one face of the first capping layer CAP1 and overlap the first light-emitting area LA1. Further, the first color filter 211 may overlap the light-transmissive pattern 230.

The first color filter 211 may selectively transmit the light of the first color (for example, blue light) therethrough and may block or absorb the light of the second color (for example, red light) and the light of the third color (for example, green light). In one embodiment, the first color filter 211 may be embodied as a blue color filter, and may include a blue colorant such as blue dye or blue pigment. In accordance with the disclosure, the colorant may include both the dye and the pigment.

The second color filter 213 may overlap the second light-emitting area LA2, and may overlap the first wavelength conversion pattern 240. In one embodiment, one side or a side of the second color filter 213 may overlap the non-light emitting area NLA, and may be spaced apart from the first color filter 211 adjacent thereto. The opposite side of the second color filter 213 may overlap the non-light emitting area NLA and may be spaced apart from the third color filter 215.

The second color filter 213 may block or absorb light of the first color, for example, blue light. For example, the second color filter 213 may function as a blue light blocking filter that blocks the blue light. The second color filter 213 may selectively transmit light of the second color (for example, red light) therethrough and may block or absorb light of the first color and light of the third color (for example, green light). For example, the second color filter 213 may be embodied as a red color filter, and may include a red colorant such as red dye or red pigment.

The third color filter 215 may overlap the third light-emitting area LA3, and may overlap the second wavelength conversion pattern 250. In one embodiment, one side or a side of the third color filter 215 may overlap the non-light emitting area NLA, and may be spaced apart from the second color filter 213 adjacent thereto. Further, the opposite side of the third color filter 215 may overlap the non-light emitting area NLA and may be spaced apart from the first color filter 211 adjacent thereto.

The third color filter 215 may block or absorb the light of the first color. For example, the third color filter 215 may function as a blue light blocking filter. The third color filter 215 may selectively transmit the light of the third color therethrough and may block or absorb the light of the first color and the light of the second color. For example, the third color filter 215 may be embodied as a green color filter, and may include a green colorant such as green dye or green pigment.

A second light-blocking member BK2 may be disposed on the first capping layer CAP1. The second light-blocking member BK2 may be disposed on the first capping layer CAP1 and in the non-light emitting area NLA and along a boundary between adjacent ones of the first to third light-emitting areas LA1, LA2, and LA3. The second light-blocking member BK2 may overlap the first light-blocking member BK1 and/or the bank BNL in the third direction DR3 as the thickness direction of the display device 10. A second capping layer CAP2 may be disposed above the second light-blocking member BK2.

The second light-blocking member BK2 may not only block light transmission therethrough, but also play a role in suppressing external light reflection. The second light-blocking member BK2 may be formed in a grid shape surrounding each of the first to third light-emitting areas LA1, LA2, and LA3 in a plan view.

The second light-blocking member BK2 may be made of an organic material. In one embodiment, the second light-blocking member BK2 may include a light absorbing material that absorbs a visible wavelength band. The second light-blocking member BK2 may define each of the first to third light-emitting areas LA1, LA2, and LA3.

The encapsulation layer TFE may be disposed on the color filter layer CFL. The encapsulation layer TFE may serve to prevent invasion of oxygen or moisture into the color conversion layer WLCL, the color filter layer CFL, and the light-emitting element layer EML disposed below the encapsulation layer TFE. To this end, the encapsulation layer TFE may include at least one inorganic film, or at least two inorganic films and an organic film interposed therebetween. For example, the encapsulation layer TFE may have a stack structure in which at least one organic film is disposed between two inorganic films. Each of the inorganic films may include silicon nitride, aluminum nitride, zirconium nitride, titanium nitride, hafnium nitride, tantalum nitride, silicon oxide, aluminum oxide, titanium oxide, tin oxide, cerium oxide, silicon oxynitride, lithium fluoride, and the like within the spirit and the scope of the disclosure.

The organic film may include acrylic resins, methacrylic resins, polyisoprene, vinyl resins, epoxy resins, urethane resins, cellulose resins, and perylene resins. However, a structure of the encapsulation layer TFE is not limited to the above-described example. The stack structure thereof may be variously modified.

Hereinafter, the circuit element layer CCL and the light-emitting element layer EML will be described in detail based on a planar structure and a cross-sectional structure of one pixel of the display device according to one embodiment.

Figure 3:
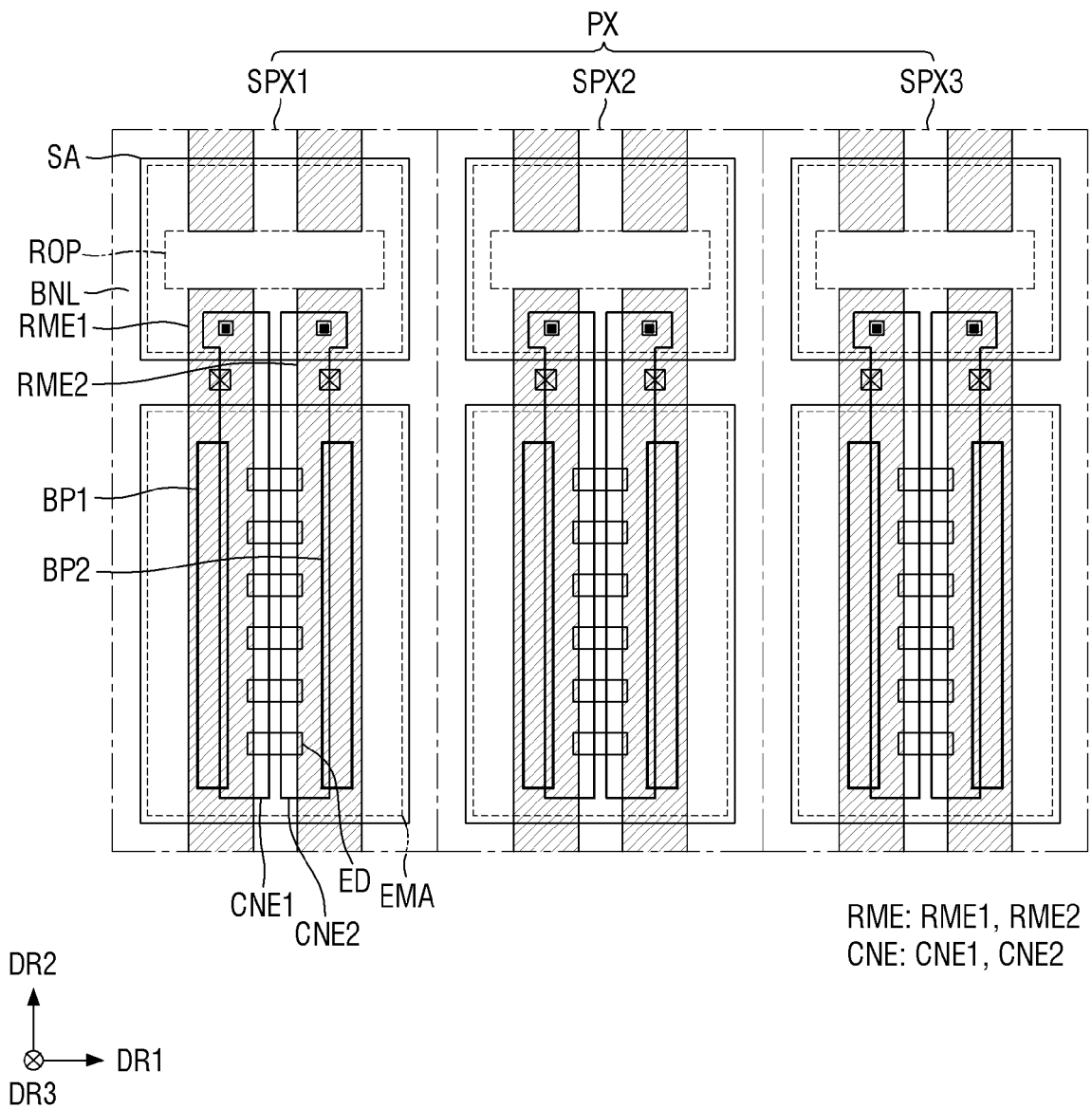
FIG. 3 is a schematic plan view showing one pixel of a display device according to one embodiment.

FIG. 3 is a schematic plan view showing one pixel of a display device according to one embodiment.

Referring to FIG. 3, each of pixels PX of the display device 10 may include sub-pixels SPXn (n being 1 to 3). For example, one pixel PX may include a first sub-pixel SPX1, a second sub-pixel SPX2, and a third sub-pixel SPX3. The sub-pixels SPXn may emit light of the same color. In one embodiment, the sub-pixels SPXn may emit blue light. Further, FIG. 3 illustrates that one pixel PX may include three sub-pixels SPXn. The disclosure is not limited thereto. The pixel PX may include a larger number of sub-pixels SPXn.

Each of the sub-pixels SPXn of the display device 10 may include a light-emitting area EMA and a non-light emitting unit. The light-emitting area EMA of each sub-pixel SPXn may correspond to each of the above-described light-emitting areas (LA1, LA2, and LA3 in FIG. 2), and the non-light emitting unit may correspond to the non-light emitting area (NLA FIG. 2). The light-emitting area EMA refers to an area in which the light-emitting element ED is disposed and thus light of a specific or given wavelength band emits. The non-light emitting area refers to an area in which the light-emitting element ED is not disposed and which light the light-emitting element ED does not reach, and in which light does not emit. The light-emitting area EMA may include an area in which the light-emitting element ED is disposed, and may further include an area adjacent to the light-emitting element ED to which light emitting from the light-emitting element ED are output.

The disclosure is not limited thereto. The light-emitting area EMA may include an area to which light emitting from the light-emitting element ED is reflected from or refracted on another member and is output. Light-emitting elements ED may be arranged or disposed in each sub-pixel SPXn. An area in which the light-emitting elements ED are disposed and an area adjacent thereto may form the light-emitting area EMA.

In the drawing, it is illustrated that the light-emitting areas EMA of the sub-pixels SPXn have a substantially uniform size. The disclosure is not limited thereto. In an embodiment, the light-emitting areas EMA of the sub-pixels SPXn may have different sizes, based on a color or a wavelength band of light emitting from the light-emitting element ED disposed in a corresponding sub-pixel.

Further, each sub-pixel SPXn may further include a sub-area SA disposed in the non-light emitting area. The sub-area SA may be disposed on one side or a side in the second direction DR2 of the light-emitting area EMA, and may be disposed between the light-emitting areas EMA of the sub-pixels SPXn neighboring to each other in the second direction DR2. For example, the light-emitting areas EMA and the sub-areas SA may be repeatedly arranged or disposed in the second direction DR2 such that the light-emitting area EMA and the sub-area SA may be alternately arranged or disposed with each other in the second direction DR2. The disclosure is not limited thereto. Across the pixels PX, the light-emitting areas EMA and the sub-areas SA may have a different arrangement from that of FIG. 3. In one pixel PX shown in FIG. 3, the light-emitting area EMA and the sub-area SA disposed on an upper side as one side or a side in the second direction DR2 of the light-emitting area EMA may be contained in one sub-pixel SPXn. An area disposed on a lower side as the opposite side in the second direction DR2 of the emitting area EMA may act as a sub-area SA of another sub-pixel SPXn neighboring to a corresponding sub-pixel SPXn in the second direction DR2.

Each bank BNL may be disposed between each of the sub-area SA and each of the light-emitting areas EMA. A distance therebetween may vary based on a width of the bank BNL. The light-emitting element ED is not disposed in the sub-area SA in which no light emits. However, the electrode RME disposed in each sub-pixel SPXn may extend into the sub-area SA. Portions of the electrode RME respectively disposed in different sub-pixels SPXn may be separated from each other via a separation portion ROP of the sub-area SA.

The bank BNL may be formed in a grid pattern including portions extending in the first direction DR1 and the second direction DR2 and across an entirety of the display area DPA in a plan view. The bank BNL may be disposed along a boundary between neighboring sub-pixels SPXn to distinguish the neighboring sub-pixels SPXn from each other. Further, the bank BNL may surround the light-emitting area EMA in each sub-pixel SPXn, and may define the light-emitting area EMA.

Each pixel PX or sub-pixel SPXn of the display device 10 may include a pixel driver circuit. The above-described lines may apply a drive signal to each pixel driver circuit while passing through or around each pixel PX. The pixel driver circuit may include a transistor and a capacitor. The number of the transistors and the number of the capacitors in each pixel driver circuit may be variously modified. According to one embodiment, each sub-pixel SPXn of the display device 10 may have a 3T1C structure in which the pixel driver circuit may include three transistors and one capacitor. Hereinafter, a case in which the pixel driver circuit has the 3T1C structure will be described by way of example. The disclosure is not limited thereto. Various other modified pixel PX structures such as a 2T1C structure, a 7T1C structure, and a 6T1C structure may be applied.

Figure 4:
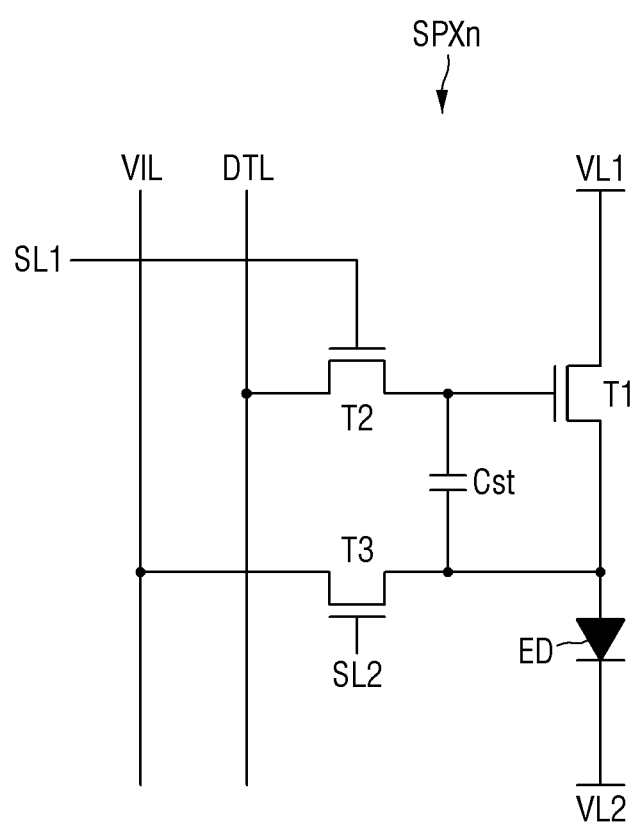
FIG. 4 is a schematic diagram of an equivalent circuit of one sub-pixel of a display device according to one embodiment.

FIG. 4 is a schematic diagram of an equivalent circuit of one sub-pixel of a display device according to one embodiment.

Referring to FIG. 4, each sub-pixel SPXn of the display device 10 according to one embodiment may include the light-emitting element ED, three transistors T1, T2, and T3 and one storage capacitor Cst.

The light-emitting element ED emits light based on a current supplied thereto through a first transistor T1. The light-emitting element ED may emit light of a specific or given wavelength band based on an electrical signal transmitted from the first electrode and the second electrode respectively connected to both opposing ends thereof.

One end of the light-emitting element ED may be connected to a source electrode of the first transistor T1, and the opposite end thereof may be connected to a second voltage line VL2 to which a low-potential voltage (hereinafter, a second power voltage) lower than a high-potential voltage (hereinafter, a first power voltage) of a first voltage line VL1 is supplied.

The first transistor T1 adjusts a current flowing from the first voltage line VL1 to which the first power voltage is supplied to the light-emitting element ED, based on a difference between voltages of a gate electrode and the source electrode thereof. In one example, the first transistor T1 may act as a driving transistor for driving the light-emitting element ED. The gate electrode of the first transistor T1 may be connected to a source electrode of a second transistor T2, the source electrode thereof may be connected to one end of the light-emitting element ED, and a drain electrode thereof may be connected to the first voltage line VL1 to which the first power voltage is applied.

The second transistor T2 may be turned on based on a scan signal of a first scan line SL1 to connect a data line DTL to the gate electrode of the first transistor T1. A gate electrode of the second transistor T2 may be connected to the first scan line SL1, the source electrode thereof may be connected to the gate electrode of the first transistor T1, and a drain electrode thereof may be connected to the data line DTL.

A third transistor T3 may be turned on based on a scan signal of a second scan line SL2 to connect an initialization voltage line VIL to one end of the light-emitting element ED. A gate electrode of the third transistor T3 may be connected to the second scan line SL2, a drain electrode thereof may be connected to the initialization voltage line VIL, and a source electrode thereof may be connected to one end of the light-emitting element ED and the source electrode of the first transistor T1. In the drawing, the first scan line SL1 and the second scan line SL2 are shown separately. The disclosure is not limited thereto. In an embodiment, the first scan line SL1 and the second scan line SL2 may be integrated into a single line. The second transistor T2 and the third transistor T3 may be simultaneously turned on based on the same scan signal.

In one embodiment, the source electrode and the drain electrode of each of the transistors T1, T2, and T3 are not limited to the above configuration. For example, the source electrode and the drain electrode of each of the transistors T1, T2, and T3 may have a configuration opposite to the above configuration. Further, each of the transistors T1, T2, and T3 may be embodied as a thin-film transistor. Further, in FIG. 4, a case in which each of the transistors T1, T2, and T3 is embodied as an N-type MOSFET (Metal Oxide Semiconductor Field Effect Transistor) is shown. The disclosure is not limited thereto. For example, each of the transistors T1, T2, and T3 may be embodied as a P-type MOSFET. By way of example, some or a number thereof may be embodied as an N-type MOSFET, and the other thereof a may be embodied as a P-type MOSFET.

The storage capacitor Cst is disposed between the gate electrode and the source electrode of the first transistor T1. The storage capacitor Cst stores therein a difference voltage between a gate voltage and a source voltage of the first transistor T1.

Hereinafter, a structure of one pixel PX of the display device 10 according to one embodiment will be described in detail with reference to another drawing.

Figure 5:
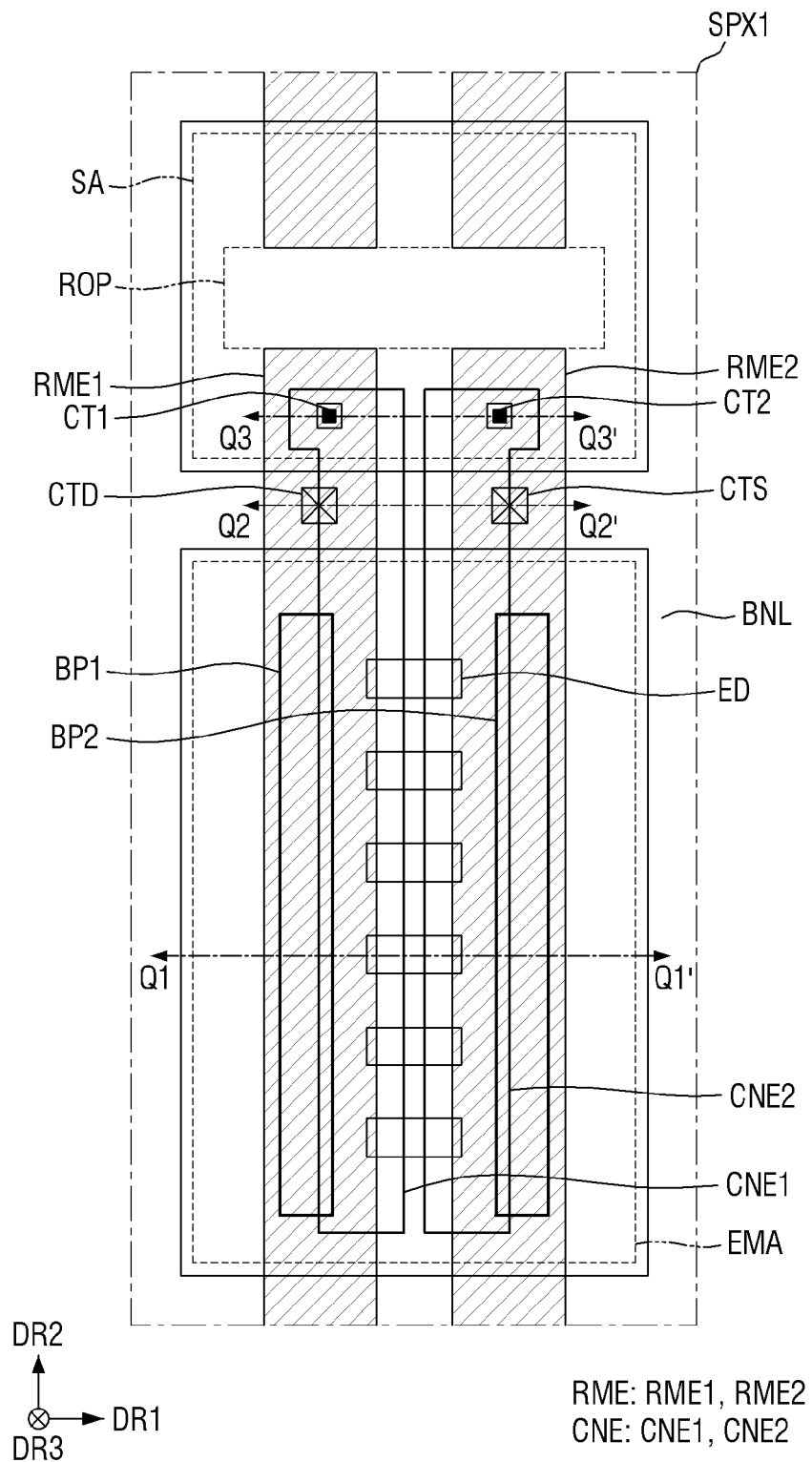
FIG. 5 is a schematic plan view showing a first sub-pixel of FIG. 3.
Figure 6:
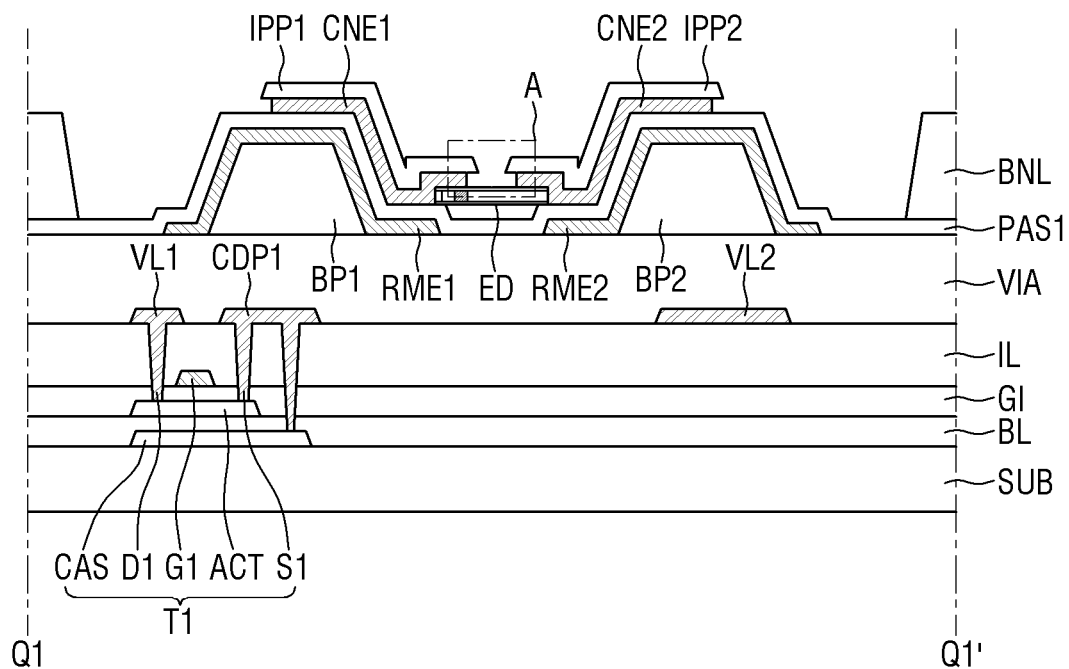
FIG. 6 is a schematic cross-sectional view taken along line Q1-Q1' in FIG. 5.
Figure 7:
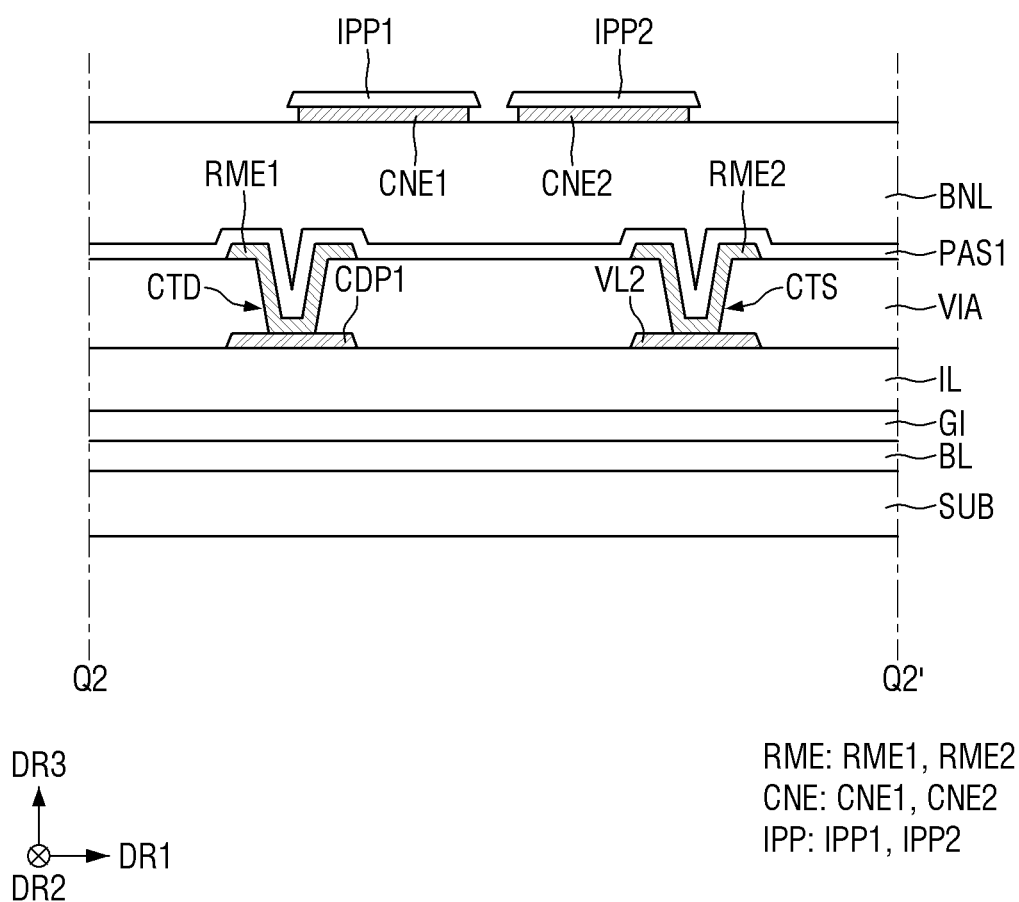
FIG. 7 is a schematic cross-sectional view taken along line Q2-Q2' in FIG. 5.
Figure 8:
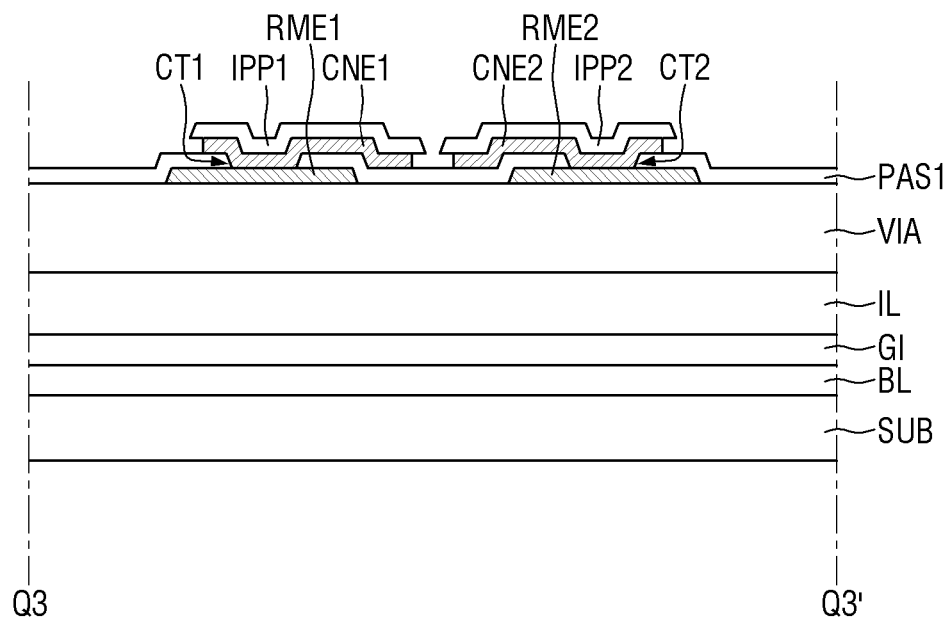
FIG. 8 is a schematic cross-sectional view taken along line Q3-Q3' in FIG. 5.
Figure 9:
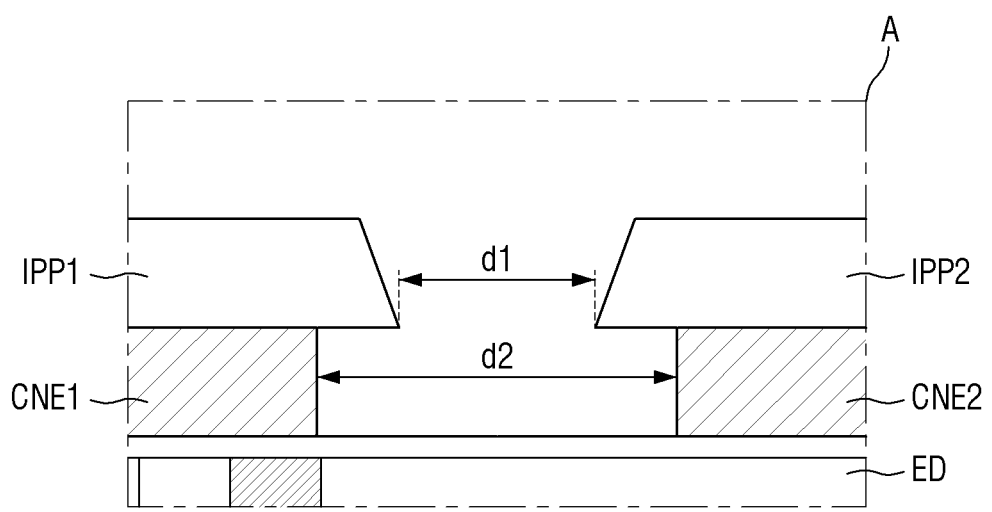
FIG. 9 is a schematic cross-sectional view showing an area A of FIG. 5.
Figure 10:
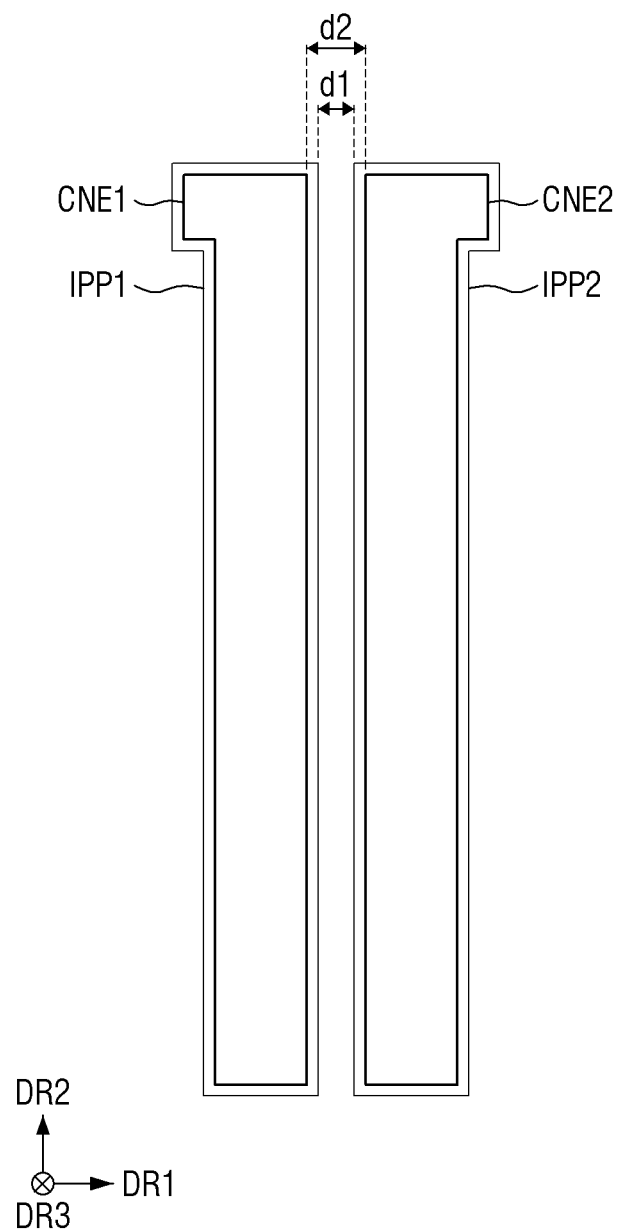
FIG. 10 is a schematic plan view showing connection electrodes and insulating patterns of the first sub-pixel.

FIG. 5 is a schematic plan view showing the first sub-pixel of FIG. 3. FIG. 6 is a schematic cross-sectional view taken along line Q1-Q1' in FIG. 5. FIG. 7 is a schematic cross-sectional view taken along line Q2-Q2' in FIG. 5. FIG. 8 is a schematic cross-sectional view taken along line Q3-Q3' in FIG. 5. FIG. 9 is a schematic cross-sectional view showing an area A of FIG. 5. FIG. 10 is a schematic plan view showing connection electrodes and insulating patterns of the first sub-pixel. Hereinafter, descriptions of the same configuration as the configuration as described with reference to FIG. 2 will be simplified.

Referring to FIG. 5 to FIG. 9 in conjunction with FIG. 2 and FIG. 3, the display device 10 may include a substrate SUB, and a semiconductor layer, conductive layers, and insulating layers which are disposed on the substrate SUB. The semiconductor layer, the conductive layers, and the insulating layers may form each of the circuit element layer CCL and the light-emitting element layer EML of the display device 10.

The substrate SUB may be embodied as an insulating substrate. The substrate SUB may be made of an insulating material such as glass, quartz, or polymer resin. Further, the substrate SUB may be embodied as a rigid substrate, or as a flexible substrate which is bendable, foldable, or rollable.

A first conductive layer may be disposed on the substrate SUB. The first conductive layer may include a lower metal layer CAS. The lower metal layer CAS may be disposed to overlap the active layer ACT of the first transistor T1. The lower metal layer CAS may include a material that blocks light, and thus may prevent light from invading an active layer ACT of the first transistor T1. However, the lower metal layer CAS may be omitted.

A buffer layer BL may be disposed on the lower metal layer CAS and the substrate SUB. The buffer layer BL may be disposed on the substrate SUB to protect the transistors of each sub-pixel SPXn from moisture invading the substrate SUB which is vulnerable to moisture permeation. The buffer layer BL may act as a surface planarization layer.

The semiconductor layer may be disposed on the buffer layer BL. The semiconductor layer may include the active layer ACT of the first transistor T1. The active layer ACT may be disposed to partially overlap a gate electrode G1 of a second conductive layer which will be described later.

The semiconductor layer may include polycrystalline silicon, monocrystalline silicon, oxide semiconductor, and the like within the spirit and the scope of the disclosure.

In an embodiment, the semiconductor layer may include polycrystalline silicon. The oxide semiconductor may be an oxide semiconductor containing indium (In). For example, the oxide semiconductor may include at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), and indium gallium zinc tin oxide (IGZTO).

The drawing illustrates that one first transistor T1 is disposed in the sub-pixel SPXn of the display device 10. The disclosure is not limited thereto. The display device 10 may include a larger number of transistors.

A gate insulating layer GI may be disposed on the semiconductor layer and the buffer layer BL. The gate insulating layer GI may serve as a gate insulating film of the first transistor T1.

A second conductive layer may be disposed on the gate insulating layer GI. The second conductive layer may include a gate electrode G1 of the first transistor T1. The gate electrode G1 may overlap a channel area of the active layer ACT in the third direction DR3 as the thickness direction.

An interlayer insulating layer IL may be disposed on the second conductive layer. The interlayer insulating layer IL may perform a function of an insulating film between the second conductive layer and other layers disposed thereon and may protect the second conductive layer. Further, the interlayer insulating layer IL may be disposed to cover or overlap the second conductive layer to perform a function of protecting the same. The interlayer insulating layer IL may be composed of an inorganic material layer, for example, an inorganic layer including one of silicon oxide ($SiO_x$), silicon nitride ($SiN_x$), and silicon oxynitride ($SiO_xN_y$), or may have a stack structure of at least two of a silicon oxide ($SiO_x$) layer, a silicon nitride ($SiN_x$) layer, and a silicon oxynitride ($SiO_xN_y$) layer.

A third conductive layer may be disposed on the interlayer insulating layer IL. The third conductive layer may include the first voltage line VL1, the second voltage line VL2, and a source electrode S1 and a drain electrode D1 of the first transistor T1.

The first voltage line VL1 may apply the high-potential voltage or the first power voltage to the first electrode RME1. The second voltage line VL2 may apply the low-potential voltage or the second power voltage to the second electrode RME2. A portion of the first voltage line VL1 may contact the active layer ACT of the first transistor T1 via a contact hole extending through the interlayer insulating layer IL and the gate insulating layer GI. The first voltage line VL1 may serve as the drain electrode D1 of the first transistor T1. The second voltage line VL2 may be connected to or directly connected to the second electrode RME2 to be described later.

A first conductive pattern CDP1 may contact the active layer ACT of the first transistor T1 via a contact hole extending through the interlayer insulating layer IL and the gate insulating layer GI. Further, the first conductive pattern CDP1 may contact the lower metal layer CAS via another contact hole. The first conductive pattern CDP1 may serve as the source electrode S1 of the first transistor T1.

In the drawing, it is illustrated that the first conductive pattern CDP1, the first voltage line VL1 and the second voltage line VL2, and the source electrode S1 and the drain electrode D1 are formed at the same level. The disclosure is not limited thereto. In an embodiment, the first conductive pattern CDP1, the first voltage line VL1 and the second voltage line VL2 may be formed at a level different from a level at which the source electrode S1 and the drain electrode D1 are formed. For example, a fourth conductive layer may be formed on the third conductive layer including the source electrode S1 and the drain electrode D1 while another insulating layer is disposed therebetween. In this connection, the fourth conductive layer may include the first conductive pattern CDP1, the first voltage line VL1 and the second voltage line VL2. The first voltage line VL1 may be electrically connected to the drain electrode D1 of the first transistor T1 via another conductive pattern. The first conductive pattern CDP1 may be electrically connected to the source electrode S1 of the first transistor T1 via another conductive pattern.

The third conductive layer may be embodied as a single layer or multiple layers made of one of molybdenum (Mo), aluminum (Al), chromium (Cr), gold (Au), titanium (Ti), nickel (Ni), neodymium (Nd), and copper (Cu) or an alloy thereof. However, the disclosure is not limited thereto.

Each of the buffer layer BL, the gate insulating layer GI, and the interlayer insulating layer IL as above-described may be embodied as inorganic layers alternately stacked each other. For example, each of the buffer layer BL, the gate insulating layer GI, and the interlayer insulating layer IL may be embodied as a stack of two inorganic layers including at least one of silicon oxide ($SiO_x$), silicon nitride ($SiN_x$), or silicon oxynitride ($SiO_xN_y$) or may be embodied as a stack in which multiple inorganic layers including at least one of silicon oxide ($SiO_x$), silicon nitride ($SiN_x$), or silicon oxynitride ($SiO_xN_y$) may be alternately stacked each other. However, the disclosure is not limited thereto. Each of the buffer layer BL, the gate insulating layer GI, and the interlayer insulating layer IL may be embodied as one inorganic layer including the insulating material as described above. Further, in an embodiment, the interlayer insulating layer IL may be made of an organic insulating material such as polyimide (PI).

A via layer VIA may be disposed on the third conductive layer. The via layer VIA may perform a function of an insulating film between the third conductive layer and other layers disposed thereon. Further, the via layer VIA may cover or overlap the third conductive layer and may perform a function of protecting the third conductive layer. The via layer VIA may include an organic insulating material such as polyimide (PI).

The light-emitting element layer EML disposed on the via layer VIA may include the bank pattern BP; BP1 and BP2, the electrodes RME; RME1 and RME2, the bank BNL, the light-emitting elements ED, and the connection electrodes CNE; CNE1 and CNE2. Further, at least one insulating layer PAS1 may be disposed on the via layer VIA.

The bank patterns BP may be disposed on or directly disposed on the via layer VIA. The bank pattern BP may have a shape extending in the second direction DR2. The bank patterns may be spaced apart from each other in the first direction DR1. For example, the bank patterns BP may include the first bank pattern BP1 and the second bank pattern BP2 spaced apart from each other and disposed in the light-emitting area EMA of each sub-pixel SPXn. The first bank pattern BP1 may be disposed at a left side around a center of the light-emitting area EMA, and the second bank pattern BP2 may be disposed at a right side around the center of the light-emitting area EMA. The light-emitting elements ED may be arranged or disposed between the first bank pattern BP1 and the second bank pattern BP2.

The bank pattern BP may have a length extending in the second direction DR2 smaller than a length in the second direction DR2 of the light-emitting area EMA surrounded with the bank BNL. The bank pattern BP may be disposed in the light-emitting area EMA of the sub-pixel SPXn and may be embodied as an island-shaped pattern extending in one direction or a direction and having a small width. In the drawing, it is illustrated that two bank patterns BP are disposed in each sub-pixel SPXn and have the same width. The disclosure is not limited thereto. The number and the shape of the bank patterns BP may vary based on the number or an arrangement structure of the electrodes RME.

Each of the bank patterns BP may have a structure in which at least a portion thereof protrudes upwardly from a top face of the via layer VIA. The protruding portion of each of the bank pattern BP may have an inclined side face. Light emitting from the light-emitting element ED may be reflected from the electrode RME disposed on each of the bank patterns BP and emit upwardly of the via layer VIA. The disclosure is not limited thereto. Each of the bank patterns BP may have a semi-circle or semi-ellipse shape with a curved outer face. Each of the bank patterns BP may include an organic insulating material such as polyimide (PI). The disclosure is not limited thereto.

Each of the electrodes RME disposed in each sub-pixel SPXn may have a shape extending in one direction or a direction. Each of the electrodes RME may extend in the second direction DR2. The electrodes RME may be disposed in the light-emitting area EMA of the sub-pixel SPXn, and may be spaced apart from each other in the first direction DR1. The electrodes RME may be electrically connected to the light-emitting element ED. Each electrode RME may be connected to the light-emitting element ED via each connection electrode CNE; CNE1 or CNE2 to be described later and may transmit an electrical signal applied from the underlying conductive layer to the light-emitting element ED.

The electrodes RME disposed in each sub-pixel SPXn may include the first electrode RME1 and the second electrode RME2. The first electrode RME1 may be disposed at a left side around the center of the light-emitting area EMA, and the second electrode RME2 may be spaced apart from the first electrode RME1 in the first direction DR1, and may be disposed at a right side around the center of the light-emitting area EMA. The first electrode RME1 may be disposed on the first bank pattern BP1, and the second electrode RME2 may be disposed on the second bank pattern BP2. Each of the first electrode RME1 and the second electrode RME2 may extend from the light-emitting area EMA beyond the bank BNL into the sub-area SA in the corresponding sub-pixel SPXn. Each of the first electrode RME1 and the second electrode RME2 of one sub-pixel SPXn may be spaced apart from each of the first electrode RME1 and the second electrode RME2 of another sub-pixel SPXn adjacent thereto via the separation portion ROP located or disposed in the sub-area SA of one of the two sub-pixels SPXn.

Each of the first electrode RME1 and the second electrode RME2 may be disposed at least on the inclined side face of each of the bank patterns BP1 and BP2. In one embodiment, a width measured in the second direction DR2 of each of the electrodes RME may be greater than a width measured in the second direction DR2 of each of the bank patterns BP1 and BP2. Each of the first electrode RME1 and the second electrode RME2 may be disposed to cover or overlap at least one side face or at least a side face of each of the bank patterns BP1 and BP2, so that light emitting from the light-emitting element ED may be reflected from each of the first electrode RME1 and the second electrode RME2.

Further, a distance between the first electrode RME1 and the second electrode RME2 in the second direction DR2 may be smaller than a distance between the bank patterns BP1 and BP2 in the second direction DR2. The first electrode RME1 and the second electrode RME2 may be disposed on the same plane while at least a partial area of each of the first electrode RME1 and the second electrode RME2 may be disposed on or directly disposed on the via layer VIA.

The electrodes RME may be respectively disposed on the bank patterns BP1 and BP2. The light emitting from the light-emitting elements ED disposed between the bank patterns BP1 and BP2 may be reflected from the electrode RME disposed on each of the bank patterns BP1 and BP2 and is output upwardly. Each electrode RME may include a highly reflective conductive material to reflect the light emitting from the light-emitting element ED.

Each of the electrodes RME may include a highly reflective conductive material to reflect the light emitting from the light-emitting element ED. Each of the electrodes RME may include a material having high reflectivity and conductivity. For example, each of the electrodes RME may include aluminum (Al), or an alloy including aluminum (Al), nickel (Ni), lanthanum (La), copper (Cu), and the like within the spirit and the scope of the disclosure.

Further, each of the electrodes RME may further include a material such as ITO, IZO, and ITZO, or have a structure in which at least two layers made thereof may be stacked each other.

Each electrode RME may be electrically connected to the light-emitting element ED via each connection electrode CNE to be described later. The electrode RME may be in direct contact with each of the connection electrode CNE and the underlying third conductive layer. The material including aluminum (Al) as the material of the electrode RME may be vulnerable to damage that may occur in a subsequent process after the electrode RME formation, or may react with a solution used in the subsequent process. In case that a portion of the electrode RME reacts with the solution at a location at which the electrode RME and another layer, for example, the connection electrode CNE contact each other, electrical connection of the electrode to another layer may be not reliable or an electrical resistance at a contact face therebetween may greatly increase. To prevent this situation, a layer capable of protecting the electrode RME may be disposed so that the electrode RME does not react with the solution. A more detailed description of such a layer will be described later.

Each electrode RME may extend from the light-emitting area EMA into the sub-area SA and thus may include a portion overlapping the bank BNL, and a portion disposed in the sub-area SA. According to one embodiment, a portion of each electrode RME may be disposed in the sub-area SA.

The electrodes RME may be disposed on the via layer VIA. The electrodes RME may include the first electrode RME1 and the second electrode RME2. Each of the first electrode RME1 and the second electrode RME2 may extend in the second direction DR2, while the first electrode RME1 and the second electrode RME2 may be spaced apart from each other in the first direction DR1.

In the sub-area SA, each of the electrodes RME in one sub-pixel SPXn may be separated from each of the electrode RME in another sub-pixel SPXn. For example, the sub-area SA may be disposed between light-emitting areas EMA of two sub-pixels SPXn neighboring to each other in the second direction DR2. In the sub-area SA, the first electrode RME1 and the second electrode RME2 disposed in one of the two sub-pixels SPXn may be separated from the first electrode RME1 and the second electrode RME2 disposed in the other of the two sub-pixels SPXn. However, the disclosure is not limited thereto. Each of some or a number of electrodes RME may be continuous across the two sub-pixels SPXn neighboring to each other in the second direction DR2. In one example, one of the first electrode RME1 and the second electrode RME2 may be continuous across the two sub-pixels SPXn neighboring to each other in the second direction DR2 while the other of the first electrode RME1 and the second electrode RME2 may be discontinuous across the two sub-pixels SPXn neighboring to each other in the second direction DR2.

The first electrode RME1 may be electrically connected to the first transistor T1 via a first electrode contact hole CTD, while the second electrode RME2 may be electrically connected to the second voltage line VL2 via a second electrode contact hole CTS. For example, the first electrode RME1 may contact the first conductive pattern CDP via the first electrode contact hole CTD vertically extending from the portion of the bank BNL extending in the first direction DR1 through the via layer VIA. The second electrode RME2 BNL may contact the second voltage line VL2 via the second electrode contact hole CTS vertically extending from the portion of the bank BNL extending in the first direction DR1 through the via layer VIA. The disclosure is not limited thereto. In an embodiment, the first electrode contact hole CTD and the second electrode contact hole CTS may be disposed within the light-emitting area EMA surrounded with the bank BNL such that each of the first electrode contact hole CTD and the second electrode contact hole CTS does not overlap the bank BNL. In an embodiment, the second electrode RME2 may come in direct contact with the third conductive layer and may receive a voltage therefrom.

In the drawing, it is illustrated that one first electrode RME1 and one second electrode RME2 are disposed in each sub-pixel SPXn. The disclosure is not limited thereto. Each of the number of the first electrodes RME1 and the number of the second electrodes RME2 disposed in each sub-pixel SPXn may be greater than 1. Further, each of the first electrode RME1 and the second electrode RME2 disposed in each sub-pixel SPXn may not have a shape extending in one direction or a direction. Each of the first electrode RME1 and the second electrode RME2 may have various structures. For example, each of the first electrode RME1 and the second electrode RME2 may have a partially curved or bent shape. By way of example, one of the first electrode RME1 and the second electrode RME2 may surround the other thereof.

Each of the electrodes RME may include a highly reflective conductive material. For example, each of the electrodes RME may include a metal such as silver (Ag), copper (Cu), or aluminum (Al) as a material having high reflectivity or an alloy including aluminum (Al), nickel (Ni), lanthanum (La), and the like within the spirit and the scope of the disclosure.

The electrodes RME may reflect light emitting from the light-emitting element ED toward a top of each sub-pixel SPXn.

However, the disclosure is not limited thereto. Each of the electrodes RME may further include a transparent conductive material. For example, each of the electrodes RME may include a material such as ITO (Indium Tin Oxide), IZO (Indium Zinc Oxide), ITZO (Indium Tin-Zinc Oxide), or the like within the spirit and the scope of the disclosure.

In an embodiment, each of the electrodes RME may have a structure in which at least one layer or a layer made of a transparent conductive material and at least one layer or a layer made of a metal having high reflectivity may be stacked one on top of another, or may be composed as a single layer including the transparent conductive material and the metal having high reflectivity. For example, each of the electrodes RME may have a stack structure such as ITO/silver (Ag)/ITO, ITO/Ag/IZO, or ITO/Ag/ITZO/IZO.

The electrodes RME may be electrically connected to the light-emitting element ED and may apply a predefined voltage thereto so that the light-emitting element ED emits light. The electrodes RME may be electrically connected to the light-emitting element ED via the connection electrodes CNE, and may transmit an electrical signal applied to the electrodes RME to the light-emitting element ED via the connection electrodes CNE.

One of the first electrode RME1 and the second electrode RME2 may be electrically connected to an anode of the light-emitting element ED, and the other thereof may be electrically connected to a cathode of the light-emitting element ED. However, the disclosure is not limited thereto or vice versa.

Further, the electrodes RME may be utilized to generate an electric field in the sub-pixel SPXn to align the light-emitting elements ED with each other. The light-emitting elements ED may be aligned with each other via an electric field generated between the first electrode RME1 and the second electrode RME2 while being arranged or disposed between the first electrode RME1 and the second electrode RME2. The light-emitting elements ED of the display device 10 may be sprayed onto the electrodes RME using an inkjet printing process. In case that ink containing the light-emitting elements ED has been sprayed onto the electrodes RME, an alignment signal is applied to the electrodes RME to generate the electric field. The light-emitting elements ED dispersed in the ink may be subjected to a dielectrophoretic force resulting from the electric field generated between the electrodes RME and thus may be aligned with each other while being disposed between the electrodes RME.

The first insulating layer PAS1 may be disposed on the via layer VIA. The first insulating layer PAS1 may be disposed to cover or overlap the first electrode RME1 and the second electrode RME2. The first insulating layer PAS1 may protect the first electrode RME1 and the second electrode RME2 and at the same time insulate the first electrode RME1 and the second electrode RME2 from each other. Further, the first insulating layer PAS1 may prevent the light-emitting element ED disposed on the first insulating layer PAS1 from being damaged via direct contact with other members.

In an embodiment, the first insulating layer PAS1 may be stepped such that a portion of a top face thereof between the electrodes RME spaced apart in the first direction DR1 is depressed. The light-emitting element ED may be disposed on the depressed portion of the top face of the first insulating layer PAS1 such that a space may be formed between the light-emitting element ED and the first insulating layer PAS1.

The first insulating layer PAS1 may receive therein contacts CT1 and CT2, each exposing a portion of a top face of each of the electrodes RME. The contacts CT1 and CT2 may pass through the first insulating layer PAS1. The connection electrodes CNE to be described later may contact the exposed electrodes RME via the contacts CT1 and CT2, respectively. The contacts CT1 and CT2 may be disposed in the sub-area SA. However, the disclosure is not limited thereto. The contacts CT1 and CT2 may be disposed in the light-emitting area EMA. The first insulating layer PAS1 may include an inorganic insulating material or an organic insulating material. However, the disclosure is not limited thereto.

The bank BNL may be disposed on the first insulating layer PAS1. The bank BNL may be formed in a grid pattern including the portion extending in the first direction DR1 and the portion extending in the second direction DR2 in a plan view. The bank BNL may extend along a boundary of each sub-pixel SPXn to distinguish neighboring sub-pixels SPXn from each other. Further, the bank BNL may surround the light-emitting area EMA and the sub-area SA. The bank BNL may surround and define each of the light-emitting area EMA and the sub-area SA.

The bank BNL may prevent the ink in a corresponding sub-pixel SPXn from overflowing into an adjacent sub-pixel SPXn in the inkjet printing process during a manufacturing process of the display device 10. In the inkjet printing process during the manufacturing process of the display device 10, different inks sprayed onto different sub-pixels SPXn may contain different light-emitting elements ED. Thus, the bank BNL may prevent the different inks from mixing with each other. To this end, a surface of the bank BNL may be treated to have hydrophobicity.

Further, the bank BNL may include a black matrix material that may absorb light. The black matrix may include an organic material, and black pigments in the organic material to absorb light. In one embodiment, the bank BNL may include the black matrix material to absorb light emitting from the sub-pixel SPXn surrounded therewith to prevent color mixing between adjacent sub-pixels SPXn.

The light-emitting elements ED may be disposed on the first insulating layer PAS1. The light-emitting element ED may include layers arranged or disposed in a direction parallel to a top face of the substrate SUB. The light-emitting element ED of the display device 10 may be oriented so that one direction or a direction in which the light-emitting element extends is parallel to a top face of the substrate SUB. Semiconductor layers constituting the light-emitting element ED may be sequentially arranged or disposed in a direction parallel to the top face of the substrate SUB. The disclosure is not limited thereto. In some cases, in case that the light-emitting element ED has a different structure, the layers constituting the light-emitting element ED may be arranged or disposed in a direction perpendicular to the top face of the substrate SUB.

The light-emitting elements ED may be disposed on the electrode RME spaced apart from each other in the first direction DR1 and between the bank patterns BP. The light-emitting elements ED may be spaced apart from each other in the second direction DR2 in which each of the electrodes RME extends, and may be aligned to be substantially parallel to each other. The light-emitting element ED may have a shape extending in one direction or a direction. A length by which the light-emitting element ED extends may be larger than the shortest distance between the electrodes RME spaced apart from each other in the first direction DR1. At least one end of each of the light-emitting elements ED may be disposed on one of different electrodes RME, or both opposing ends thereof may be disposed on different electrodes RME, respectively. A direction in which each of the electrodes RME extends and a direction in which the light-emitting element ED extends may be substantially perpendicular to each other. However, the disclosure is not limited thereto. The light-emitting element ED may extend obliquely in the direction in which each of the electrodes RME extends.

Each of the light-emitting elements ED disposed in each sub-pixel SPXn may include the semiconductor layers. The light-emitting elements ED may emit light beams of different wavelength bands based on types of materials of the semiconductor layers. The disclosure is not limited thereto. The light-emitting elements ED disposed in each sub-pixel SPXn may include the semiconductor layer made of a same material or a similar material and thus may emit light of the same color. Further, the light-emitting element ED may include semiconductor layers respectively doped with different conductive type dopants, and thus may be oriented so that one end thereof faces in a specific or given direction due to the electric field generated between the electrodes RME. The light-emitting element ED may have opposite first and second ends which may sandwich one semiconductor layer therebetween. For example, the first end of the light-emitting element ED may be a portion thereof disposed on the first electrode RME1, while the second end thereof may be a portion thereof disposed on the second electrode RME2. In an embodiment in which the display device 10 may include a larger number of electrodes RME, the light-emitting elements ED disposed on different electrodes RME may have different directions in which the first ends thereof face.

The light-emitting elements ED may be electrically connected to the connection electrodes CNE, respectively. A portion of the semiconductor layer as one end of the light-emitting element ED may be exposed. The exposed portion of the semiconductor layer may contact the connection electrode CNE. Each light-emitting element ED may be electrically connected to the electrode RME and the conductive layers disposed below the via layer VIA via each connection electrode CNE. Thus, an electrical signal may be applied to the light-emitting element ED to emit light of a specific or given wavelength band.

The connection electrodes CNE may be disposed on the light-emitting elements ED, the electrodes RME and the bank patterns BP. Further, the connection electrode CNE may be partially disposed on the bank pattern BP. The connection electrodes CNE may be spaced apart from each other. The connection electrodes CNE may be in contact with the light-emitting element ED and may contact the electrodes RME, respectively. The connection electrode CNE may contact or directly contact the exposed portion of the semiconductor layer as each of both opposing ends of the light-emitting element ED, and contact at least one of the electrodes RME via the contacts CT1 and CT2 passing through the first insulating layer PAS1. Both opposing ends of the light-emitting element ED may be electrically connected respectively to the electrodes RME via the connection electrodes CNE.

The first connection electrode CNE1 may have a shape extending in the second direction DR2 and may be disposed on the first electrode RME1 and the first bank pattern BP1. A portion of the first connection electrode CNE1 may overlap the first electrode RME1 and the first bank pattern BP1, while the other portion thereof may overlap the light-emitting element ED. The first connection electrode CNE1 may be in contact with the first electrode RME1 via the first contact CT1 exposing the top face of the first electrode RME1 and may be in contact with the first ends of the light-emitting elements ED.

The second connection electrode CNE2 may have a shape extending in the second direction DR2 and may be disposed on the second electrode RME2 and the second bank pattern BP2. A portion of the second connection electrode CNE2 may overlap the second electrode RME2 and the second bank pattern BP2, while the other portion thereof may overlap the light-emitting element ED. The second connection electrode CNE2 may be in contact with the second electrode RME2 via the second contact CT2 exposing the top face of the second electrode RME2 and may be in contact with the second ends of the light-emitting elements ED.

Each of the first connection electrode CNE1 and the second connection electrode CNE2 may transmit the electrical signal applied to each of the first electrode RME1 and the second electrode RME2 to the light-emitting elements ED. The electrical signal may be applied to or directly applied to the light-emitting element ED. Further, the first connection electrode CNE1 and the second connection electrode CNE2 may be spaced apart from each other in the first direction DR1 in a plan view. The first connection electrode CNE1 and the second connection electrode CNE2 may not contact or directly contact each other. The electrical signal applied to each of the first and second connection electrodes CNE may flow through the light-emitting element ED.

In one embodiment, the first connection electrode CNE1 and the second connection electrode CNE2 may be disposed at the same vertical level. Each of the first connection electrode CNE1 and the second connection electrode CNE2 may be disposed on or directly disposed on the light-emitting element ED and the first insulating layer PAS1. The first connection electrode CNE1 and the second connection electrode CNE2 may be insulated from each other while being spaced apart from each other.

A portion of the connection electrode CNE overlapping each of the contacts CT1 and CT2 may have a larger width. Each of the connection electrodes CNE may contact each of the electrodes RME via each of the contacts CT1 and CT2 passing through the first insulating layer PAS1.

In one embodiment, the contacts CT1 and CT2 may be spaced apart from an area in which each of the light-emitting elements ED is disposed in the second direction DR2 such that the contacts CT1 and CT2 may not overlap the light-emitting elements ED. In the drawing, it is illustrated that the contacts CT1 and CT2 are disposed in the sub-area SA. The disclosure is not limited thereto. The contacts CT1 and CT2 may be formed in a portion of the light-emitting area EMA in which the light-emitting elements ED are not disposed.

The connection electrode CNE may include a conductive material. For example, the connection electrode CNE may include ITO, IZO, ITZO, aluminum (Al), etc. within the spirit and the scope of the disclosure. In one example, the connection electrode CNE may include a transparent conductive material. Light emitting from the light-emitting element ED may pass through the connection electrode CNE and travel toward the electrodes RME. However, the disclosure is not limited thereto.

In one embodiment, the display device 10 may further include insulating patterns IPP; IPP1 and IPP2. The insulating patterns IPP may be respectively disposed on the connection electrodes CNE. The insulating patterns IPP may be disposed on or disposed directly on the connection electrodes CNE and contact the connection electrodes CNE, respectively, and may be spaced apart from each other while not contacting other layers. The insulating patterns IPP; IPP1 and IPP2 may include a first insulating pattern IPP1 and a second insulating pattern IPP2.

The first insulating pattern IPP1 may have a shape extending in the second direction DR2 and be disposed on the first connection electrode CNE1. The first insulating pattern IPP1 may contact the first connection electrode CNE1 and overlap the first bank pattern BP1, the first electrode RME1, the light-emitting element ED, and the first connection electrode CNE1. Further, the first insulating pattern IPP1 may be spaced apart, in the third direction DR3, from each of the light-emitting element ED and the first insulating layer PAS1 disposed under or below the first insulating pattern IPP1.

The second insulating pattern IPP2 may have a shape extending in the second direction DR2 and be disposed on the second connection electrode CNE2. The second insulating pattern IPP2 may contact the second connection electrode CNE2 and overlap the second bank pattern BP2, the second electrode RME2, the light-emitting element ED, and the second connection electrode CNE2. Further, the second insulating pattern IPP2 may be spaced apart, in the third direction DR3, each of the light-emitting element ED and the first insulating layer PAS1 disposed under or below the second insulating pattern IPP2.

Each of the first insulating pattern IPP1 and the second insulating pattern IPP2 may serve as a mask for protecting each of the first connection electrode CNE1 and the second connection electrode CNE2 and forming each of the first connection electrode CNE1 and the second connection electrode CNE2. As will be described later, each of the first insulating pattern IPP1 and the second insulating pattern IPP2 may be formed as a pattern on each of the first connection electrode CNE1 and the second connection electrode CNE2, and may act as each mask in a wet etching process of the first connection electrode CNE1 and the second connection electrode CNE2.

Referring to FIG. 9, the first insulating pattern IPP1 and the second insulating pattern IPP2 may be spaced apart from each other in the first direction DR1. In this connection, a first distance d1 between the first insulating pattern IPP1 and the second insulating pattern IPP2 may be smaller than a second distance d2 between the first connection electrode CNE1 and the second connection electrode CNE2. In case that, as described above, each of the first insulating pattern IPP1 and the second insulating pattern IPP2 acts as each mask in the wet etching process of the first connection electrode CNE1 and the second connection electrode CNE2, the first insulating pattern IPP1 and the second insulating pattern IPP2 may not be etched, while the first connection electrode CNE1 and the second connection electrode CNE2 may be etched. For example, each of the first connection electrode CNE1 and the second connection electrode CNE2 may be further etched inwardly of each of the first insulating pattern IPP1 and the second insulating pattern IPP2 that acts as the mask, due to nature of the wet etching process. Accordingly, the first distance d1 between the first insulating pattern IPP1 and the second insulating pattern IPP2 may be smaller than the second distance d2 between the first connection electrode CNE1 and the second connection electrode CNE2.

As shown in FIG. 10, the first insulating pattern IPP1 and the second insulating pattern IPP2 may be spaced apart from each other. Each of the first insulating pattern IPP1 and the second insulating pattern IPP2 may be formed as an island-shaped pattern. A planar area of the first insulating pattern IPP1 may be larger than a planar area of the first connection electrode CNE1, while a planar area of the second insulating pattern IPP2 may be larger than a planar area of the second connection electrode CNE2. Further, the first insulating pattern IPP1 may completely cover and overlap the first connection electrode CNE1, and the second insulating pattern IPP2 may completely cover and overlap the second connection electrode CNE2.

As described above, each of the first connection electrode CNE1 and the second connection electrode CNE2 may be further etched inwardly of each of the first insulating pattern IPP1 and the second insulating pattern IPP2. Thus, the planar areas of the first insulating pattern IPP1 and the second insulating pattern IPP2 may be respectively larger than the planar areas of the first connection electrode CNE1 and of the second connection electrode CNE2. Further, a side of the first insulating pattern IPP1 may protrude outwardly beyond a side of the first connection electrode CNE1.

A side of the second insulating pattern IPP2 may protrude outwardly beyond a side of the second connection electrode CNE2.

Each of the first insulating pattern IPP1 and the second insulating pattern IPP2 may include an inorganic insulating material. Each of the first insulating pattern IPP1 and the second insulating pattern IPP2 may include, for example, silicon nitride, aluminum nitride, zirconium nitride, titanium nitride, hafnium nitride, tantalum nitride, silicon oxide, aluminum oxide, titanium oxide, tin oxide, and silicon oxynitride. However, the disclosure is not limited thereto. The material of each of the first insulating pattern IPP1 and the second insulating pattern IPP2 is not particularly limited as long as each of the first insulating pattern IPP1 and the second insulating pattern IPP2 may act as each mask for the wet etching process of each of the first connection electrode CNE1 and the second connection electrode CNE2.

Figure 11:
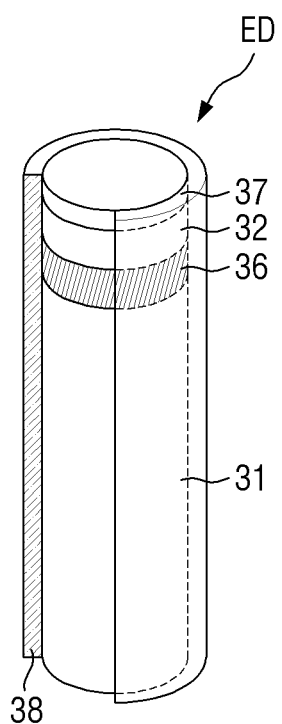
FIG. 11 is a schematic diagram of a light-emitting element according to one embodiment.

FIG. 11 is a schematic diagram of a light-emitting element according to one embodiment.

Referring to FIG. 11, the above-described light-emitting element ED may be embodied as a light-emitting diode. By way of non-limiting example, the light-emitting element ED may be embodied as an inorganic light-emitting diode made of an inorganic material and having a size of nano-meter to micro-meter. The light-emitting elements ED may be arranged or disposed between the two electrodes facing toward each other. In case that an electric field in a specific or given direction is generated between the two electrodes, the light-emitting elements ED may be aligned in the same orientation.

The light-emitting element ED according to one embodiment may have a shape extending in one direction or a direction. The light-emitting element ED may have a shape such as a cylinder, a rod, a wire, or a tube. However, the shape of the light-emitting element ED according to the disclosure is not limited thereto. The light-emitting element ED may have a variety of shapes. In another example, the light-emitting element ED may have a shape of a polygonal prism such as a cube, a cuboid, or a hexagonal prism. In another example, the light-emitting element may extend in one direction or a direction and has a partially inclined outer face.

The light-emitting element ED may include a semiconductor layer doped with any conductive type, for example, p-type or n-type impurities. The semiconductor layer may receive an electrical signal applied from an external power source and may emit light of a specific or given wavelength band. The light-emitting element ED may include a first semiconductor layer 31, a second semiconductor layer 32, a light-emissive layer 36, an electrode layer 37, and an insulating film 38.

The first semiconductor layer 31 may be an n-type semiconductor. The first semiconductor layer 31 may include a semiconductor material having a chemical formula of $Al_xGa_yIn_{1-x-y}N$ ($0 \leq x \leq 1$, $0 \leq y \leq 1$, $0 \leq x+y \leq 1$). For example, the first semiconductor layer 31 may be made of at least one of AlGaInN, GaN, AlGaN, InGaN, AlN, and InN and may be doped with a n-type dopant. The n-type dopant doped into the first semiconductor layer 31 may be Si, Ge, Sn, or the like within the spirit and the scope of the disclosure.

The second semiconductor layer 32 may be disposed on the first semiconductor layer 31 while the light-emissive layer 36 is interposed therebetween. The second semiconductor layer 32 may be a p-type semiconductor. The second semiconductor layer 32 may include a semiconductor material having a chemical formula of $Al_xGa_yIn_{1-x-y}N$ ($0 \leq x \leq 1$, $0 \leq y \leq 1$, $0 \leq x+y \leq 1$). For example, the second semiconductor layer 32 may be made of at least one of AlGaInN, GaN, AlGaN, InGaN, AlN, and InN and may be doped with a p-type dopant. The p-type dopant doped into the second semiconductor layer 32 may be Mg, Zn, Ca, Se, Ba, or the like within the spirit and the scope of the disclosure.

In one example, the drawing shows that each of the first semiconductor layer 31 and the second semiconductor layer 32 is composed of a single layer. However, the disclosure is not limited thereto. Depending on a material of the light-emissive layer 36, each of the first semiconductor layer 31 and the second semiconductor layer 32 may further include a larger number of layers, for example, a cladding layer or a TSBR (tensile strain barrier reducing) layer.

The light-emissive layer 36 may be disposed between the first semiconductor layer 31 and the second semiconductor layer 32. The light-emissive layer 36 may include a material of a single or multiple quantum well structure. In case that the light-emissive layer 36 may include the material of the multiple quantum well structure, the light-emissive layer 36 may have a structure in which quantum layers and well layers may be alternately stacked each other. The light-emissive layer 36 may emit light via combinations between electrons and holes according to an electrical signal applied through the first semiconductor layer 31 and the second semiconductor layer 32. The light-emissive layer 36 may include a material such as AlGaN and AlGaInN. In case that the light-emissive layer 36 has a structure in which quantum layers and well layers may be alternately stacked each other, the quantum layer may include a material such as AlGaN or AlGaInN, and the well layer may include a material such as GaN or AlInN.

The light-emissive layer 36 may have a structure in which first layers made of a semiconductor material having a larger bandgap energy and second layers made of a semiconductor material having a smaller bandgap energy may be alternately stacked each other. The light-emissive layer 36 may include group III to group V semiconductor materials depending on a wavelength band of emitting light. The light emitting from the light-emissive layer 36 is not limited to light of a wavelength band corresponding to a blue color. In some cases, the light emitting from the light-emissive layer 36 may be light of a wavelength band corresponding to a red or green color.

The electrode layer 37 may be embodied as an ohmic connection electrode. The disclosure is not limited thereto. The electrode layer 37 may be embodied as a Schottky connection electrode. The light-emitting element ED may include at least one electrode layer 37. The disclosure is not limited thereto. The electrode layer 37 may be omitted.

The electrode layer 37 may reduce an electrical resistance between the light-emitting element ED and the electrode or the connection electrode in case that the light-emitting element ED is electrically connected to the electrode or the connection electrode in the display device 10. The electrode layer 37 may include a conductive metal. For example, the electrode layer 37 may include at least one of aluminum (Al), titanium (Ti), indium (In), gold (Au), silver (Ag), ITO, IZO, and ITZO.

The insulating film 38 may be disposed to surround an outer face of each of the semiconductor layers and the electrode layer as described above. For example, the insulating film 38 may be disposed to surround at least an outer face of the light-emissive layer 36 such that both opposing ends in a longitudinal direction of the light-emitting element ED may be exposed. Further, the insulating film 38 may be formed in an area adjacent to at least one end of the light-emitting element ED so as to have a rounded top face in a schematic cross-sectional view.

The insulating film 38 may include a material having insulating ability, for example, silicon oxide ($SiO_x$), silicon nitride ($SiN_x$), silicon oxynitride ($SiO_xN_y$), aluminum nitride ($AlN_x$), aluminum oxide ($AlO_x$), and the like within the spirit and the scope of the disclosure.

The drawing illustrates that the insulating film 38 is formed as a single layer. However, the disclosure is not limited thereto. In an embodiment, the insulating film 38 may be embodied as a multiple layer structure in which layers may be stacked each other.

Further, the insulating film 38 may perform the function of protecting the members. The insulating film 38 may prevent an electrical short circuit that may otherwise occur in the light-emissive layer 36 in case that the light-emitting element ED is in direct contact with the electrode to which the electrical signal is transmitted. Further, the insulating film 38 may prevent deterioration of the luminous efficiency of the light-emitting element ED.

Further, an outer face of the insulating film 38 may be surface-treated. The light-emitting elements ED may be sprayed onto the electrode while being dispersed in pre-defined ink and may be aligned with each other. In this connection, in order to prevent adjacent light-emitting elements ED from being agglomerated with each other and rather, keep the light-emitting elements ED in a dispersed state in the ink, a surface of the insulating film 38 may be treated to have hydrophobicity or hydrophilicity.

Hereinafter, with reference to other drawings, a manufacturing process of the display device 10 according to one embodiment will be described.

FIG. 12 to FIG. 20 are schematic diagrams showing the manufacturing process of the display device according to one embodiment. FIG. 12 to FIG. 20 show schematic cross-sectional view of structures based on a formation order of the layers in one sub-pixel SPXn of the display device 10, respectively. FIG. 12 to FIG. 20 illustrates patterning processes of the connection electrode CNE, respectively which may correspond to the schematic cross-sectional view of FIG. 6. A manufacturing process of each layer may be performed using a general patterning process. Hereinafter, the manufacturing process performed using the general patterning process will be briefly described.

Figure 12:
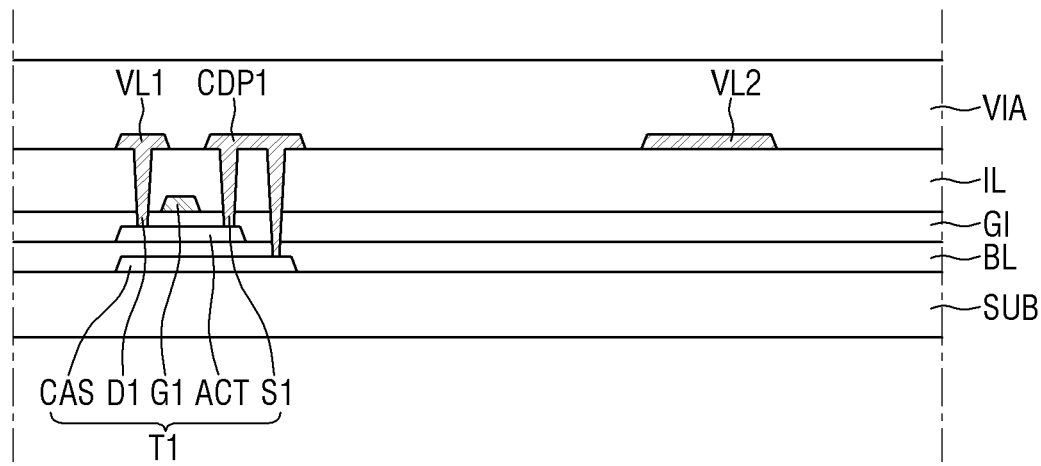
FIG. 12 to FIG. 20 are schematic diagrams showing a manufacturing process of a display device according to one embodiment.

Referring to FIG. 12, the method may prepare the substrate SUB, and form the first to third conductive layers, the active layer ACT, the buffer layer BL, the gate insulating layer GI, the interlayer insulating layer IL and the via layer VIA on the substrate SUB. The first to third conductive layers disposed on the substrate SUB may be formed by depositing a material constituting each of the layers, for example, a metal material and performing a patterning process using a photolithography method. Further, the buffer layer BL, the gate insulating layer GI, the interlayer insulating layer IL and the via layer VIA disposed on the substrate SUB may be formed by applying a material constituting each of the layers, for example, an insulating material, and optionally performing a patterning process based on needs.

Figure 13:
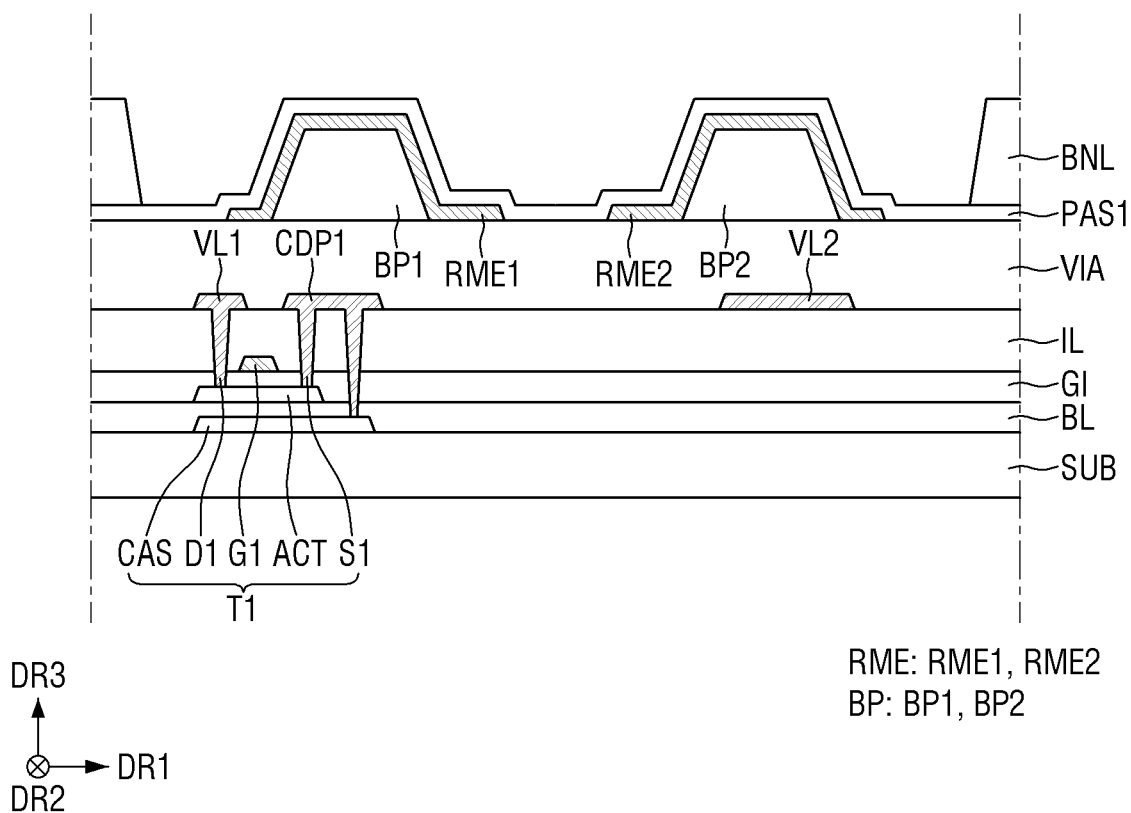

Referring to FIG. 13, the bank patterns BP1 and BP2 are formed on the via layer VIA, and a metal material is stacked on an entire face of the substrate SUB. The method may pattern the metal material such that the first electrode RME1 is formed on the first bank pattern BP1 and the second electrode RME2 is formed on the second bank pattern BP2. The first insulating layer PAS1 is formed by depositing an insulating material on the first electrode RME1 and the second electrode RME2. The bank BNL is formed on the first insulating layer PAS1 and is patterned.

Figure 14:
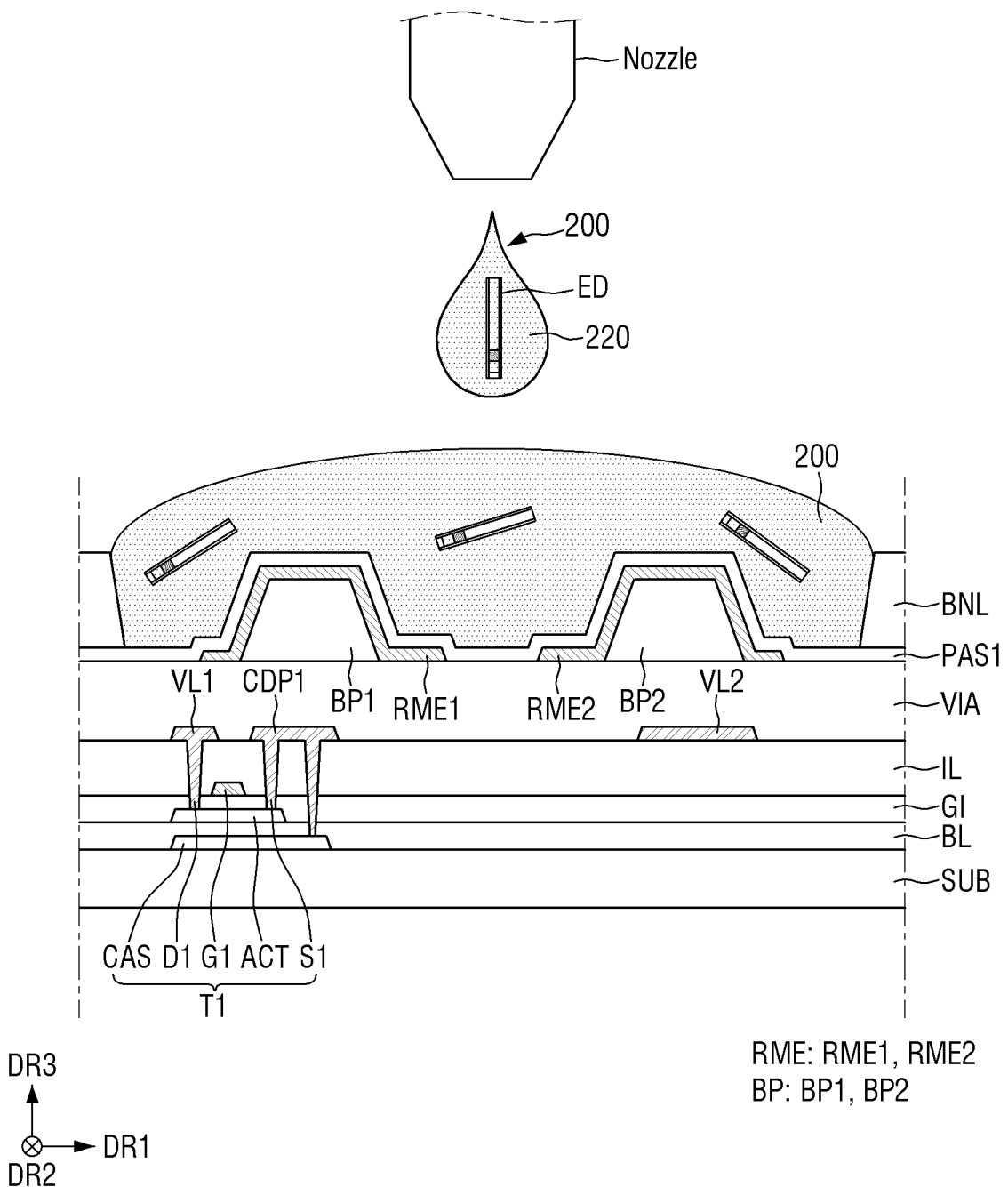

Referring to FIG. 14, ink 200 containing the light-emitting elements ED dispersed therein is sprayed on a portion of the first insulating layer PAS1 surrounded with the bank BNL. The ink 200 may contain a solvent 220 and the light-emitting elements ED dispersed in the solvent 220. The light-emitting elements ED may be uniformly dispersed in the solvent 220.

In one embodiment, the ink 200 may be sprayed onto the first insulating layer PAS1 via a printing process using an inkjet printing device. The ink 200 may be ejected through a nozzle of an inkjet head included in the inkjet printing device. The ink 200 discharged from the nozzle may be sprayed onto the first insulating layer PAS1 on which the first electrode RME1 and the second electrode RME2 are formed. The light-emitting element ED may have a shape extending in one direction or a direction. The ink 200 may be sprayed while the light-emitting elements ED are dispersed in the ink 200 in a state in which the light-emitting elements ED have random orientations. In case that the ink 200 is sprayed onto the first insulating layer PAS1, the ink 200 may be applied onto an area surrounded with the bank BNL while not overflowing the bank BNL.

Figure 15:
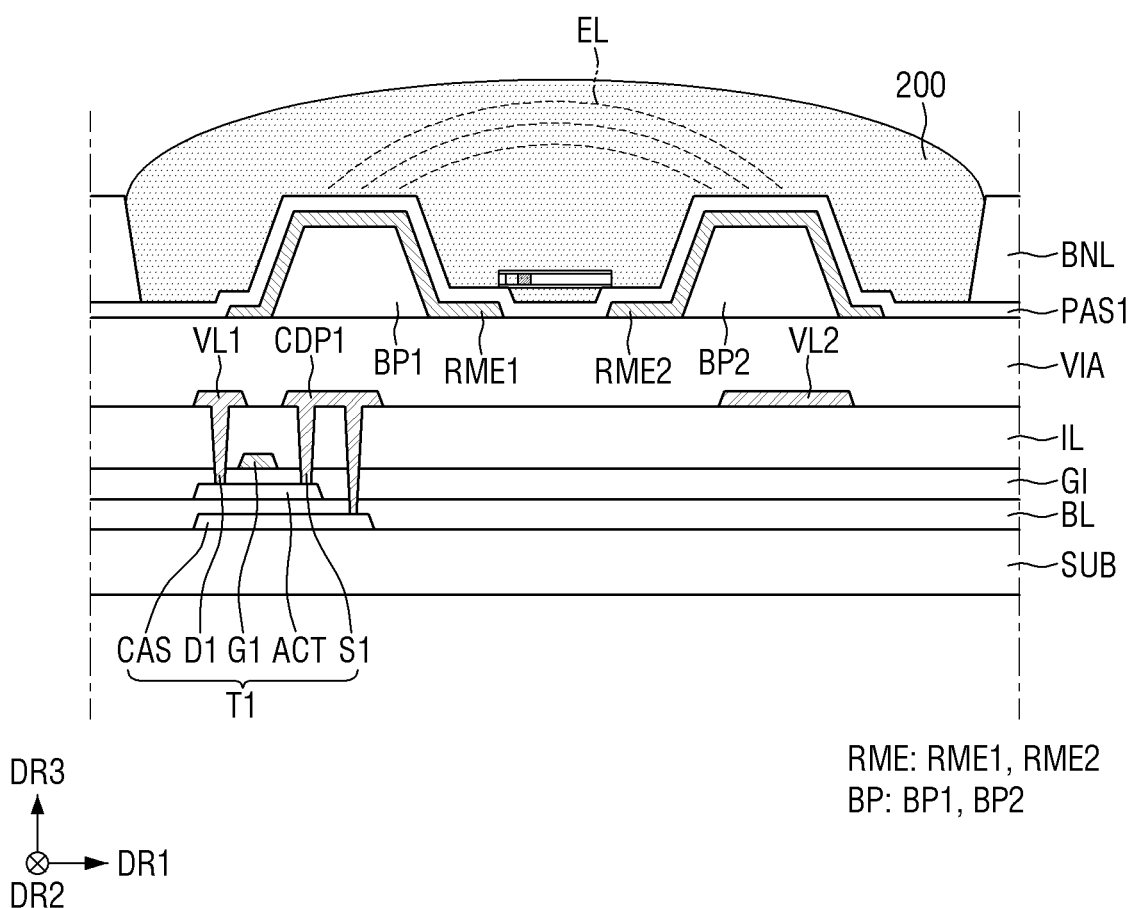

Referring to FIG. 15, the method may apply the alignment signal to the first electrode RME1 and the second electrode RME2 to generate an electric field EL to align the light-emitting elements ED with each other. The light-emitting elements ED dispersed in the solvent 220 may be subjected to the dielectrophoretic force resulting from the electric field EL, and thus the orientations and positions thereof may be changed while being disposed on the electrodes RME1 and RME2.

In case that the electric field EL is generated, the light-emitting elements ED may be subjected to the dielectrophoretic force. In case that the orientation of the electric field EL is parallel to the top face of the via layer VIA, the light-emitting elements ED may be disposed on the first electrode RME1 and the second electrode RME2 while the light-emitting elements ED may extend in the direction parallel to the top fac of the via layer VIA. The light-emitting elements ED may move from initial positions toward the electrodes RME1 and RME2 under or below the dielectrophoretic force. The position and the orientation direction of the light-emitting element ED may be changed under or below the electric field EL such that both opposing ends of the light-emitting element ED may be disposed on the first electrode RME1 and the second electrode RME2, respectively. The light-emitting element ED may include semiconductor layers doped with different conductive type dopants, and thus may have a dipole moment within the element. The light-emitting element ED having the dipole moment may be aligned under or below the dielectrophoretic force resulting from the electric field EL so that both opposing ends thereof are disposed on electrodes RME1 and RME2, respectively. The solvent 220 is removed via heat-treatment.

Figure 16:
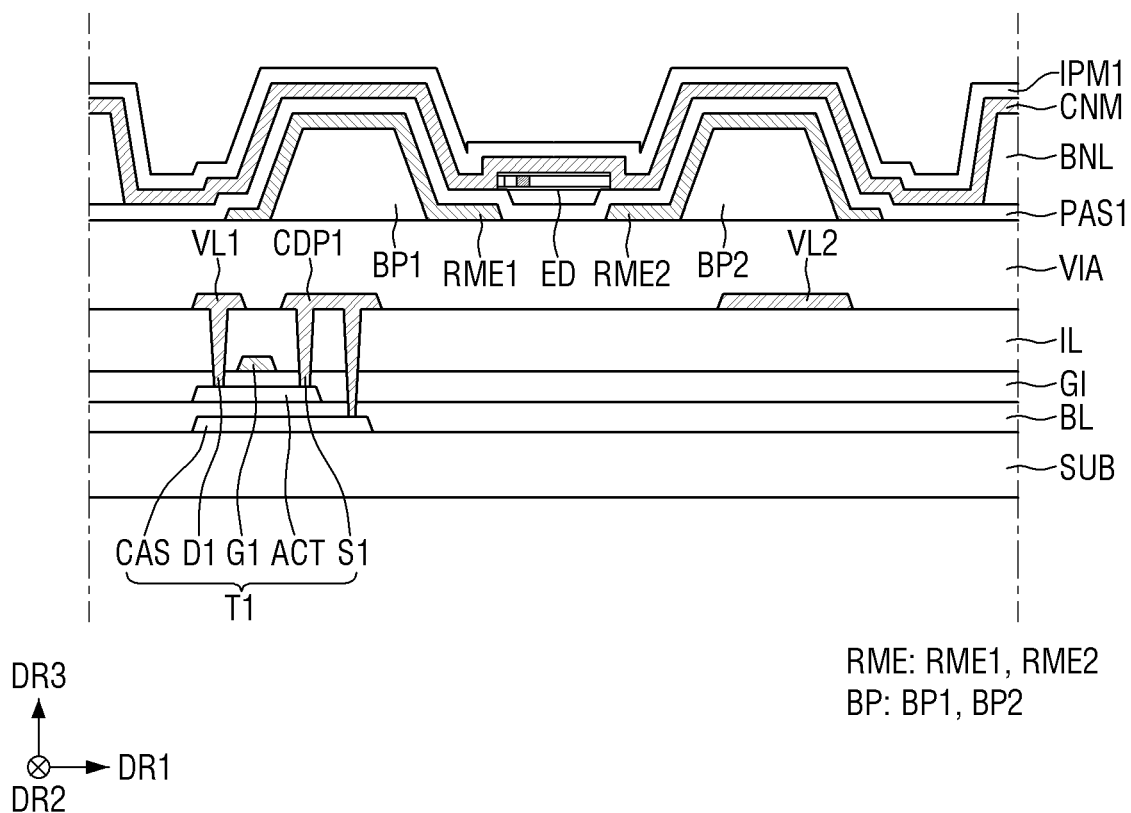

Referring to FIG. 16, a transparent conductive material layer CNM is formed by depositing a transparent conductive material on the substrate SUB on which the bank BNL, the light-emitting elements ED, and the first insulating layer PAS1 are formed. The transparent conductive material layer CNM may act as a material of each of the first connection electrode CNE1 and the second connection electrode CNE2. The transparent conductive material layer CNM may be deposited on the entire face of the substrate SUB. An inorganic insulating material is deposited on the transparent conductive material layer CNM to form a first insulating material layer IPM1. The first insulating material layer IPM1 may include the material of each of the first insulating pattern IPP1 and the second insulating pattern IPP2 as described above.

Figure 17:
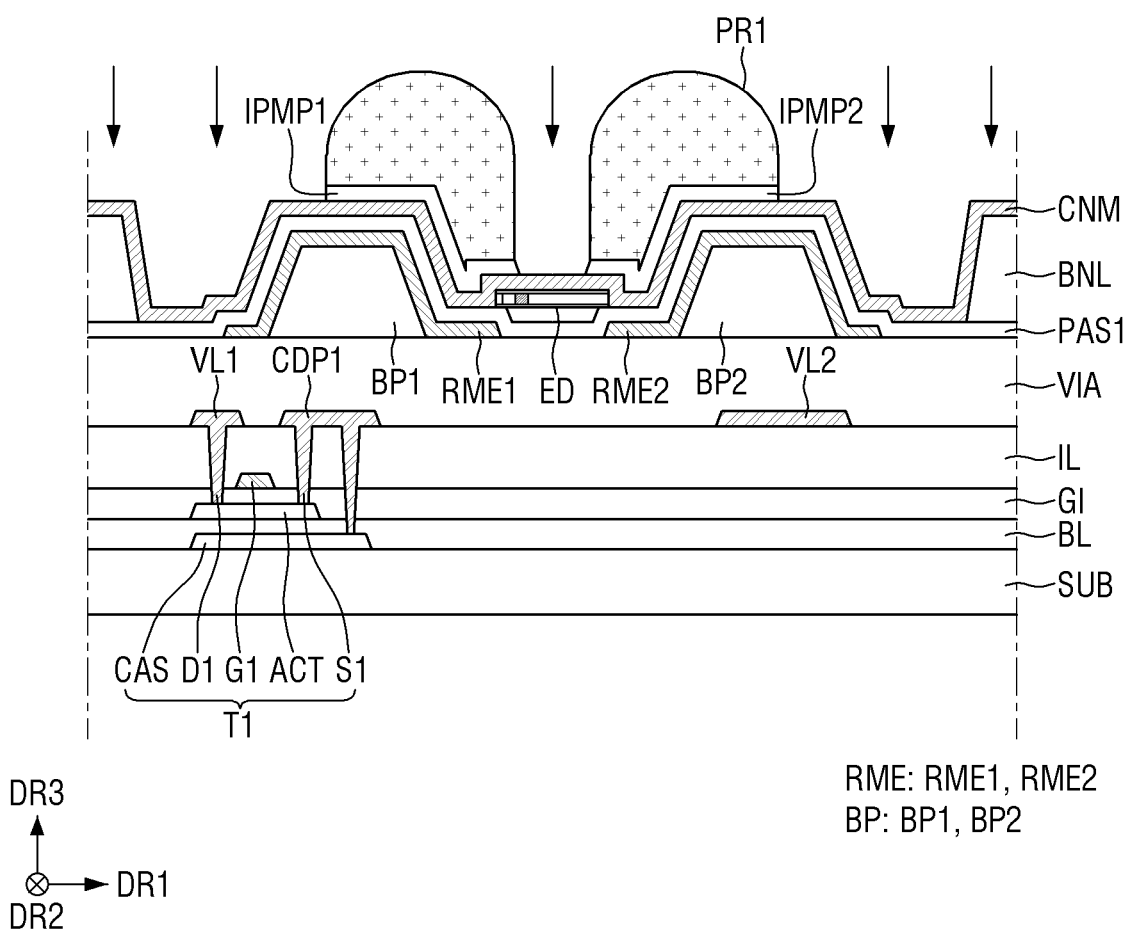

Referring to FIG. 17, a photoresist pattern PR1 is formed on the first insulating material layer IPM1. The photoresist pattern PR1 may be formed by coating a photoresist, exposing and developing the photoresist. Using the photoresist pattern PR1 as a mask, dry etching of the underlying first insulating material layer IPM1 is carried out to form a first insulating material pattern IPMP1 and a second insulating material pattern IPMP2. The first insulating material pattern IPMP1 may overlap the first electrode RME1 while the second insulating material pattern IPMP2 may overlap the second electrode RME2. Further, the first insulating material pattern IPMP1 and the second insulating material pattern IPMP2 may be spaced apart from each other in an area disposed on the light-emitting element ED.

Figure 18:
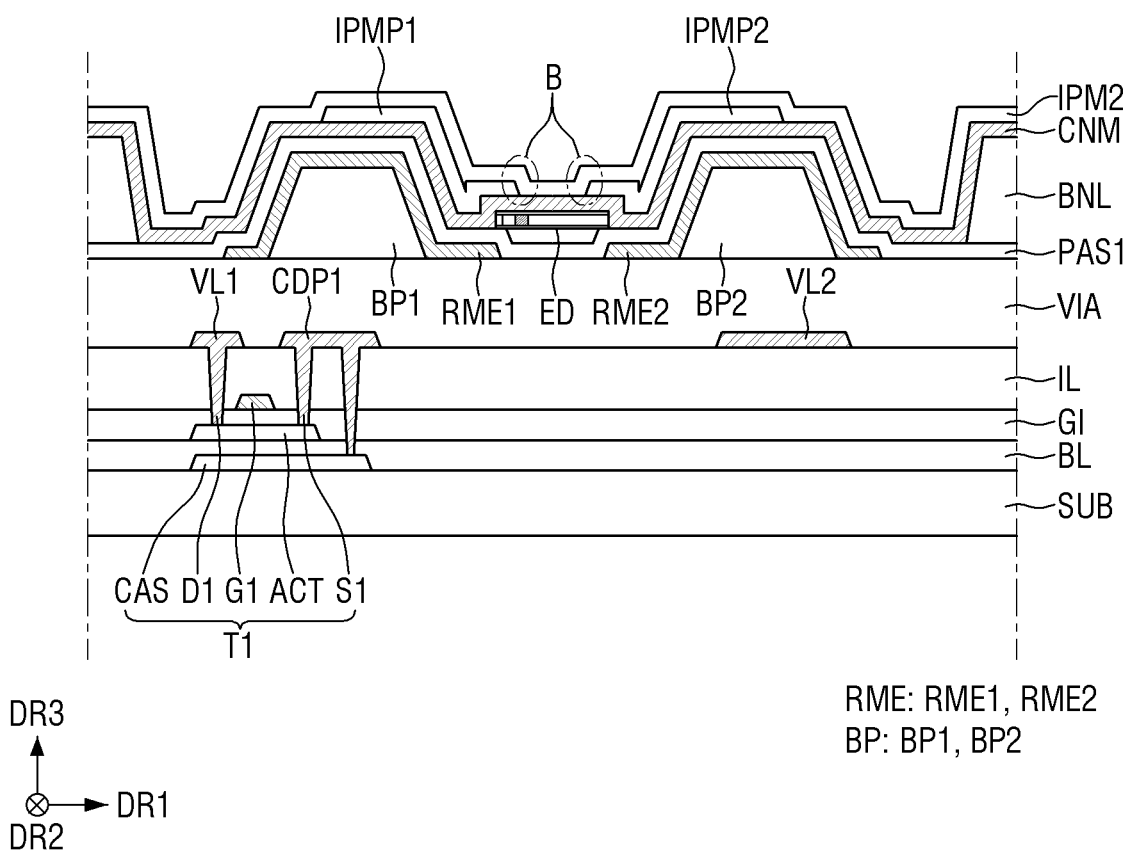

Referring to FIG. 18, a second insulating material layer IPM2 is formed by depositing an inorganic insulating material on the substrate SUB on which the first insulating material pattern IPMP1 and the second insulating material pattern IPMP2 are formed. The second insulating material layer IPM2 may be formed on or directly formed on the first insulating material pattern IPMP1, the second insulating material pattern IPMP2, and the transparent conductive material layer CNM. The second insulating material layer IPM2 may be made of a same material or a similar material as that of the first insulating material layer IPM1. Accordingly, the first insulating material pattern IPMP1 and the second insulating material pattern IPMP2 composed of the first insulating material layer IPM1 are not separated from the second insulating material layer IPM2 but may be integral therewith. In drawing, the separation is indicated to clearly indicate an individual process. However, the disclosure is not limited to the drawing.

Figure 19:
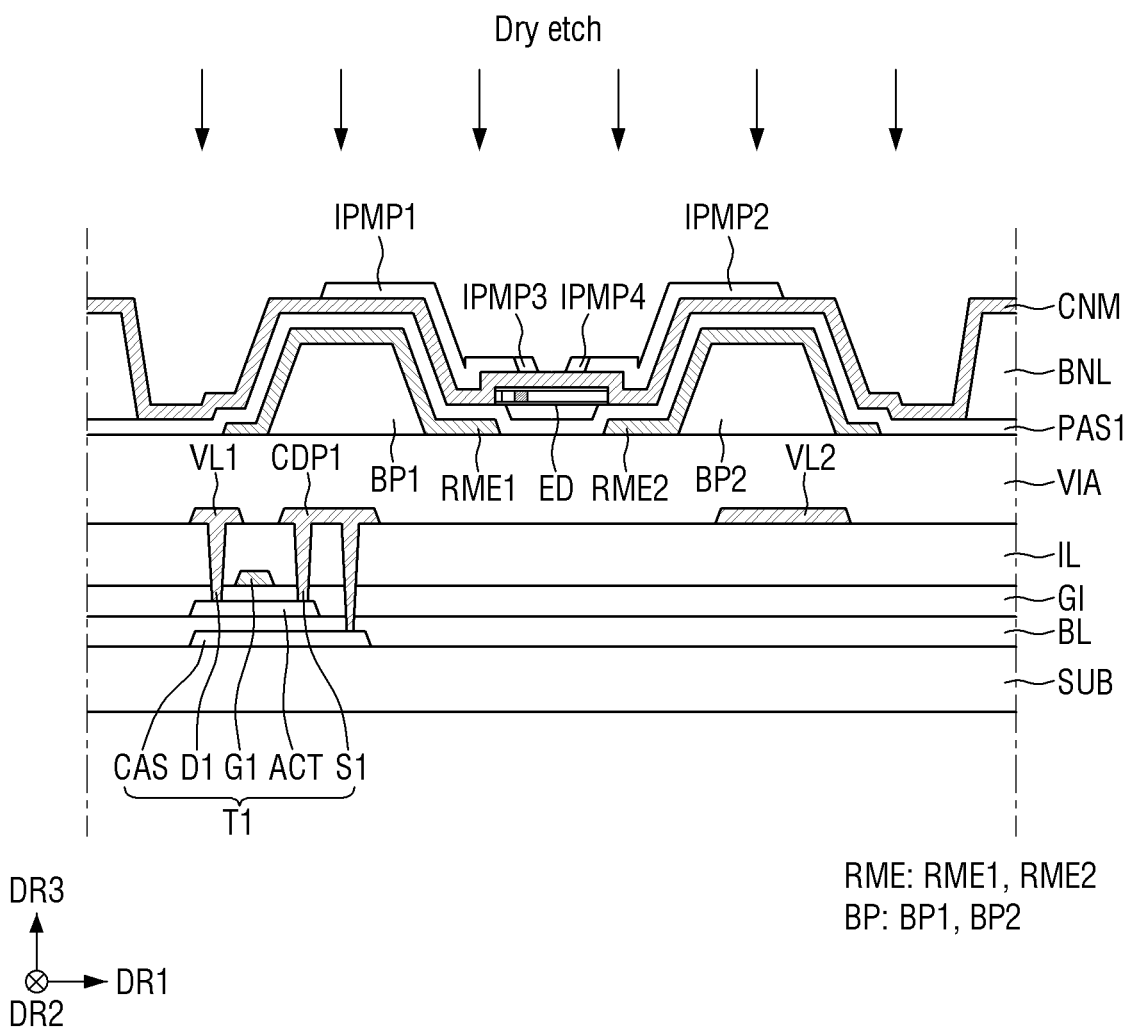

Referring to FIG. 19, dry etching of the second insulating material layer IPM2 is performed. An entire face of the second insulating material layer IPM2 is subjected to dry etching such that a predefined thickness remains. At this time, all of portions of the second insulating material layer IPM2 having the same thickness, for example, a portion of the second insulating material layer IPM2 disposed on a portion of the transparent conductive material layer CNM that does not overlap the light-emitting element ED, and a portion of the second insulating material layer IPM2 disposed on the first insulating material pattern IPMP1 and the second insulating material pattern IPMP2 are etched away and removed. On the contrary, a portion of the second insulating material layer IPM2 disposed on a portion of the transparent conductive material layer CNM overlapping the light-emitting element ED, for example, a portion of the second insulating material layer IPM2 disposed in an area B in FIG. 18 is thick. Thus, even after the dry etching, the portion remains and has a predefined thickness. This remaining portion of the second insulating material layer IPM2 may act as a third insulating material pattern IPMP3 and a fourth insulating material pattern IPMP4.

Figure 20:
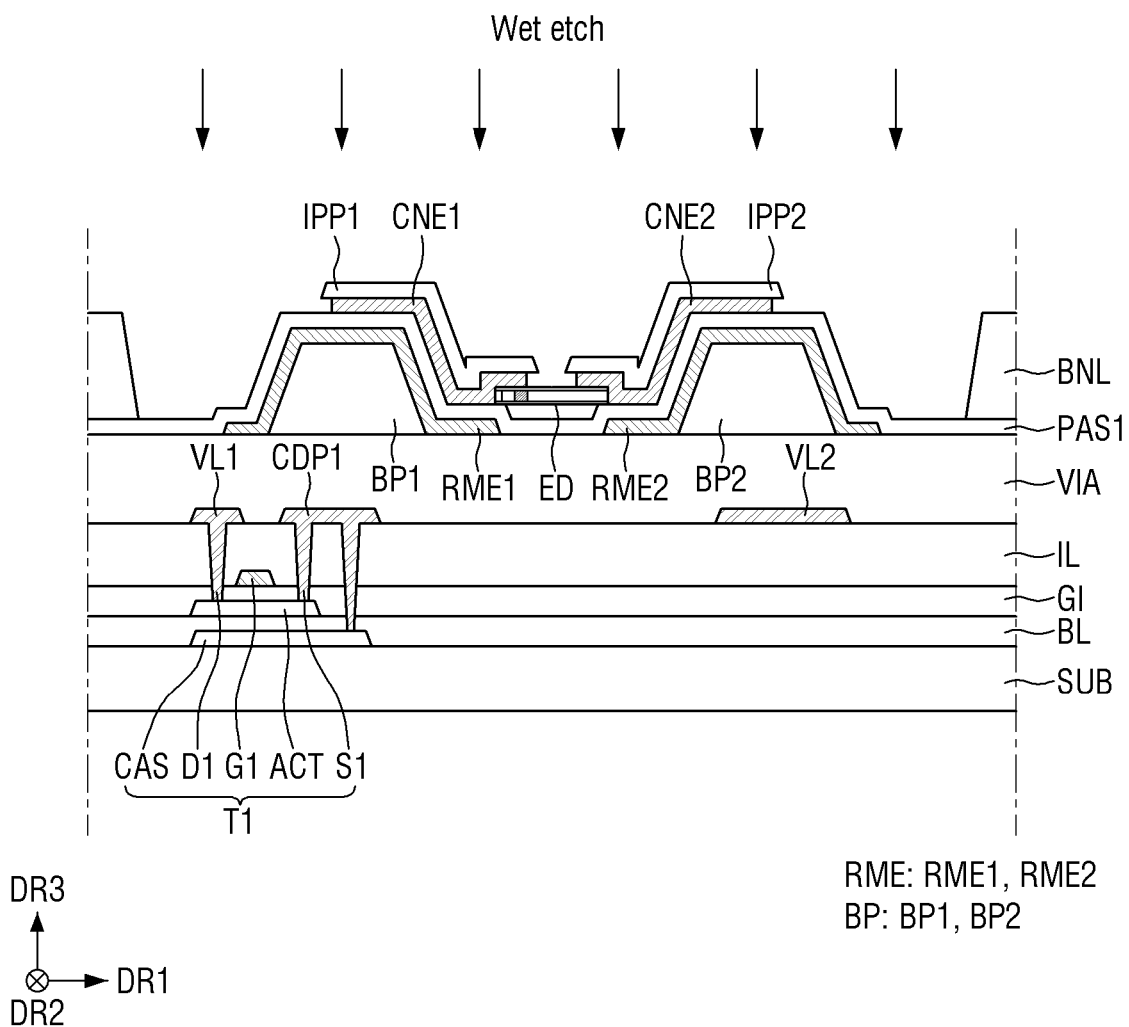

Reference to FIG. 20 is made. Since as described above, the first insulating material layer IPM1 and the second insulating material layer IPM2 may be made of a same material or a similar material, the first insulating material pattern IPMP1 and the third insulating material pattern IPMP3 are integral, and the second insulating material pattern IPMP2 and the fourth insulating material pattern IPMP4 are integral. Accordingly, the first insulating material pattern IPMP1 and the third insulating material pattern IPMP3 may form the first insulating pattern IPP1, while the second insulating material pattern IPMP2 and the fourth insulating material pattern IPMP4 may form the second insulating pattern IPP2.

The underlying transparent conductive material layer CNM is patterned via a wet etching process using each of the first insulating pattern IPP1 and the second insulating pattern IPP2 as a mask to form each of the first connection electrode CNE1 and the second connection electrode CNE2. Therefore, the display device 10 shown in FIG. 6 has been manufactured.

In the above-mentioned FIG. 19, there may be a predefined distance between the first insulating material pattern IPMP1 and the second insulating material pattern IPMP2. In case that the first connection electrode CNE1 and the second connection electrode CNE2 are formed by etching the transparent conductive material layer CNM using each of the first insulating material pattern IPMP1 and the second insulating material pattern IPMP2 as the mask, the first connection electrode CNE1 and the second connection electrode CNE2 are also spaced apart from each other by a predefined distance.

In this embodiment, as shown in FIG. 20, the third insulating material pattern IPMP3 and the fourth insulating material pattern IPMP4 are further formed. Each of the first connection electrode CNE1 and the second connection electrode CNE2 is formed using each of the first insulating pattern IPP1 and the second insulating pattern IPP2 as the mask. Thus, a distance between the first connection electrode CNE1 and the second connection electrode CNE2 may be further reduced, and the connection electrodes CNE may be formed in a single process. Accordingly, a contact failure between each of the connection electrodes CNE and each of the light-emitting elements ED due to misalignment during the patterning process of the connection electrodes CNE may be prevented. Further, a margin for the patterning process of the connection electrodes CNE may be secured and the process may be simplified.

Hereinafter, various embodiments of the display device 10 will be described with further reference to other drawings.

Figure 21:
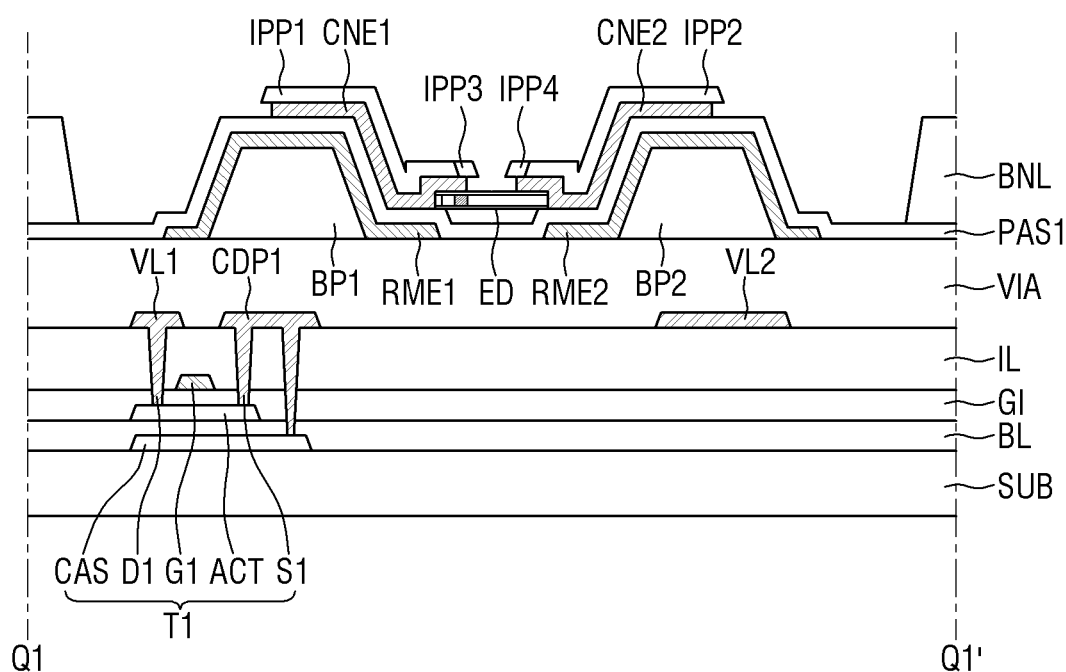
FIG. 21 is a schematic cross-sectional view showing one sub-pixel of a display device according to an embodiment.
Figure 22:
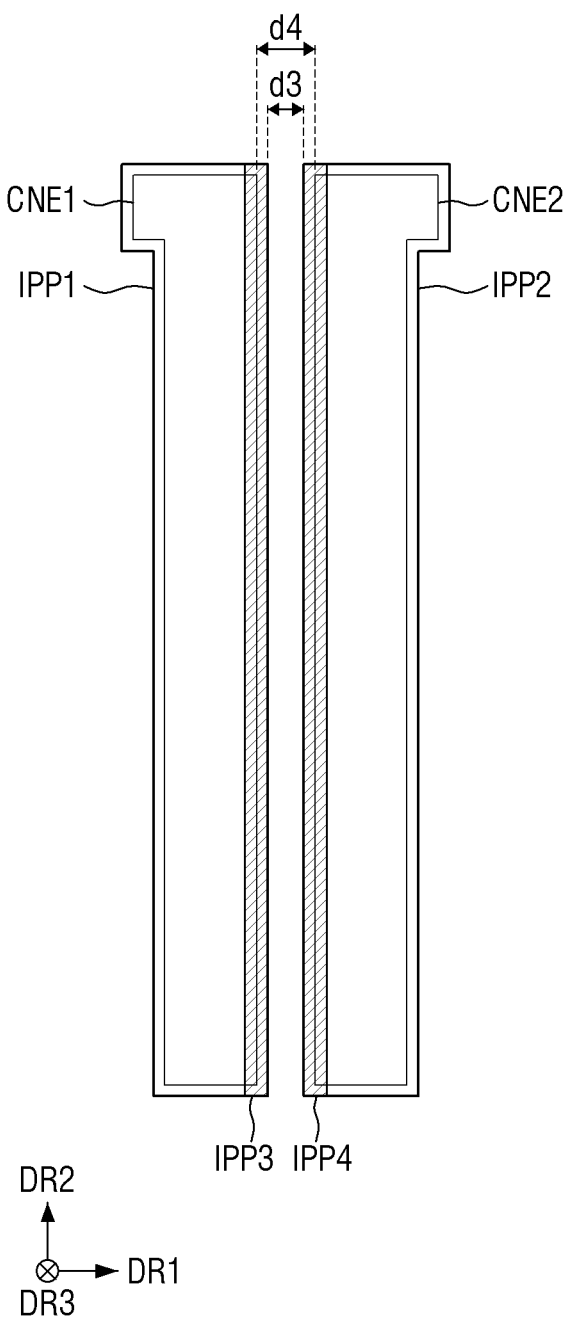
FIG. 22 is a schematic plan view showing connection electrodes and insulating patterns of a display device according to an embodiment.

FIG. 21 is a schematic cross-sectional view showing one sub-pixel of a display device according to an embodiment. FIG. 22 is a schematic plan view showing connection electrodes and insulating patterns of the display device according to an embodiment.

A display device 10 according to an embodiment of FIG. 21 and FIG. 22 may be different from that of an embodiment of FIG. 6 as described above in that the former further may include a third insulating pattern IPP3 and a fourth insulating pattern IPP4. Hereinafter, the description of the same configuration will be simplified or omitted, and the differences therebetween will be described in detail.

Referring to FIG. 21 and FIG. 22, the display device 10 may further include the third insulating pattern IPP3 and the fourth insulating pattern IPP4. The third insulating pattern IPP3 and the fourth insulating pattern IPP4 may be respectively disposed on the connection electrodes CNE. The third insulating pattern IPP3 and the fourth insulating pattern IPP4 may be disposed on or directly disposed on the connection electrodes CNE and contact the connection electrodes CNE, respectively, and may be spaced apart from other layers while not contacting the other layers.

The third insulating pattern IPP3 has a shape extending in the second direction DR2 and may be disposed on the first connection electrode CNE1. The third insulating pattern IPP3 may be in contact with the first connection electrode CNE1, may overlap the light-emitting element ED and the first connection electrode CNE1, and may not overlap the first bank pattern BP1 and the first electrode RME1. A portion of the third insulating pattern IPP3 may overlap the first connection electrode CNE1, while the other portion thereof may not overlap the first connection electrode CNE1. Further, one side or a side of the third insulating pattern IPP3 may contact a side of the first insulating pattern IPP1. A length in the second direction DR2 of the third insulating pattern IPP3 may be the same as a length in the second direction DR2 of the first insulating pattern IPP1.

The fourth insulating pattern IPP4 may have a shape extending in the second direction DR2 and be disposed on the second connection electrode CNE2. The fourth insulating pattern IPP4 may contact the second connection electrode CNE2, may overlap the light-emitting element ED and the second connection electrode CNE2, and may not overlap the second bank pattern BP2 and the second electrode RME2. A portion of the fourth insulating pattern IPP4 may overlap the second connection electrode CNE2 while the other portion thereof may not overlap the second connection electrode CNE2. Further, a side of the fourth insulating pattern IPP4 may contact a side of the second insulating pattern IPP2. A length in the second direction DR2 of the fourth insulating pattern IPP4 may be the same as a length in the second direction DR2 of the second insulating pattern IPP2.

A combination of the first insulating pattern IPP1 and the third insulating pattern IPP3 may serve as a mask for protecting the first connection electrode CNE1 and forming the first connection electrode CNE1. A combination of the second insulating pattern IPP2 and the fourth insulating pattern IPP4 may serve as a mask for protecting the second connection electrode CNE2 and forming the second connection electrode CNE2.

Referring to FIG. 22, the third insulating pattern IPP3 and the fourth insulating pattern IPP4 may be spaced apart from each other in the first direction DR1. In this connection, a third distance d3 between the third insulating pattern IPP3 and the fourth insulating pattern IPP4 may be smaller than a fourth distance d4 between the first connection electrode CNE1 and the second connection electrode CNE2.

Each of the third insulating pattern IPP3 and the fourth insulating pattern IPP4 may include an inorganic insulating material. Each of the third insulating pattern IPP3 and the fourth insulating pattern IPP4 may include the inorganic insulating material of each of the first insulating pattern IPP1 and the second insulating pattern IPP2 as described above, or may be made of a material different from that of the first insulating pattern IPP1 and the second insulating pattern IPP2.

Figure 23:
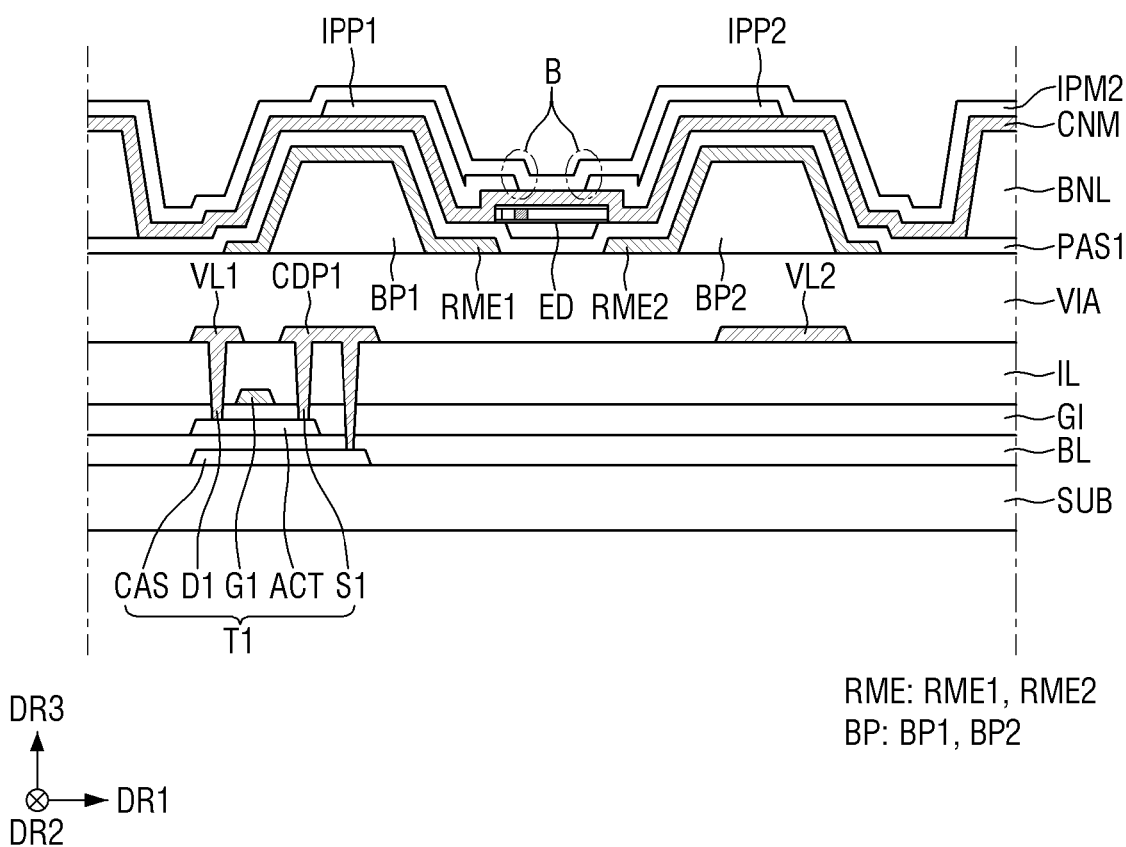
FIG. 23 to FIG. 25 are schematic diagrams showing a manufacturing process of a display device according to an embodiment.
Figure 24:
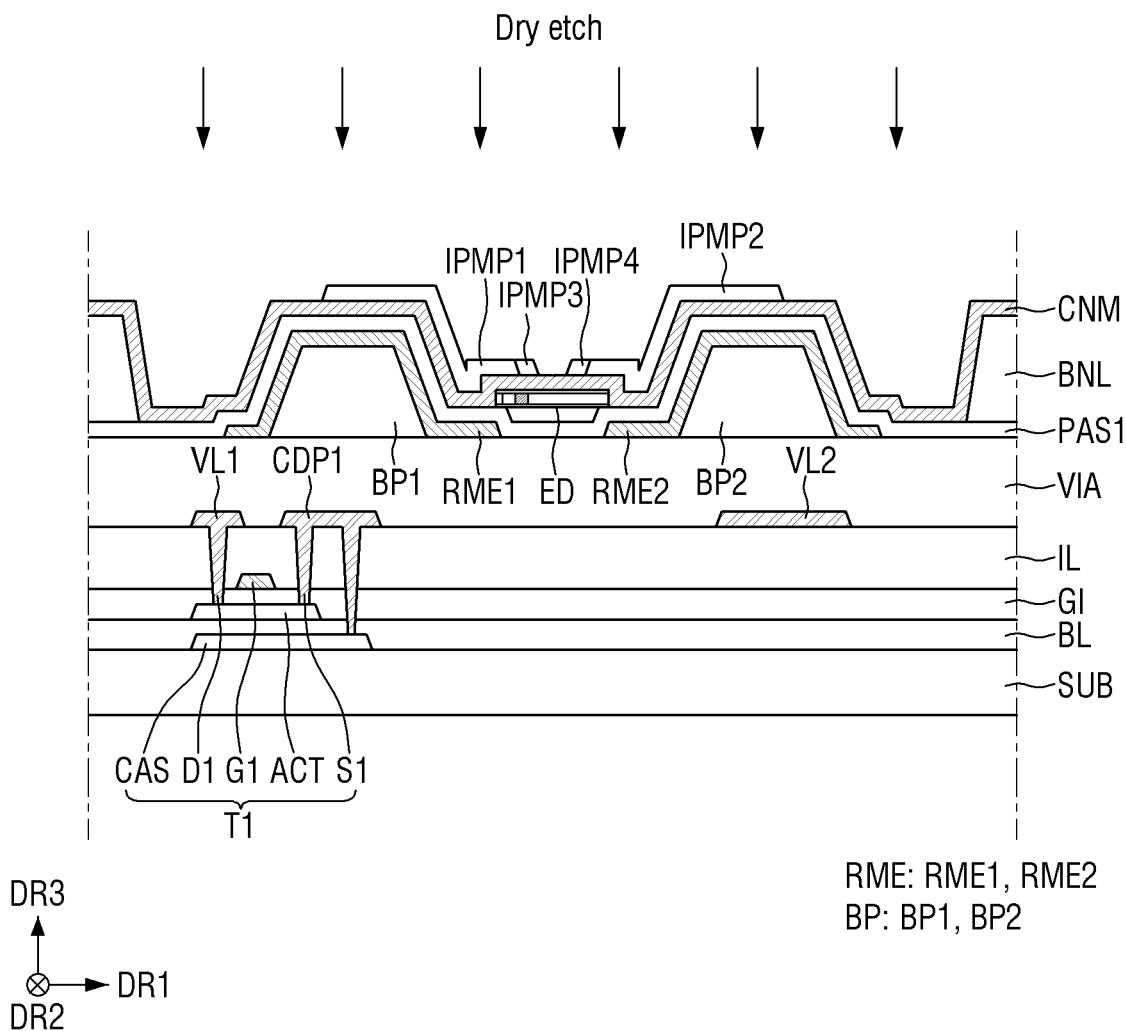
Figure 25:
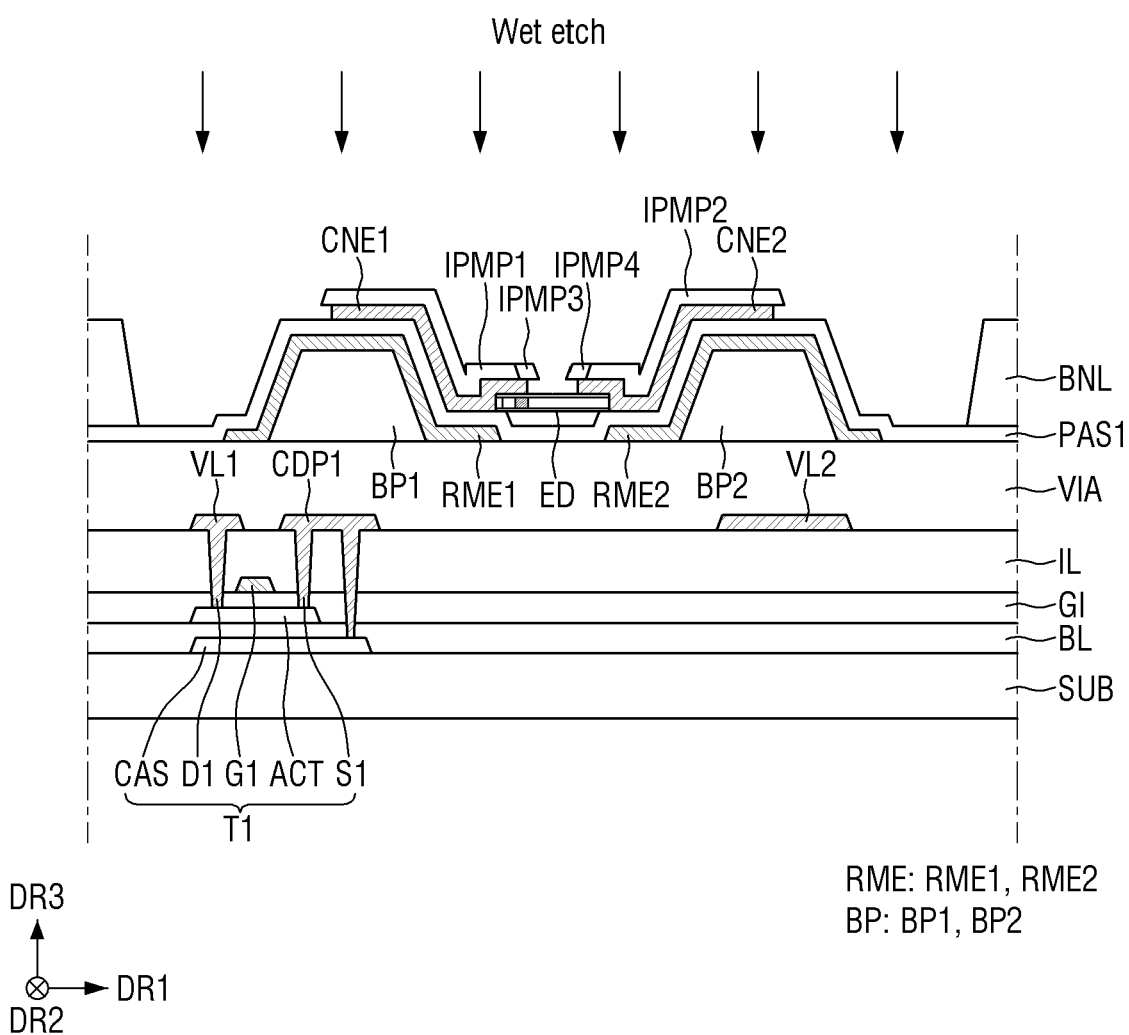

A manufacturing processes of the display device 10 according to an embodiment as described above has a following difference from the manufacturing process of FIG. 12 to FIG. 20. FIG. 23 to FIG. 25 are schematic diagrams showing the manufacturing process of the display device according to an embodiment. In following descriptions, descriptions of the same processes as those in FIG. 12 to FIG. 20 will be omitted.

Referring to FIG. 23, an inorganic insulating material is deposited on the substrate SUB on which the first insulating pattern IPP1 and the second insulating pattern IPP2 are formed, thereby forming the second insulating material layer IPM2. The second insulating material layer IPM2 may be made of a different material from that of the first insulating material layer IPM1. Accordingly, the first insulating pattern IPP1 and the second insulating pattern IPP2 composed of the first insulating material layer IPM1 may act as a separate layer from the second insulating material layer IPM2.

Referring to FIG. 24, dry etching of the second insulating material layer IPM2 is performed. An entire face of the second insulating material layer IPM2 is subjected to dry etching such that a predefined thickness thereof remains. At this time, all of portions of the second insulating material layer IPM2 having the same thickness, for example, a portion of the second insulating material layer IPM2 disposed on a portion of the transparent conductive material layer CNM that does not overlap the light-emitting element ED, and a portion of the second insulating material layer IPM2 disposed on the first insulating pattern IPP1 and the second insulating pattern IPP2 are etched and removed. On the contrary, a portion of the second insulating material layer IPM2 disposed on a portion of the transparent conductive material layer CNM overlapping the light-emitting element ED, for example, a portion of the second insulating material layer IPM2 disposed in the area B in FIG. 18 is thick. Thus, even after the dry etching. The portion remains and has a predefined thickness. This remaining portion of the second insulating material layer IPM2 may act as the third insulating material pattern IPMP3 and the fourth insulating material pattern IPMP4.

Referring to FIG. 25, the underlying transparent conductive material layer CNM is patterned by a wet etching process using the first insulating pattern IPP1, the second insulating pattern IPP2, the third insulating pattern IPP3, and the fourth insulating pattern IPP4 as a mask. In this connection, a combination of the first insulating pattern IPP1 and the third insulating pattern IPP3 may act as the mask for patterning the first connection electrode CNE1, while a combination of the second insulating pattern IPP2 and the fourth insulating pattern IPP4 may act as a mask for patterning the second connection electrode CNE2. Accordingly the first connection electrode CNE1 and the second connection electrode CNE2 are formed. In this way, the display device 10 shown in FIG. 21 has been manufactured.

Figure 26:
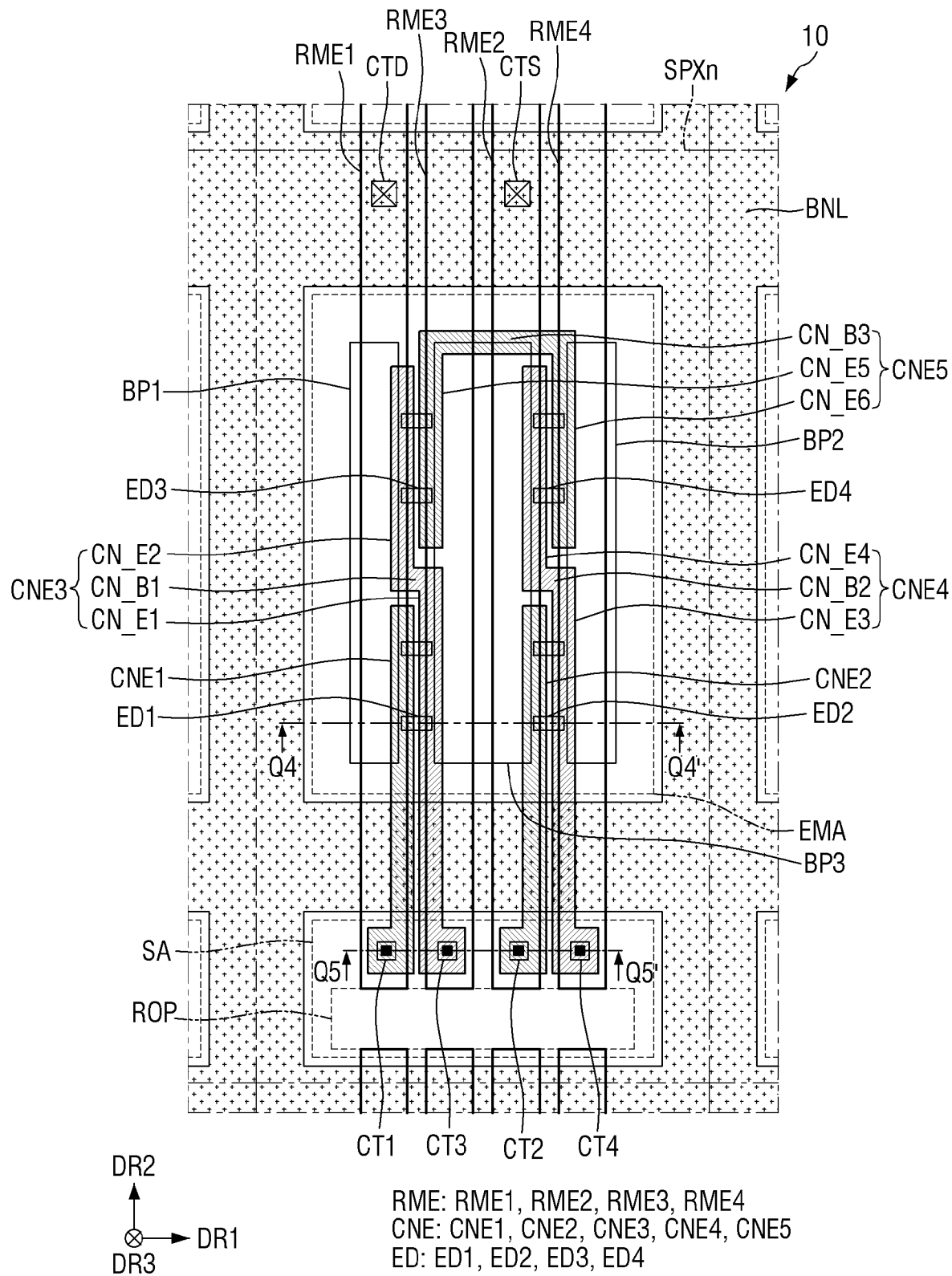
FIG. 26 is a schematic plan view showing one sub-pixel of a display device according to an embodiment.
Figure 27:
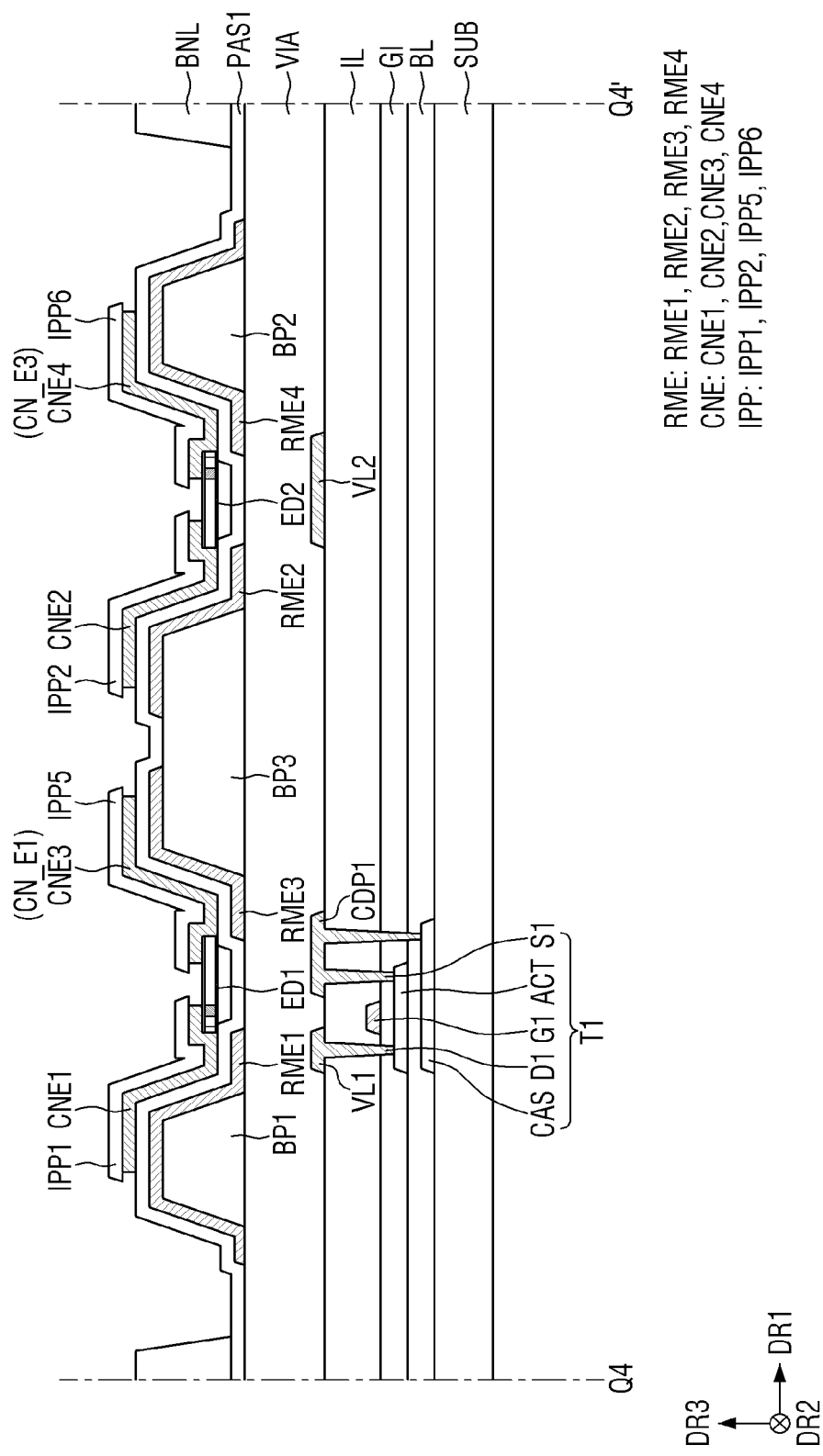
FIG. 27 is a schematic cross-sectional view taken along line Q4-Q4' in FIG. 26.
Figure 28:
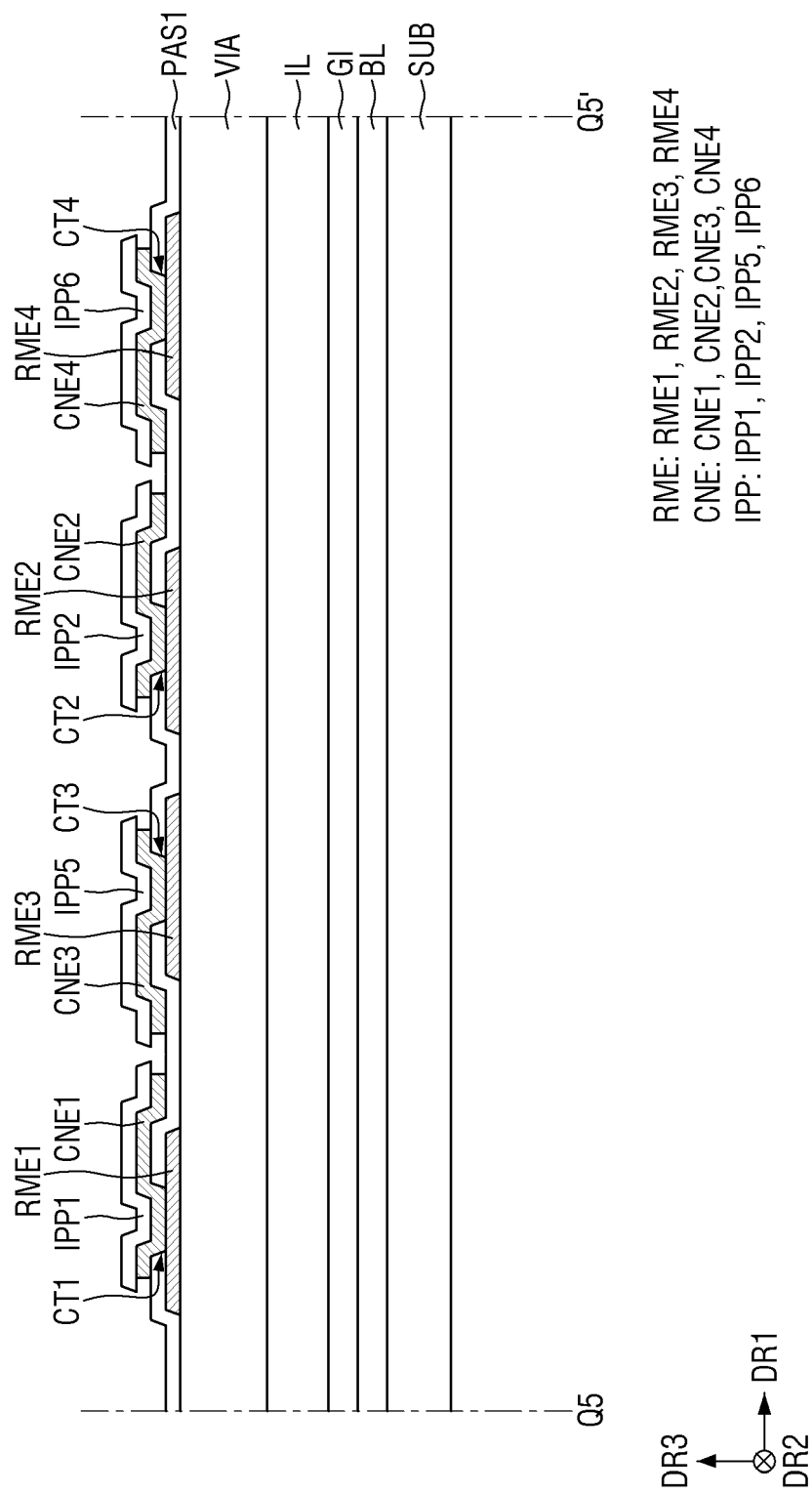
FIG. 28 is a schematic cross-sectional view taken along line Q5-Q5' in FIG. 26.
Figure 29:
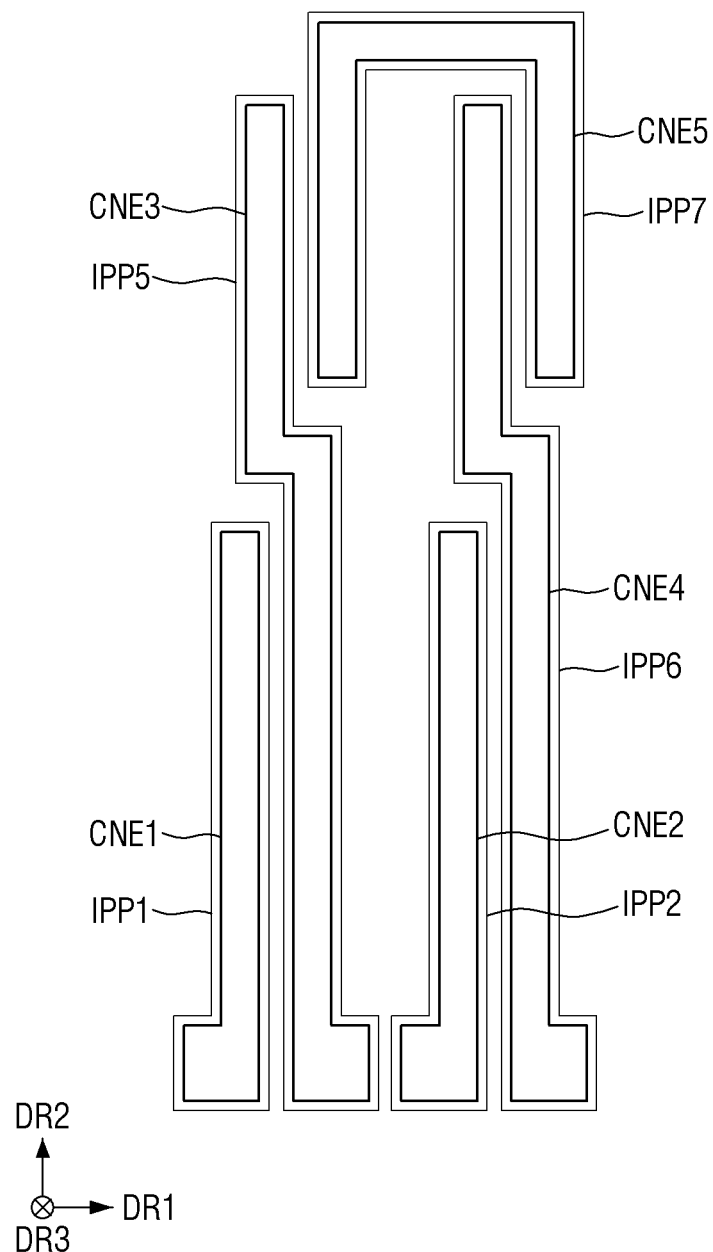
FIG. 29 is a schematic plan view showing connection electrodes and insulating patterns of a display device according to an embodiment.

FIG. 26 is a schematic plan view showing one sub-pixel of a display device according to an embodiment. FIG. 27 is a schematic cross-sectional view taken along line Q4-Q4' in FIG. 26. FIG. 28 is a schematic cross-sectional view taken along line Q5-Q5' in FIG. 26. FIG. 29 is a schematic plan view showing connection electrodes and insulating patterns of the display device according to an embodiment. FIG. 27 shows a cross-section of an area including a first light-emitting element ED1 and a second light-emitting element ED2 in FIG. 26. FIG. 28 shows a cross-section of an area including contacts CT1, CT2, CT3, and CT4 in FIG. 26.

Referring to FIG. 26 to FIG. 29, a display device 10 according to one embodiment may include a larger number of electrodes RME and a larger number of connection electrodes CNE. The number of the light-emitting elements Ed disposed in each sub-pixel SPXn may increase. This embodiment may be different from an embodiment of FIG. 5 to FIG. 10 and an embodiment of FIG. 21 and FIG. 22 in terms of an arrangement of the electrodes RME, the connection electrodes CNE, and the bank patterns BP in each sub-pixel SPXn and a configuration of the insulating pattern IPP. Hereinafter, duplicate content will be omitted and description will be focused on the differences.

Bank patterns BP1, BP2, and BP3 may further include a third bank pattern BP3 disposed between the first bank pattern BP1 and the second bank pattern BP2. The first bank pattern BP1 may be disposed on a left side around a center of the light-emitting area EMA, while the second bank pattern BP2 may be disposed on a right side around the center of the light-emitting area EMA. The third bank pattern BP3 may be disposed in a middle area of the light-emitting area EMA. The third bank pattern BP3 may have a larger width measured in the first direction DR1 than that of each of the first bank pattern BP1 and the second bank pattern BP2. A distance the first direction DR1 between adjacent ones of the bank patterns BP1, BP2, and BP3 may be greater than a distance between adjacent ones of corresponding electrodes RME. Accordingly, at least a portion of each electrode RME does not overlap each of the bank patterns BP1, BP2, and BP3.

The electrodes RME disposed in each sub-pixel SPXn may further include a third electrode RME3 and a fourth electrode RME4 in addition to the first electrode RME1 and the second electrode RME2.

The third electrode RME3 may be disposed between the first electrode RME1 and the second electrode RME2. The fourth electrode RME4 may be spaced apart from the third electrode RME3 in the first direction DR1 while the second electrode RME2 is interposed therebetween. The electrodes RME may be arranged or disposed such that the first electrode RME1, the third electrode RME3, the second electrode RME2, and the fourth electrode RME4 may be sequentially arranged or disposed in a direction from a left side to a right side of the sub-pixel SPXn.

Each electrode RME may extend from the light-emitting area EMA beyond the bank BNL into the sub-area SA. The first electrode RME1 and the second electrode RME2 among the electrodes RME may be respectively connected to the underlying third conductive layer via the electrode contact holes CTD and CTS. However, the third electrode RME3 and the fourth electrode RME4 may not be connected to or directly connected to the underlying third conductive layer, but may be electrically connected to the first electrode RME1 and the second electrode RME2 via the light-emitting elements ED and the connection electrodes CNE, respectively. The first electrode RME1 and the second electrode RME2 may act as first type electrodes connected to or directly connected to the third conductive layer via the electrode contact holes CTD and CTS, respectively, while the third electrode RME3 and the fourth electrode RME4 may act as second type electrodes different from the first type electrode. The second type electrodes together with the connection electrodes CNE may provide an electrical connection path for the light-emitting element ED.

The light-emitting elements ED may be disposed between adjacent ones of the bank patterns BP1, BP2, and BP3 or may be disposed on different electrodes RME. Some or a number of the light-emitting elements ED may be disposed between the first bank pattern BP1 and the third bank pattern BP3, and the other thereof may be disposed between the third bank pattern BP3 and the second bank pattern BP2. According to one embodiment, the light-emitting elements ED may include a first light-emitting element ED1 and a third light-emitting element ED3 disposed between the first bank pattern BP1 and the third bank pattern BP3, and a second light-emitting element ED2 and a fourth light-emitting element ED4 disposed between the third bank pattern BP3 and the second bank pattern BP2.

Each of the first light-emitting element ED1 and the third light-emitting element ED3 may be disposed on the first electrode RME1 and the third electrode RME3, while each of the second light-emitting element ED2 and the fourth light-emitting element ED4 may be disposed on the second electrode RME2 and the fourth electrode RME4. Each of the first light-emitting element ED1 and the second light-emitting element ED2 may be disposed adjacent to a lower end of the light-emitting area EMA of a corresponding sub-pixel SPXn or to the sub-area SA thereof, while each of the third light-emitting element ED3 and the fourth light-emitting element ED4 may be disposed adjacent to an upper end of the light-emitting area EMA of the corresponding sub-pixel SPXn. However, the light-emitting elements ED may be distinguished from each other not based on positions thereof in the light-emitting area EMA, but based on connection relationships thereof with the connection electrodes CNE, which will be described later. In one example, each connection electrode CNE connected to both opposing ends of each light-emitting element ED may be determined, based on an arrangement structure of the connection electrodes CNE. By way of example, the light-emitting elements ED may be distinguished from each other based on types of the connection electrodes CNE to which the light-emitting elements ED are connected, respectively.

A configuration of the first insulating layer PAS1 may be the same as that in the above-described embodiment. The first insulating layer PAS1 may be disposed across an entire area of the sub-pixel SPXn. As a larger number of electrodes RME are arranged or disposed in each sub-pixel SPXn, contacts CT1, CT2, CT3, and CT4 may be included in each sub-pixel SPXn. In one embodiment, the sub-area SA may contain a first contact CT1 disposed on the first electrode RME1, a second contact CT2 disposed on the second electrode RME2, a third contact CT3 disposed on the third electrode RME3, and a fourth contact CT4 disposed on the fourth electrode RME4. Each of the contacts CT1, CT2, CT3, and CT4 may extend through the first insulating layer PAS1 to expose a portion of a top face of each of the electrodes RME.

The connection electrodes CNE may include the first connection electrode CNE1 disposed on the first electrode RME1, the second connection electrode CNE2 disposed on the second electrode RME2, and may further include a third connection electrode CNE3, a fourth connection electrode CNE4, and a fifth connection electrode CNE5, wherein each of the third connection electrode CNE3, the fourth connection electrode CNE4, and the fifth connection electrode CNE5 may extend across the electrodes RME.

Unlike the above-described embodiments, each of the first connection electrode CNE1 and the second connection electrode CNE2 may have a relatively smaller length extending in the second direction DR2. The first connection electrode CNE1 and the second connection electrode CNE2 may be disposed in a lower area of the light-emitting area EMA. Each of the first connection electrode CNE1 and the second connection electrode CNE2 may be disposed in the sub-area SA and the light-emitting area EMA and the corresponding sub-pixel SPXn and may extend between the sub-area SA and the light-emitting area EMA. The first connection electrode CNE1 and the second connection electrode CNE2 may respectively contact the first electrode RME1 and the second electrode RME2 via the first contact CT1 and the second contact CT2 formed in the sub-area SA.

The third connection electrode CNE3 may include a first extension CN_E1 disposed on the third electrode RME3, a second extension CN_E2 disposed on the first electrode RME1, and a first connection portion CN_B1 connecting the first extension CN_E1 and the second extension CN_E2 to each other. The first extension CN_E1 may be spaced apart from and face toward the first connection electrode CNE1 in the first direction DR1. The second extension CN_E2 may be spaced apart from and face toward the first connection electrode CNE1 in the second direction DR2. The first extension CN_E1 may be disposed in a lower area of the light-emitting area EMA of the corresponding sub-pixel SPXn, while the second extension CN_E2 may be disposed in an upper area of the light-emitting area EMA. The first extension CN_E1 may extend across the light-emitting area EMA and the sub-area SA and may be connected to the third electrode RME3 via the third contact CT3 formed in the sub-area SA. The first connection portion CN_B1 may be disposed in a middle area of the light-emitting area EMA and may extend across the first electrode RME1 and the third electrode RME3. The third connection electrode CNE3 may have a general shape extending in the second direction DR2. By way of example, the third connection electrode CNE3 may have a shape which extends in the second direction DR2 and is bent into the first direction DR1, and is bent into the second direction DR2 and extends in the second direction DR2.

The fourth connection electrode CNE4 may include a third extension CN_E3 disposed on the fourth electrode RME4, a fourth extension CN_E4 disposed on the second electrode RME2, and a second connection portion CN_B2 connecting the third extension CN_E3 and the fourth extension CN_E4 to each other. The third extension CN_E3 may be spaced apart from and face toward the second connection electrode CNE2 in the first direction DR1, while the fourth extension CN_E4 may be spaced apart from and face toward the second connection electrode CNE2 in the second direction DR2. The third extension CN_E3 may be disposed in the lower area of the light-emitting area EMA of the corresponding sub-pixel SPXn, while the fourth extension CN_E4 may be disposed in the upper area of the light-emitting area EMA. The third extension CN_E3 may be disposed across the light-emitting area EMA and the sub-area SA and may be connected to the fourth electrode RME4 via the fourth contact CT4. The second connection portion CN_B2 may be disposed in the middle area of the light-emitting area EMA and extend across the second electrode RME2 and the fourth electrode RME4. The fourth connection electrode CNE4 may have a general shape extending in the second direction DR2. By way of example, the fourth connection electrode CNE4 may have a shape which extends in the second direction DR2 and is bent into the first direction DR1, and is bent into the second direction DR2 and extends in the second direction DR2.

The fifth connection electrode CNE5 may include a fifth extension CN_E5 disposed on the third electrode RME3, a sixth extension CN_E6 disposed on the fourth electrode RME4, and a third connection portion CN_B3 connecting the fifth extension CN_E5 and the sixth extension CN_E6 to each other. The fifth extension CN_E5 may be spaced apart from and face toward the second extension CN_E2 of the third connection electrode CNE3 in the first direction DR1, while the sixth extension CN_E6 may be spaced apart from and face toward the fourth extension CN_E4 of the fourth connection electrode CNE4 in the first direction DR1. The fifth extension CN_E5 and the sixth extension CN_E6 may be disposed in the upper area of the light-emitting area EMA. The third connection portion CN_B3 may extend across the third electrode RME3, the second electrode RME2, and the fourth electrode RME4. The fifth connection electrode CNE5 may have a shape surrounding the fourth extension CN_E4 of the fourth connection electrode CNE4 in a plan view.

The first connection electrode CNE1 and the second connection electrode CNE2 may act as first type connection electrodes respectively connected to the first electrode RME1 and the second electrode RME2 connected to or directly connected to the third conductive layer. The third connection electrode CNE3 and the fourth connection electrode CNE4 may act as second type connection electrodes respectively connected to the third electrode RME3 and the fourth electrode RME4 that are not connected to or directly connected to the third conductive layer. The fifth connection electrode CNE5 may act as a third type connection electrode that is not connected to the electrodes RME.

As described above, the light-emitting elements ED may be distinguished from each other, based on each of the connection electrodes CNE which both opposing ends of each of the light-emitting elements ED contact, based on the arrangement structure of the connection electrodes CNE.

Each of the first light-emitting element ED1 and the second light-emitting element ED2 may have a first end contacting the first type connection electrode, and a second end opposite to the first end and contacting the second type connection electrode. The first light-emitting element ED1 may contact the first connection electrode CNE1 and the third connection electrode CNE3, while the second light-emitting element ED2 may contact the second connection electrode CNE2 and the fourth connection electrode CNE4. Each of the third light-emitting element ED3 and the fourth light-emitting element ED4 may have a first end in contact with the second type connection electrode and a second end opposite to the first end and in contact with the third type connection electrode. The third light-emitting element ED3 may contact the third connection electrode CNE3 and the fifth connection electrode CNE5, while the fourth light-emitting element ED4 may contact the fourth connection electrode CNE4 and the fifth connection electrode CNE5.

The light-emitting elements ED may be connected to each other in series via the connection electrodes CNE. The display device 10 according to this embodiment may include a larger number of light-emitting elements ED in each sub-pixel SPXn in which the light-emitting elements ED are connected to each other in series, so that an amount of light emission per unit area may be further increased.

In one embodiment, the display device 10 according to this embodiment may further include insulating patterns IPP. The insulating patterns IPP may be respectively disposed on the connection electrodes CNE. The insulating patterns IPP may be disposed on or disposed directly on the connection electrodes CNE and contact the connection electrodes CNE, respectively, and may be spaced apart from other layers while not contacting the other layers. The insulating patterns IPP; IPP1, IPP2, IPP5, IPP6, and IPP7 may include a first insulating pattern IPP1, a second insulating pattern IPP2, a fifth insulating pattern IPP5, a sixth insulating pattern IPP6, and a seventh insulating pattern IPP7.

The first insulating pattern IPP1 may have a shape extending in the second direction DR2 and be disposed on the first connection electrode CNE1. The first insulating pattern IPP1 may contact the first connection electrode CNE1 and overlap the first bank pattern BP1, the first electrode RME1, the first light-emitting element ED1, and the first connection electrode CNE1. Further, the first insulating pattern IPP1 may be spaced apart from each of the first light-emitting element ED1 and the first insulating layer PAS1 disposed under or below the first insulating pattern IPP1 in the third direction DR3.

The second insulating pattern IPP2 may have a shape extending in the second direction DR2 and be disposed on the second connection electrode CNE2. The second insulating pattern IPP2 may contact the second connection electrode CNE2 and overlap the third bank pattern BP3, the second electrode RME2, the second light-emitting element ED2, and the second connection electrode CNE2. Further, the second insulating pattern IPP2 may be spaced apart from each of the second light-emitting element ED2 and the first insulating layer PAS1 disposed under or below the second insulating pattern IPP2 in the third direction DR3.

The fifth insulating pattern IPP5 may have a shape extending in a corresponding manner to the third connection electrode CNE3 and be disposed on the third connection electrode CNE3. The fifth insulating pattern IPP5 may contact the third connection electrode CNE3 and overlap the third bank pattern BP3, the third electrode RME3, the first light-emitting element ED1, the third light-emitting element ED3, and the third connection electrode CNE3. Further, the fifth insulating pattern IPP5 may be spaced apart from each of the first light-emitting element ED1, the third light-emitting element ED3, and the first insulating layer PAS1 disposed under or below the fifth insulating pattern IPP5 in the third direction DR3.

The sixth insulating pattern IPP6 may have a shape extending in a corresponding manner to the fourth connection electrode CNE4 and be disposed on the fourth connection electrode CNE4. The sixth insulating pattern IPP6 may contact the fourth connection electrode CNE4 and overlap the second bank pattern BP2, the fourth electrode RME4, the second light-emitting element ED2, the fourth light-emitting element ED4, and the fourth connection electrode CNE4. Further, the sixth insulating pattern IPP6 may be spaced apart from each of the second light-emitting element ED2, the fourth light-emitting element ED4, and the first insulating layer PAS1 disposed below the sixth insulating pattern IPP6 in third direction DR3.

The seventh insulating pattern IPP7 may have a shape extending in a corresponding manner to the fifth connection electrode CNE5 and be disposed on the fifth connection electrode CNE5. The seventh insulating pattern IPP7 may be in contact with the fifth connection electrode CNE5 and overlap the second bank pattern BP2, the third bank pattern BP3, the fifth electrode RME5, the third light-emitting element ED3, the fourth light-emitting element ED4, and the fifth connection electrode CNE5. Further, the seventh insulating pattern IPP7 may be spaced apart from each of the third light-emitting element ED3, the fourth light-emitting element ED4, and the first insulating layer PAS1 disposed under or below the seventh insulating pattern IPP7 in the third direction DR3.

Each of the first insulating pattern IPP1, the second insulating pattern IPP2, the fifth insulating pattern IPP5, the sixth insulating pattern IPP6, and the seventh insulating pattern IPP7 may serve as each mask to protect and form each of the first connection electrode CNE1, the second connection electrode CNE2, the third connection electrode CNE3, the fourth connection electrode CNE4, and the fifth connection electrode CNE5.

Referring to FIG. 29, the first insulating pattern IPP1 and the fifth insulating pattern IPP5 may be spaced apart from each other in each of the first direction DR1 and the second direction DR2. In this connection, a distance between the first insulating pattern IPP1 and the fifth insulating pattern IPP5 may be smaller than a distance between the first connection electrode CNE1 and the third connection electrode CNE3. Further, the fifth insulating pattern IPP5 and the seventh insulating pattern IPP7 may be spaced apart from each other in each of the first direction DR1 and the second direction DR2. In this connection, a distance between the fifth insulating pattern IPP5 and the seventh insulating pattern IPP7 may be smaller than a distance between the third connection electrode CNE3 and the fifth connection electrode CNE5. Further, the second insulating pattern IPP2 and the sixth insulating pattern IPP6 may be spaced apart from each other in each of the first direction DR1 and the second direction DR2. In this connection, a distance between the second insulating pattern IPP2 and the sixth insulating pattern IPP6 may be smaller than a distance between the second connection electrode CNE2 and the fourth connection electrode CNE4. Further, the sixth insulating pattern IPP6 and the seventh insulating pattern IPP7 may be spaced apart from each other in each of the first direction DR1 and the second direction DR2. In this connection, a distance between the sixth insulating pattern IPP6 and the seventh insulating pattern IPP7 may be smaller than a distance between the fourth connection electrode CNE4 and the fifth connection electrode CNE5.

A planar area of the first insulating pattern IPP1 may be larger than a planar area of the first connection electrode CNE1. A planar area of the second insulating pattern IPP2 may be larger than a planar area of the second connection electrode CNE2. Further, a planar area of the fifth insulating pattern IPP5 may be larger than a planar area of the third connection electrode CNE3. A planar area of the sixth insulating pattern IPP6 may be larger than a planar area of the fourth connection electrode CNE4. Further, a planar area of the seventh insulating pattern IPP7 may be larger than a planar area of the fifth connection electrode CNE5.

Figure 30:
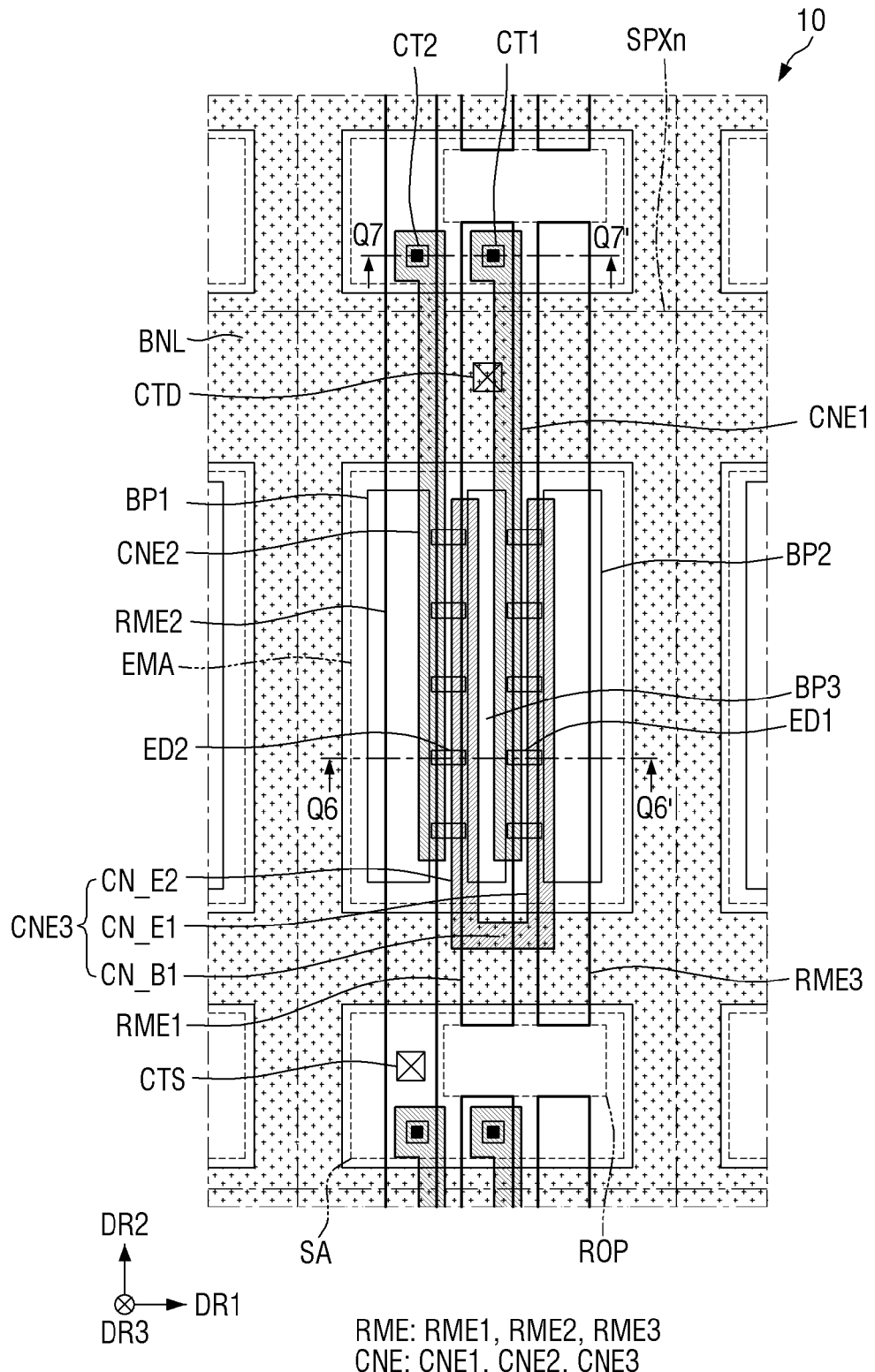
FIG. 30 is a schematic plan view showing one pixel of a display device according to an embodiment.
Figure 31:
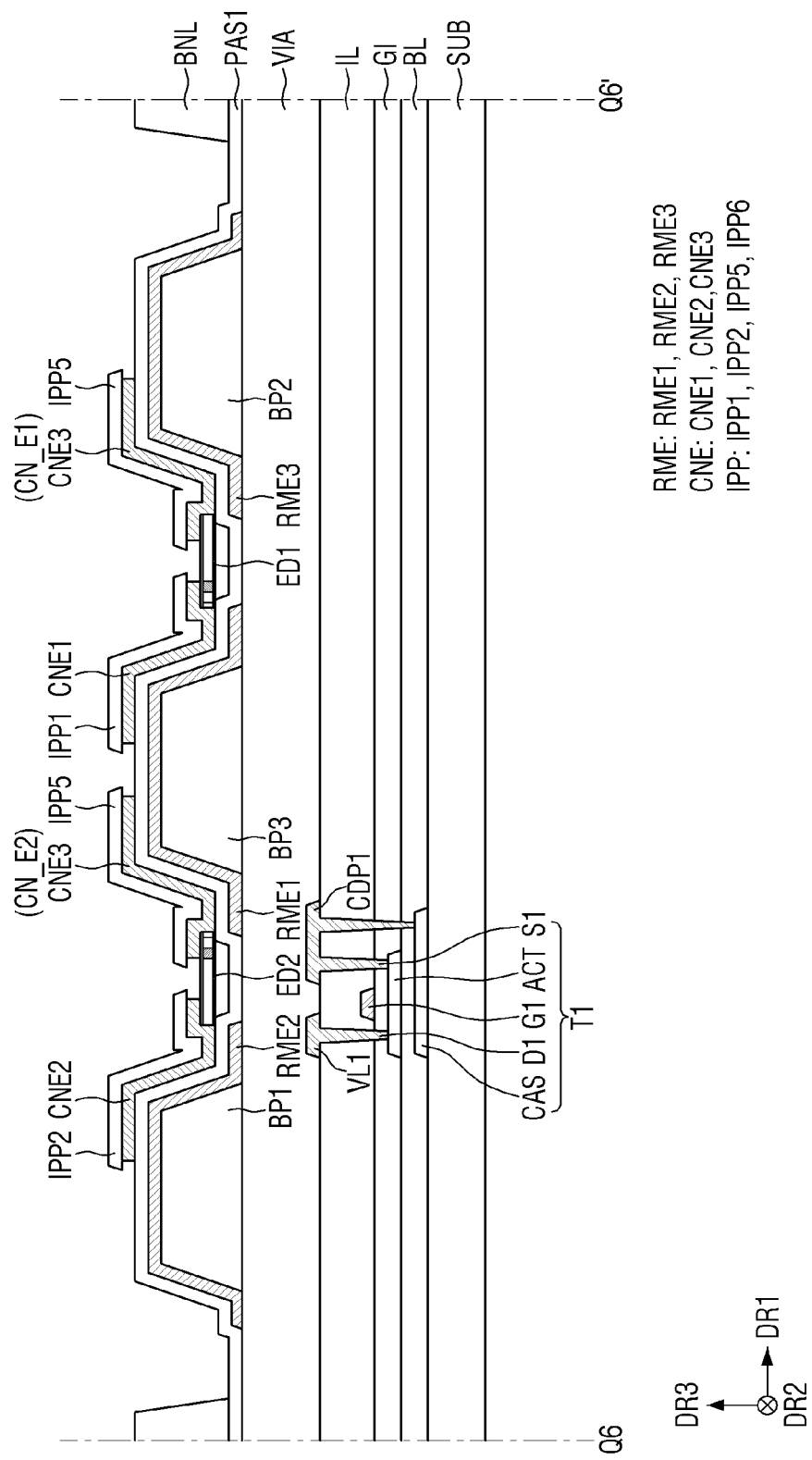
FIG. 31 is a schematic cross-sectional view taken along line Q6-Q6' in FIG. 30.
Figure 32:
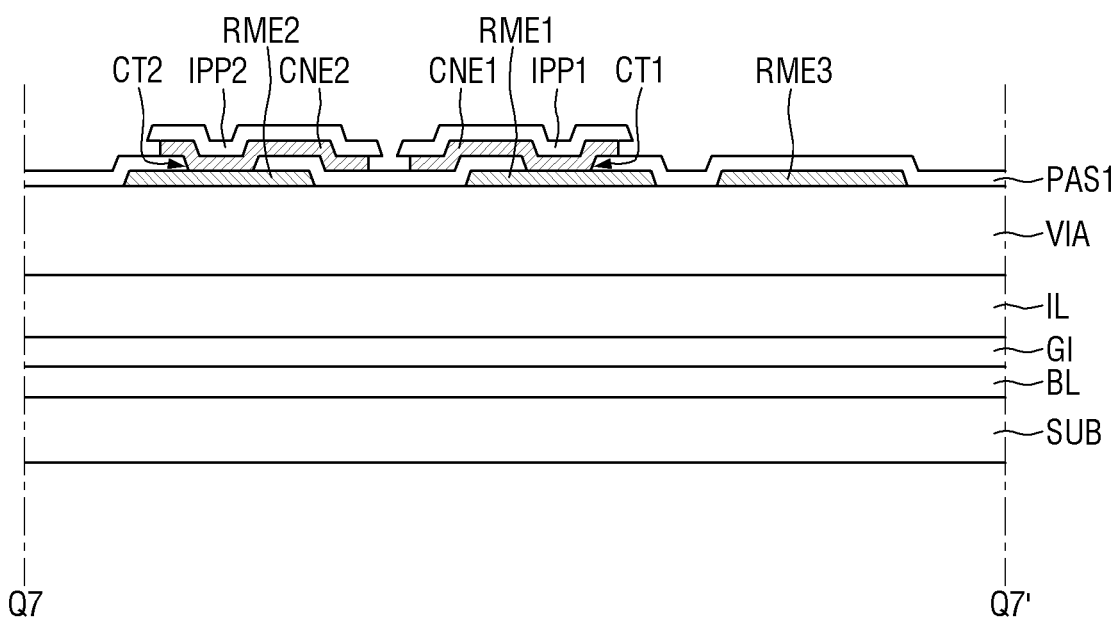
FIG. 32 is a schematic cross-sectional view taken along line Q7-Q7' in FIG. 30.
Figure 33:
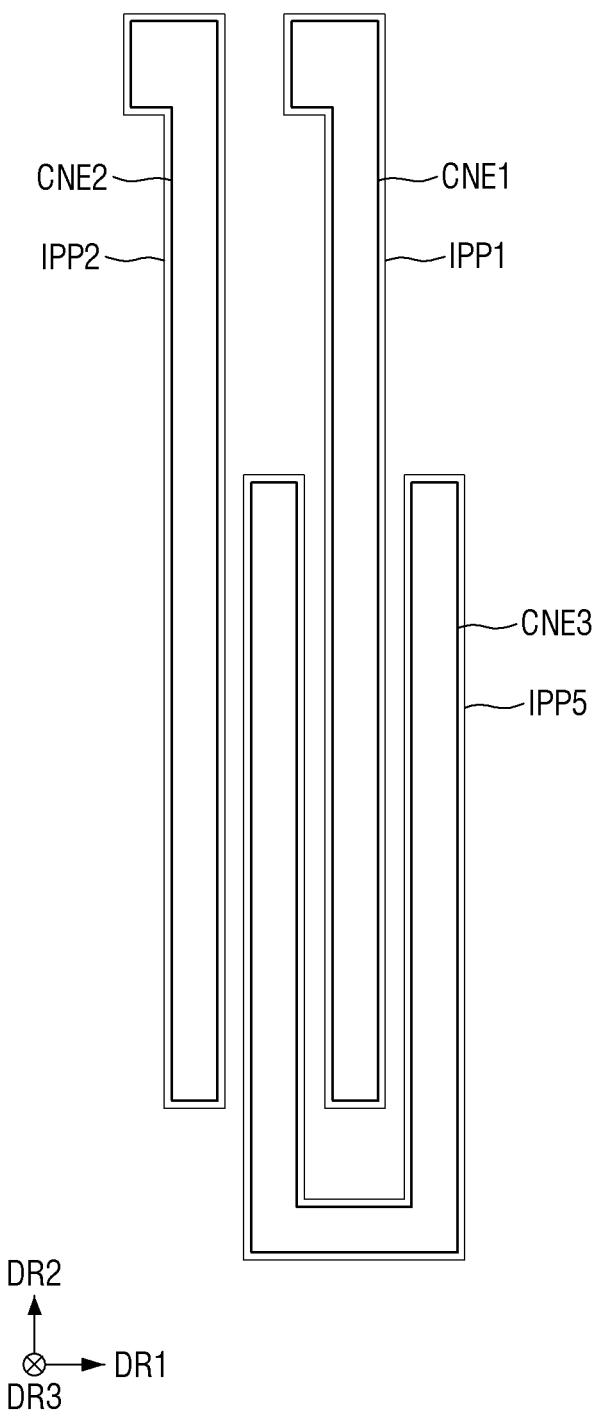
FIG. 33 is a schematic plan view showing connection electrodes and insulating patterns of a display device according to an embodiment.

FIG. 30 is a schematic plan view showing one pixel of a display device according to an embodiment. FIG. 31 is a schematic cross-sectional view taken along line Q6-Q6' in FIG. 30. FIG. 32 is a schematic cross-sectional view taken along line Q7-Q7' in FIG. 30. FIG. 33 is a schematic plan view showing connection electrodes and insulating patterns of the display device according to an embodiment. FIG. 31 shows a cross-section of an area including a first light-emitting element ED1 and a second light-emitting element ED2 in a sub-pixel SPXn of FIG. 30. FIG. 32 shows a cross-section of an area including contacts CT1 and CT2 of FIG. 30.

Referring to FIG. 30 to FIG. 33, a display device 10 according to this embodiment may be different from those of the above-described embodiments in terms of structures of the electrode RME and the connection electrode CNE. A structure of the bank pattern BP in this embodiment is the same as that in an embodiment of FIG. 26 to FIG. 29 as described above. The structures of the electrode RME, the connection electrode CNE, and the insulating pattern IPP may be different from those in an embodiment of FIG. 26 to FIG. 29.

Electrodes RME may include a first electrode RME1, a second electrode RME2 and a third electrode RME3. The first electrode RME1 may be disposed in a middle area of the light-emitting area EMA, the second electrode RME2 may be disposed on a left side of the first electrode RME1, and the third electrode RME3 may be disposed on a right side of the first electrode RME1.

The first electrode RME1 may be disposed on a third bank pattern BP3, the second electrode RME2 may be disposed on a first bank pattern BP1, and the third electrode RME3 may be disposed on a second bank pattern BP2. Each of the electrodes RME may be disposed at least on an inclined side face of each of the bank patterns BP1, BP2, and BP3. The first electrode RME1 may have a width in the first direction DR1 larger than that of the third bank pattern BP3. The second electrode RME2 may have a width in the first direction DR1 smaller than that of the first bank pattern BP1. The third electrode RME3 may have a width in the first direction DR1 smaller than that of the second bank pattern BP2.

Each of the first electrode RME1 and the third electrode RME3 may extend in the second direction DR2. Each of the first electrode RME1 and the third electrode RME3 in one sub-pixel SPXn may be spaced apart from each of the first electrode RME1 and the third electrode RME3 in another sub-pixel SPXn via a separation portion ROP of each sub-area SA. On the contrary, the second electrode RME2 may extend in the second direction DR2 and may be disposed across sub-pixels SPXn arranged or disposed in the second direction DR2.

The first electrode RME1 may be connected to the third conductive layer via a first electrode contact hole CTD formed in a region overlapping the bank BNL. The first electrode RME1 of the sub-pixel SPXn may contact the third conductive layer via the first electrode contact hole CTD formed in a region overlapping the bank BNL located or disposed on the upper side or an upper side of the light-emitting area EMA and passing through the via layer VIA. A location of the first electrode contact hole CTD in each sub-pixel SPXn may vary, based on a structure of the third conductive layer disposed in an area of each sub-pixel SPXn.

The second electrode RME2 may be connected to the second voltage line VL2 via a second electrode contact hole CTS formed in the sub-area SA located or disposed on a lower side of the light-emitting area EMA and passing through the via layer VIA.

Each of the light-emitting elements ED may be disposed on different electrodes RME. The light-emitting elements ED may include a first light-emitting element ED1 having both opposing ends respectively disposed on the first electrode RME1 and the third electrode RME3, and a second light-emitting element ED1 having both opposing ends respectively disposed on each of the first electrode RME1 and the second electrode RME2. ED2. The first light-emitting elements ED1 may be disposed on a right side of the first electrode RME1, while the second light-emitting elements ED2 may be disposed on a left side of the first electrode RME1.

Connection electrodes CNE; CNE1, CNE2, CNE3 may include a first connection electrode CNE1 as the first type connection electrode, a second connection electrode CNE2 as the first type connection electrode, and a third connection electrode CNE3 as the third type connection electrode.

The first connection electrode CNE1 may have a shape extending in the second direction DR2 and be disposed on the first electrode RME1. A portion of the first connection electrode CNE1 disposed on the third bank pattern BP3 may overlap the first electrode RME1. The first connection electrode CNE1 may extend, in the second direction DR2, from the portion, beyond the bank BNL and into a sub-area SA of another sub-pixel SPXn located or disposed adjacent to the upper side of the light-emitting area EMA of a corresponding sub-pixel. The first connection electrode CNE1 may contact the first electrode RME1 via a first contact CT1 in the sub-area SA.

The second connection electrode CNE2 may have a shape extending in the second direction DR2 and be disposed on the second electrode RME2. A portion of the second connection electrode CNE2 disposed on the first bank pattern BP1 may overlap the second electrode RME2. The second connection electrode CNE2 may extend, in the second direction DR2, from the portion, and beyond the bank BNL, and into a sub-area SA of another sub-pixel SPXn located or disposed adjacent to the upper side of the light-emitting area EMA of a corresponding sub-pixel. The second connection electrode CNE2 may contact the second electrode RME2 via a second contact CT2 in the sub-area SA.

The third connection electrode CNE3 may include extensions CN_E1 and CN_E2 extending in the second direction DR2, and a first connection portion CN_B1 connecting the extensions CN_E1 and CN_E2 to each other. The first extension CN_E1 may be disposed on the third electrode RME3 in the light-emitting area EMA, while the second extension CN_E2 may be disposed on the first electrode RME1 in the light-emitting area EMA. The first connection portion CN_B1 may be disposed on the bank BNL disposed on a lower side of the light-emitting area EMA and may extend in the first direction DR1 to connect a first extension CN_E1 and a second extension CN_E2 to each other. The third connection electrode CNE3 may be disposed on the light-emitting area EMA and the bank BNL, and may not be connected to the third electrode RME3.

The third electrode RME3 may be completely covered with or overlapped by the first insulating layer PAS1. The third electrode RME3 may not include a portion whose a top face is exposed in the sub-area SA and may have a floating state in which the third electrode RME3 is not electrically connected to the connection electrode CNE and the light-emitting element ED. The first light-emitting element ED1 and the second light-emitting element ED2 may be connected to each other in series only via the third connection electrode CNE3.

The third electrode RME3 may be maintained in the floating state in which the third electrode RME3 is not connected to the connection electrode CNE3. By way of example, in an embodiment, the third electrode RME3 may be connected to another electrode RME adjacent thereto. For example, the third electrode RME3 may be connected to the second electrode RME2 disposed in another sub-pixel SPXn adjacent thereto in the first direction DR1. The second power voltage may be applied to the third electrode RME3. Even in case that the second power voltage is applied to the third electrode RME3, the second power voltage applied to the third electrode RME3 may not affect light emission of the light-emitting elements ED because since the third electrode RME3 is not connected to the connection electrode CNE. The third electrode RME3 may be branched from the second electrode RME2 disposed in another sub-pixel SPXn adjacent thereto in the first direction DR1. Only the first electrode RME1 may be discontinuous due to the separation portion ROP of the sub-area SA.

In one embodiment, the display device in this embodiment may further include insulating pattern IPP. The insulating patterns IPP may be respectively disposed on the connection electrodes CNE. The insulating patterns IPP may be disposed on or disposed directly on the connection electrodes CNE and contact the connection electrodes CNE, respectively, and may be spaced apart from other layers while not contacting the other layers. The insulating patterns IPP; IPP1, IPP2, and IPP5 may include the first insulating pattern IPP1, the second insulating pattern IPP2, and the fifth insulating pattern IPP5.

The first insulating pattern IPP1 may have a shape extending in the second direction DR2 and be disposed on the first connection electrode CNE1. The first insulating pattern IPP1 may contact the first connection electrode CNE1 and overlap the third bank pattern BP3, the first electrode RME1, the first light-emitting element ED1, and the first connection electrode CNE1. Further, the first insulating pattern IPP1 may be spaced apart from each of the first light-emitting element ED1 and the first insulating layer PAS1 disposed under or below the first insulating pattern IPP1 in the third direction DR3.

The second insulating pattern IPP2 may have a shape extending in the second direction DR2 and be disposed on the second connection electrode CNE2. The second insulating pattern IPP2 may contact the second connection electrode CNE2, and may overlap the first bank pattern BP1, the second electrode RME2, the second light-emitting element ED2, and the second connection electrode CNE2. Further, the second insulating pattern IPP2 may be spaced apart from each of the second light-emitting element ED2 and the first insulating layer PAS1 disposed under or below the second insulating pattern IPP2 in the third direction DR3.

The fifth insulating pattern IPP5 may have a shape extending in a corresponding manner to the third connection electrode CNE3 and be disposed on the third connection electrode CNE3. The fifth insulating pattern IPP5 may be in contact with the third connection electrode CNE3, and may overlap the second bank pattern BP2, the third bank pattern BP3, the first electrode RME1, the third electrode RME3, the first light-emitting element ED1, the second light-emitting element ED2, and the third connection electrode CNE3. Further, the fifth insulating pattern IPP5 may be spaced apart from each of the first light-emitting element ED1, the second light-emitting element ED2, and the first insulating layer PAS1 disposed under or below the fifth insulating pattern IPP5 in the third direction DR3.

Each of the first insulating pattern IPP1, the second insulating pattern IPP2, and the fifth insulating pattern IPP5 may serve as each mask for protecting and forming each of the first connection electrode CNE1, the second connection electrode CNE2, and the third connection electrode CNE3.

Referring to FIG. 33, the first insulating pattern IPP1 and the fifth insulating pattern IPP5 may be spaced apart from each other in each of the first direction DR1 and the second direction DR2. In this connection, a distance between the first insulating pattern IPP1 and the fifth insulating pattern IPP5 may be smaller than a distance between the first connection electrode CNE1 and the third connection electrode CNE3. Further, the fifth insulating pattern IPP5 and the second insulating pattern IPP2 may be spaced apart from each other in the first direction DR1. In this connection, a distance between the fifth insulating pattern IPP5 and the second insulating pattern IPP2 may be smaller than a distance between the third connection electrode CNE3 and the second connection electrode CNE2.

A planar area of the first insulating pattern IPP1 may be larger than a planar area of the first connection electrode CNE1, while a planar area of the second insulating pattern IPP2 may be larger than a planar area of the second connection electrode CNE2. Further, a planar area of the fifth insulating pattern IPP5 may be larger than a planar area of the third connection electrode CNE3.

According to the above-described embodiments, the connection electrodes may be simultaneously patterned using the insulating pattern, thereby reducing a distance between the connection electrodes and forming the connection electrodes in a single process. Accordingly, a contact failure between the connection electrodes and the light-emitting elements due to misalignment during the patterning process of the connection electrodes may be suppressed. Further, a margin for the patterning process of the connection electrodes may be secured and the process may be simplified.

In concluding the detailed description, those skilled in the art will appreciate that many variations and modifications can be made to the embodiments without substantially departing from the principles of the disclosure. Therefore, the disclosed embodiments are used in a generic and descriptive sense only and not for purposes of limitation.

What is claimed is:
1. A display device comprising:
   a substrate
   a first electrode and a second electrode spaced apart from and parallel to each other and disposed on and directly over a main surface of the substrate, wherein each of the first electrode and the second electrode extends in a direction;
   a first insulating layer disposed on the first electrode and the second electrode;
   a light-emitting element disposed on the first insulating layer, the light-emitting element having opposing ends respectively disposed on the first electrode and the second electrode;
   a first connection electrode electrically contacting an end of the light-emitting element;
   a second connection electrode electrically contacting an opposite end of the light-emitting element; and
   insulating patterns respectively disposed on and contacting the first connection electrode and the second connection electrode, wherein the insulating patterns are spaced apart from each other, the light-emitting element, and the first insulating layer, wherein
   at least one insulating pattern has a bottom surface facing the substrate, a top surface facing away from the substrate, and a side surface connecting the bottom surface and top surface with the side surface spaced apart from any material that comprises the insulating patterns.

2. The display device of claim 1, wherein the insulating patterns include:
   a first insulating pattern disposed on and contacting the first connection electrode; and
   a second insulating pattern disposed on and contacting the second connection electrode.

3. The display device of claim 2, wherein
   at least a side of the first insulating pattern protrudes outwardly beyond at least a side of the first connection electrode in plan view, plan view being a direction perpendicular to the main surface of the substrate, and
   at least a side of the second insulating pattern protrudes outwardly beyond at least a side of the second connection electrode in plan view.

4. The display device of claim 2, wherein
   a planar area of the first insulating pattern is larger than a planar area of the first connection electrode, and
   a planar area of the second insulating pattern is larger than a planar area of the second connection electrode.

5. The display device of claim 2, wherein
   each of the first insulating pattern and the second insulating pattern has an island shape.

6. The display device of claim 5, wherein a distance between the first insulating pattern and the second insulating pattern is less than a distance between the first connection electrode and the second connection electrode.

7. The display device of claim 2, wherein
   the display device further comprises:
      a first bank pattern disposed between the substrate and the first electrode; and
      a second bank pattern disposed between the substrate and the second electrode,
   the first insulating pattern overlaps the first bank pattern and the first electrode, and the second insulating pattern overlaps the second bank pattern and the second electrode.

8. The display device of claim 2, wherein each of the first insulating pattern and the second insulating pattern includes at least one of silicon nitride, aluminum nitride, zirconium nitride, titanium nitride, hafnium nitride, tantalum nitride, silicon oxide, aluminum oxide, titanium oxide, tin oxide, and silicon oxynitride.

9. A display device comprising:
a substrate;
a first electrode and a second electrode spaced apart from and parallel to each other and disposed on and directly over a main surface of the substrate, wherein each of the first electrode and the second electrode extends in a direction;
a first insulating layer disposed on the first electrode and the second electrode;
a light-emitting element disposed on the first insulating layer, the light-emitting element having opposing ends respectively disposed on the first electrode and the second electrode;
a first connection electrode electrically contacting an end of the light-emitting element;
a second connection electrode electrically contacting an opposite end of the light-emitting element; and
insulating patterns respectively disposed on and contacting the first connection electrode and the second connection electrode, wherein the insulating patterns are spaced apart from the light-emitting element and the first insulating layer,
wherein the insulating patterns include:
a first insulating pattern overlapping the first connection electrode;
a second insulating pattern spaced apart from the first insulating pattern and overlapping the second connection electrode;
a third insulating pattern spaced apart from the second insulating pattern and the fourth insulating pattern and having a side directly contacting a side of the first insulating pattern, the fourth insulating pattern and the first insulating pattern being integrally formed; and
a fourth insulating pattern spaced apart from the first insulating pattern and the third insulating pattern and having a side directly contacting a side of the second insulating pattern, the third insulating pattern and the second insulating pattern being integrally formed,
wherein
the fourth insulating pattern and the first insulating pattern are not connected to the third insulating pattern and the second insulating pattern by any material that comprises the insulating patterns.

10. The display device of claim 9, wherein
the first insulating pattern overlaps the first electrode in plan view, plan view being a direction perpendicular to the main surface of the substrate,
the third insulating pattern does not overlap the first electrode in plan view,
the second insulating pattern overlaps the second electrode in plan view, and
the fourth insulating pattern does not overlap the second electrode in plan view.

11. The display device of claim 9, wherein
a length of the first insulating pattern and a length of the third insulating pattern extending in the direction are equal to each other, and
a length of the second insulating pattern and a length of the fourth insulating pattern extending in the direction are equal to each other.

12. The display device of claim 9, wherein
the third insulating pattern overlaps an edge of the first connection electrode in plan view, plan view being a direction perpendicular to the main surface of the substrate, and
the fourth insulating pattern overlaps an edge of the second connection electrode in plan view.

13. The display device of claim 9, wherein a distance between the third insulating pattern and the fourth insulating pattern is less than a distance between the first connection electrode and the second connection electrode.

* * * * *